(12) United States Patent
Lee et al.

(10) Patent No.: US 12,520,547 B2
(45) Date of Patent: *Jan. 6, 2026

(54) MONOLITHIC INTEGRATION OF HIGH AND LOW-SIDE GAN FETS WITH SCREENING BACK GATING EFFECT

(71) Applicant: TEXAS INSTRUMENTS INCORPORATED, Dallas, TX (US)

(72) Inventors: Dong Seup Lee, Mckinney, TX (US); Qhalid Fareed, Plano, TX (US); Sridhar Seetharaman, Richardson, TX (US); Jungwoo Joh, Allen, TX (US); Chang Soo Suh, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/543,738

(22) Filed: Dec. 18, 2023

(65) Prior Publication Data
US 2024/0120383 A1 Apr. 11, 2024

Related U.S. Application Data

(63) Continuation of application No. 17/559,635, filed on Dec. 22, 2021, now Pat. No. 11,888,027.

(51) Int. Cl.
*H01L 29/08* (2006.01)
*H10D 62/10* (2025.01)
*H10D 62/13* (2025.01)
*H10D 62/85* (2025.01)

(52) U.S. Cl.
CPC ......... *H10D 62/151* (2025.01); *H10D 62/116* (2025.01); *H10D 62/8503* (2025.01)

(58) Field of Classification Search
None
See application file for complete search history.

(56) References Cited

U.S. PATENT DOCUMENTS

| | | | |
|---|---|---|---|
| 11,362,190 B2 * | 6/2022 | Hwang | H10D 30/475 |
| 2016/0093691 A1 | 3/2016 | Echigoya et al. | |
| 2017/0170283 A1 * | 6/2017 | Laboutin | H01L 21/0257 |

(Continued)

OTHER PUBLICATIONS

X. Li et al., "GaN—on—SOI: Monolithically Integrated All—GaN ICs for Power Conversion", IEDM19-78, IEEE Xplore, p. 4.4.1 to 4.4.4, 2019.

(Continued)

*Primary Examiner* — William C Trapanese
(74) *Attorney, Agent, or Firm* — Andrew R. Ralston; Frank D. Cimino

(57) ABSTRACT

An electronic device includes an one of aluminum gallium nitride, aluminum nitride, indium aluminum nitride, or indium aluminum gallium nitride back barrier layer over a buffer structure, a gallium nitride layer over the back barrier layer, a hetero-epitaxy structure over the gallium nitride layer, first and second transistors over the hetero-epitaxy structure, and a hole injector having a doped gallium nitride structure over the hetero-epitaxy structure and a conductive structure partially over the doped gallium nitride structure to inject holes to form a hole layer proximate an interface of the back barrier layer and the buffer structure to mitigate vertical electric field back gating effects for the first transistor.

19 Claims, 19 Drawing Sheets

(56) References Cited

U.S. PATENT DOCUMENTS

2020/0287033 A1   9/2020   Suh
2021/0217882 A1   7/2021   Udrea et al.
2021/0344340 A1   11/2021  Kim et al.

OTHER PUBLICATIONS

Xiangdong Li et al., "Suppression of the Backgating Effect of Enhancement-Mode_p-GaN HEMTs on 200-mm GaN—on—SOI for Monolithic Integration", IEEE Electron Device Letters, vol. 39, No. 7, Jul. 2018.
EP Search Report, Application No. EP 22 21 5348, 3 pages.

* cited by examiner

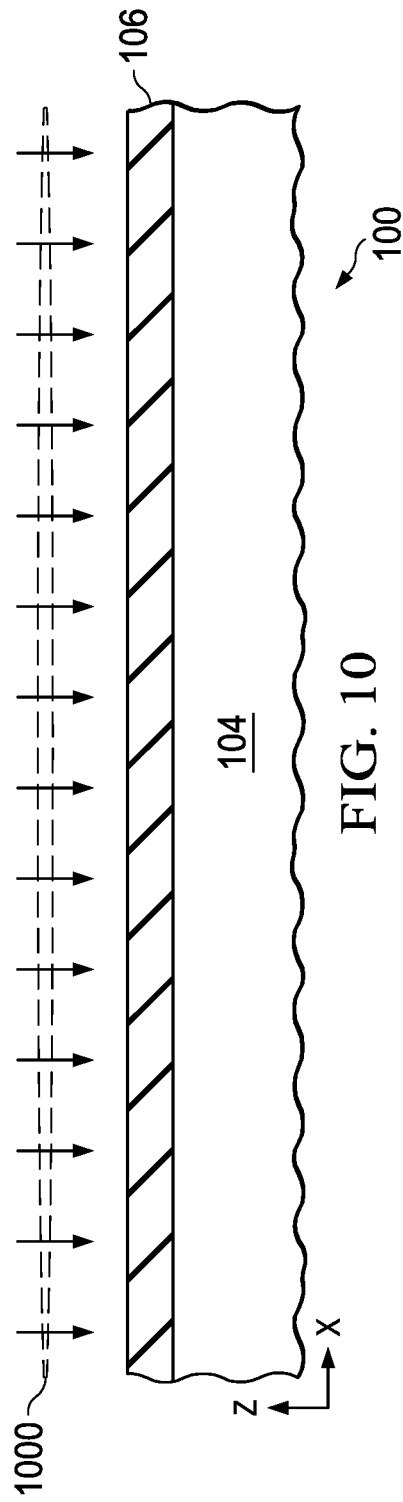
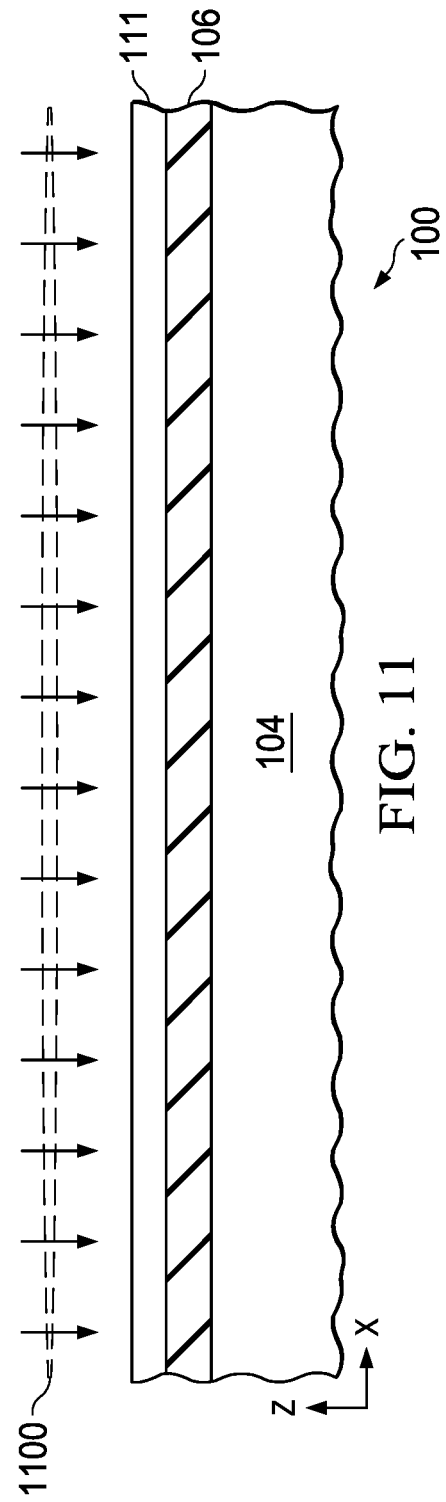

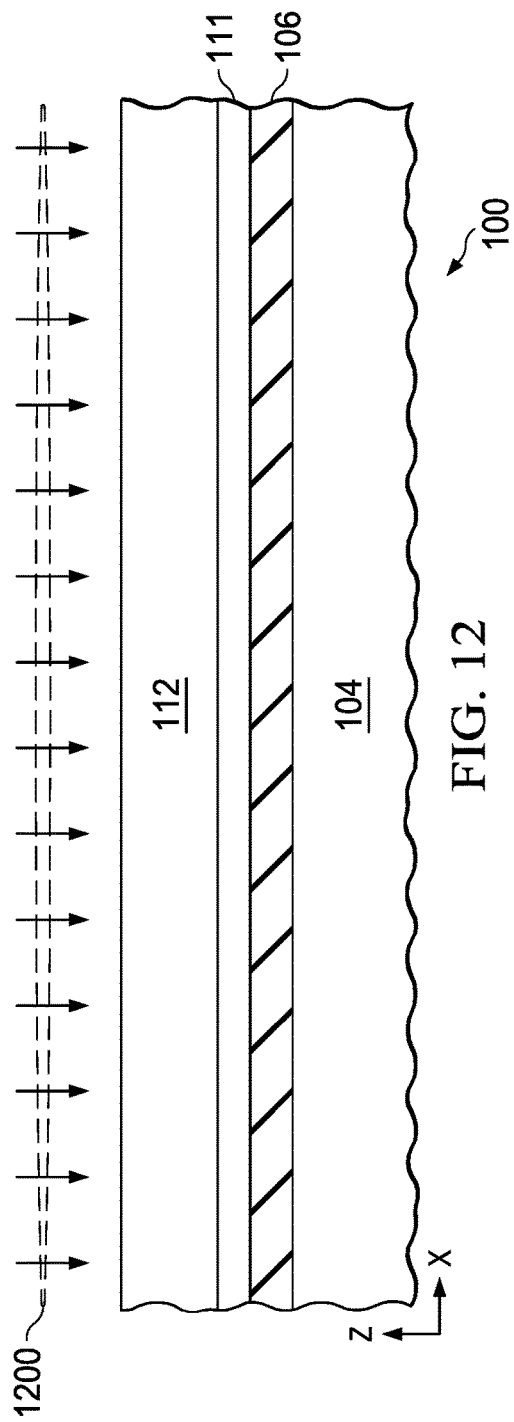
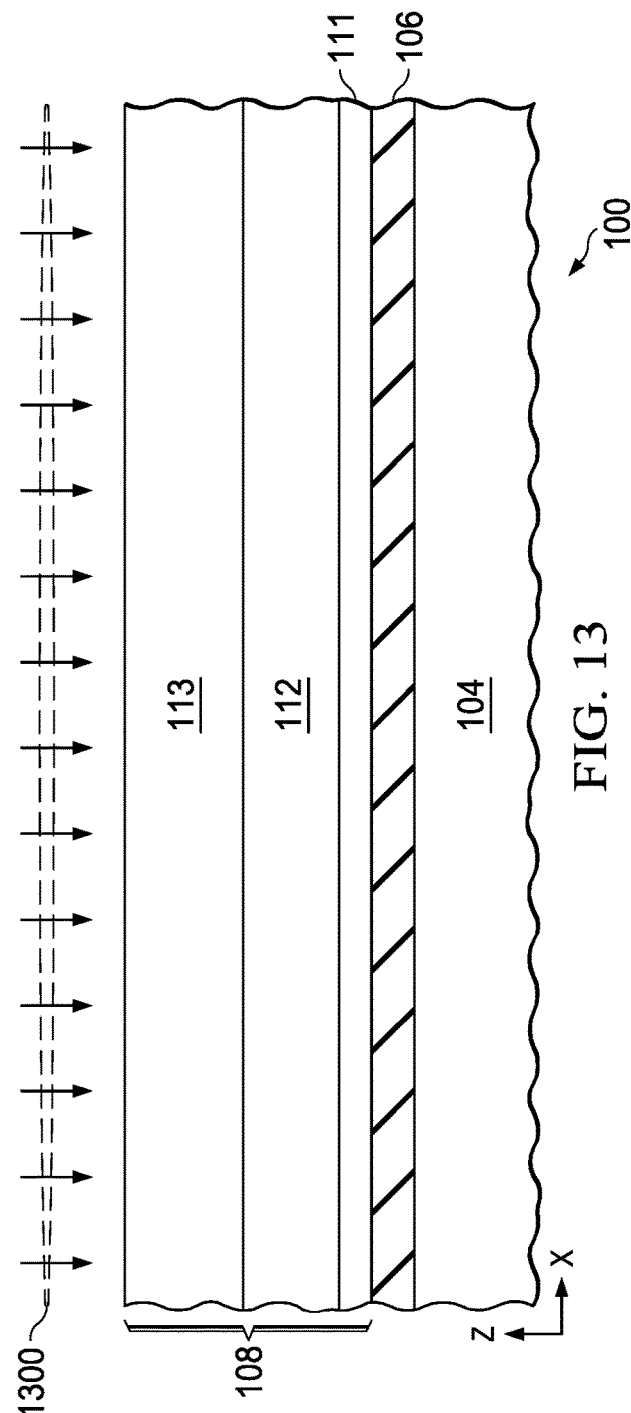

MONOLITHIC INTEGRATION OF HIGH AND LOW-SIDE GAN FETS WITH SCREENING BACK GATING EFFECT

BACKGROUND

Monolithic integration of high and low side gallium nitride (GaN) field effect transistors (FETs) facilitates increased switching frequency with low parasitic inductance as well as reducing overall area compared to using silicon-based transistors. Unlike silicon-based implementations, however, GaN FET devices do not have p or n wells in a GaN buffer or a common silicon substrate for monolithic integration, and back gating effects can reduce the on-state resistance (e.g., drain-source on-state resistance or RDSON) of the high side GaN FET, particularly for high voltage switching applications. Reduced RDSON, in turn, leads to lower efficiency.

SUMMARY

In one aspect, an electronic device includes a buffer structure over a substrate, a back barrier layer that is or includes aluminum gallium nitride over the buffer structure, a gallium nitride layer over the back barrier layer, a hetero-epitaxy structure over the gallium nitride layer, first and second transistors, and a hole injection structure. The first transistor has a first drain, a first gate, and a first source. The first drain is partially in the hetero-epitaxy structure, and the first gate is over the hetero-epitaxy structure and is spaced apart from the first drain. The first source is partially in the hetero-epitaxy structure and spaced apart from the first gate. The second transistor has a second drain, a second gate, and a second source. The second drain partially in the hetero-epitaxy structure and is coupled to the first source. The second gate is over the hetero-epitaxy structure and is spaced apart from the second drain. The second source is partially in the hetero-epitaxy structure and is spaced apart from the second gate. The hole injector structure has a doped gallium nitride structure and a conductive structure. The doped gallium nitride structure extends over the hetero-epitaxy structure and partially over the doped gallium nitride structure.

In another aspect, an electronic device includes a semiconductor die, conductive leads, and a package structure that encloses the semiconductor die and portions of the conductive leads. The semiconductor die has a substrate, a buffer structure, a back barrier layer, a gallium nitride layer, a first transistor, a second transistor, and a hole injector structure. The buffer structure is over the substrate, and the back barrier layer is over the buffer structure, and the back barrier layer includes aluminum gallium nitride. The gallium nitride layer is over the back barrier layer, and the hetero-epitaxy structure is over the gallium nitride layer. The first transistor is coupled to one of the conductive leads and has a first drain, a first gate, and a first source. The first drain is partially in the hetero-epitaxy structure, the first gate is over the hetero-epitaxy structure and is spaced apart from the first drain. The first source is partially in the hetero-epitaxy structure and is spaced apart from the first gate. The second transistor is coupled to another of the conductive leads and has a second drain, a second gate, and a second source. The second drain is partially in the hetero-epitaxy structure and is coupled to the first source. The second gate is over the hetero-epitaxy structure and is spaced apart from the second drain. The second source is partially in the hetero-epitaxy structure and is spaced apart from the second gate. The hole injector structure has a doped gallium nitride structure and a conductive structure. The doped gallium nitride structure extends over the hetero-epitaxy structure, and the conductive structure is partially over the doped gallium nitride structure.

In a further aspect, a method of fabricating an electronic device includes forming a buffer structure over a substrate, forming an aluminum gallium nitride back barrier layer on the buffer structure, forming a gallium nitride layer on the back barrier layer, forming a hetero-epitaxy structure on the gallium nitride layer, and forming a doped gallium nitride structure of a hole injector structure on the hetero-epitaxy structure. The method also includes forming conductive structures, including a conductive structure of the hole injector structure partially over the doped gallium nitride structure, conductive drain and source contacts of respective first and second transistors partially in the hetero-epitaxy structure, and conductive gate contacts of the respective first and second transistors on the hetero-epitaxy structure.

BRIEF DESCRIPTION OF THE DRAWINGS

FIGS. 10-20 are partial sectional side elevation views of the electronic device of FIG. 1 undergoing fabrication processing according to the method of FIG. 9.

DETAILED DESCRIPTION

Figure 1:
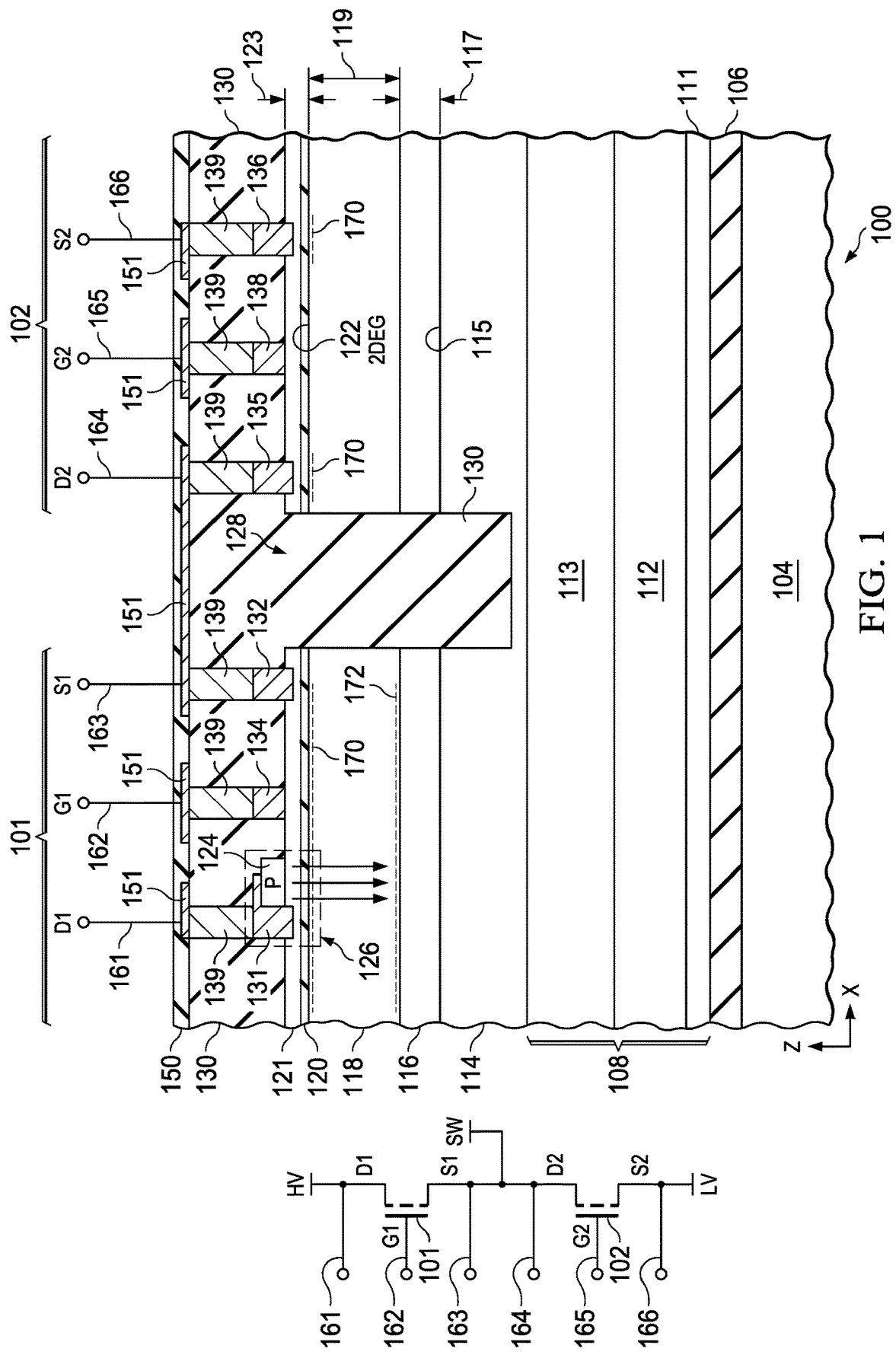
FIG. 1 is a partial sectional side elevation view of an electronic device with first and second depletion mode gallium nitride transistors with an aluminum gallium nitride back barrier layer between a buffer structure and a gallium nitride layer, and a hole injector structure over a hetero-epitaxy structure and engaging a drain contact of the first transistor.

In the drawings, like reference numerals refer to like elements throughout, and the various features are not necessarily drawn to scale. One or more operational characteristics of various circuits, systems and/or components are hereinafter described in the context of functions which in some cases result from configuration and/or interconnection of various structures when circuitry is powered and operating.

FIG. 1 shows a portion of a semiconductor die of an electronic device 100, such as a packaged integrated circuit product. The electronic device 100 includes first and second depletion mode gallium nitride transistors 101 and 102, respectively. The illustrated portion of the device 100 is initially fabricated in wafer form together with other semiconductor dies that are processed and then separated by a dicing process, before being separately packaged in finished integrated circuit products, also referred to as packaged electronic devices. The illustrated examples provide monolithic integration of the first and second GaN transistors 101 and 102 in a single product for performance improvements in high voltage switching power supply systems or other field applications. In certain example high voltage switching applications, as schematically shown in FIG. 1, the first GaN transistor 101 operates as a high side switch coupled between a high voltage supply source (e.g., labeled "HV") and a switching node (e.g., labeled "SW"). The second GaN transistor 102 operates as a low side switch coupled between the switch node SW and a low voltage node (e.g., labeled "LV").

In one example, an inductor (not shown) is connected between the switch node SW and a load, and the high and low side switches are alternately actuated to form a buck DC to DC converter. In the illustrated configuration, the first (high side) transistor 101 has a first drain D1 coupled to the high voltage supply source HV, a first source S1 coupled to the switch node SW, and a first gate G1. The second (low side) transistor 102 has a second drain D2 coupled to the switch node SW, a second source S2 coupled to the low voltage node LV, and a second gate G2. The first drain D1 in this example is coupled to a high voltage, such as hundreds or even thousands of volts above the potential of the low voltage node LV.

In one example, the electronic device 100 includes a semiconductor substrate 104, such as silicon, and the substrate 104 is electrically coupled to the second source S2 and the low voltage node LV. When the high side first transistor 101 is turned on, the first source S1 and the first drain D1 are at or near the potential of the high voltage supply source HV, and a large electric field is established between the low voltage of the substrate 104 and the high voltages of the first source S1 and the first drain D1. The electronic device 100 includes a hole injector structure and a back barrier to inject holes to form a hole layer proximate an interface of the back barrier and a buffer structure to mitigate vertical electric field back gating effects for the first transistor 101. This structure helps avoid or mitigate back gate effects associated with this high electric field and helps avoid or mitigate reduced RDSON of the first transistor 101 during operation of the electronic device 100. The back gating effects increase RDSON higher in the first source S1, and the hole injection suppresses RDSON increase of the first source S1 by shielding the vertical electric field.

As best seen in the partial sectional side view of FIG. 1, the electronic device 100 includes an epitaxially grown stack of layers including a buffer stack formed above the semiconductor substrate 104. The individual layers of the stack structure are described herein as aluminum nitride, aluminum gallium nitride, gallium nitride, etc., and the individual layers can be of any suitable stoichiometric composition that is or includes the named constituent materials alone or in the further presence of small amounts of impurities, artifacts, or other materials, such as materials that may remain after individual processing steps associated with the manufacturer of semiconductor products. The example stack includes an aluminum nitride (AlN) layer 106 over the substrate 104. In one example, the aluminum nitride layer 106 extends directly on and contacts an upper or top side of the substrate 104. In another example, other materials, such as impurities or artifacts or remnant materials from the fabrication processing may be present between the aluminum nitride layer 106 and the substrate 104. In one example, the aluminum nitride layer 106 has a thickness of 300-600 nm.

A multilayer composition graded aluminum gallium nitride (AlGaN) buffer stack 108 extends over the aluminum nitride layer 106. The buffer stack 108 in this example includes three layers that are or include aluminum gallium nitride. In other examples, a different number of two or more composition graded aluminum gallium nitride buffer stack layers can be used. In a different example, a different buffer stack arrangement can be used, such as single or dual superlattice buffer structures (not shown). In the example of FIG. 1, the buffer stack 108 includes a first aluminum gallium nitride layer 111 over the aluminum nitride layer 106. In one example, the first aluminum gallium nitride layer 111 extends directly on and contacts an upper or top side of the aluminum nitride layer 106. In another example, other materials, such as impurities or artifacts or remnant materials from the fabrication processing may be present between the first aluminum gallium nitride layer 111 and the aluminum nitride layer 106. The composition graded AlGaN buffer stack 108 also includes a second aluminum gallium nitride layer 112 over the first aluminum gallium nitride layer 111. In one example, the second aluminum gallium nitride layer 112 extends directly on and contacts an upper or top side of the first aluminum gallium nitride layer 111. In another example, other materials, such as impurities or artifacts or remnant materials from the fabrication processing may be present between the second aluminum gallium nitride layer 112 and the first aluminum gallium nitride layer 111. A third aluminum gallium nitride layer 113 extends over the second aluminum gallium nitride layer 112. In one example, the third aluminum gallium nitride layer 113 extends directly on and contacts an upper or top side of the second aluminum gallium nitride layer 112. In another example, other materials, such as impurities or artifacts or remnant materials from the fabrication processing may be present between the third aluminum gallium nitride layer 113 and the second aluminum gallium nitride layer 112.

In one example, the multilayer composition graded aluminum gallium nitride stack 108 includes the first aluminum gallium nitride sublayer 111 having a first aluminum concentration over the aluminum nitride layer 106, the second aluminum gallium nitride sublayer 112 having a second aluminum concentration that is less than the first aluminum concentration over the first aluminum gallium nitride sublayer 111, and the third aluminum gallium nitride sublayer 113 having a third aluminum concentration that is less than the second aluminum concentration over the second aluminum gallium nitride sublayer 112. In one example, the first aluminum concentration is 60-70%, the second aluminum concentration is 40-50%, and the third aluminum concentration is 20-30%. In one example, the first aluminum gallium nitride layer 111 has a thickness of 300-600 nm, the second aluminum gallium nitride layer 112 has a thickness of 1.4-1.8 µm, and the third aluminum gallium nitride layer 111 has a thickness of 1.4-2.0 µm.

The electronic device 100 further includes a gallium nitride layer 114 over the multilayer composition graded aluminum gallium nitride stack 108. In one example, the gallium nitride layer 114 has a thickness of 0.5-2.0 µm. In this or another example, the gallium nitride layer 114 has a thickness of 0.1-1.0 µm. In one implementation, the gallium nitride layer 114 includes carbon. In one example, the gallium nitride layer 114 extends directly on and contacts an upper or top side of the third aluminum gallium nitride layer 113. In another example, other materials, such as impurities or artifacts or remnant materials from the fabrication processing may be present between the gallium nitride layer 114 and the third aluminum gallium nitride layer 113.

The electronic device 100 also includes a back barrier layer 116 over the buffer structure. The back barrier layer 116 in one example is or includes aluminum gallium nitride of any suitable stoichiometry. In one example, the back barrier layer 116 extends directly on and contacts an upper or top side of the gallium nitride layer 114 at an interface 115 between the top side of the gallium nitride layer 114 and the bottom side of the back barrier layer 116. In another example, other materials, such as impurities or artifacts or remnant materials from the fabrication processing may be present between the back barrier layer 116 and the gallium nitride layer 114. The back barrier layer 116 has a thickness 117, for example, from a few tens of nm to a few µm, such as 20 nm to 5 µm. In another example, the back barrier layer 116 is or includes aluminum nitride (AlN), indium aluminum nitride (InAlN), or indium aluminum gallium nitride (InAlGaN) of any suitable stoichiometry.

An upper gallium nitride layer 118 extends over the back barrier layer 116. The layer 118 is or includes gallium nitride of any suitable stoichiometry. In one example, the gallium nitride layer 118 has a thickness 119 of 1.0 µm. In one implementation, the gallium nitride layer 118 includes carbon. In one example, the gallium nitride layer 118 extends directly on and contacts an upper or top side of the back barrier layer 116. In another example, other materials, such as impurities or artifacts or remnant materials from the fabrication processing may be present between the gallium nitride layer 118 and the back barrier layer 116.

The electronic device 100 also includes a hetero-epitaxy structure having an aluminum nitride layer 120 over the gallium nitride layer 118, and an aluminum gallium nitride layer 121 over the aluminum nitride layer 120. In one example, the layer 120 is or includes aluminum nitride of any suitable stoichiometry. In one example, the aluminum nitride layer 120 extends directly on and contacts an upper or top side of the gallium nitride layer 118. In another example, other materials, such as impurities or artifacts or remnant materials from the fabrication processing may be present between the aluminum nitride layer 120 and the gallium nitride layer 118. In this or another example, the layer 121 is or includes aluminum gallium nitride of any suitable stoichiometry. In one example, the aluminum gallium nitride layer 121 extends directly on and contacts an upper or top side of the aluminum nitride layer 120. In another example, other materials, such as impurities or artifacts or remnant materials from the fabrication processing may be present between the aluminum gallium nitride layer 121 and the aluminum nitride layer 120. The hetero junction at the interface between the aluminum gallium nitride layer 121 and the aluminum nitride layer 120 forms a two-dimensional electron gas region 122 (e.g., labeled "2DEG"). In one example, the hetero-epitaxy structure, including the layers 120 and 121 has a total thickness 123 of 10-30 nm. The electronic device 100 also includes one or more transistors, including the depletion mode high side first transistor 101, and the depletion mode low side second transistor 102 in the illustrated implementation.

The various buffer layers and layers of the hetero-epitaxy structure are fabricated in one example using epitaxial growth deposition processing, for example, a continuous epitaxial deposition process with variables and materials changed throughout form the constituent layers and/or two or more sequential epitaxial deposition processes, with a total thickness of approximately 5.1 µm in one example. In the depletion mode transistor 101, the hetero-epitaxy structure including the layers 120 and 121 has a total thickness of approximately 10-30 nm, and the hetero-epitaxy structure in the enhancement mode transistor 102 has a total thickness of approximately 10-20 nm. The aluminum nitride layer 120 in one example has a thickness of approximately 10 Å (1 nm), and the aluminum gallium nitride layer 121 has a thickness of approximately 20 nm. In the illustrated example, the gallium nitride layer 118 has a thickness of approximately 0.1-1.0 µm. In one example, the aluminum gallium nitride layer 121 has an aluminum concentration of about 26%.

The electronic device 100 includes a hole injector structure 126 having a doped gallium nitride structure 124 over the aluminum gallium nitride layer 121. The hole injector structure 126 also includes a conductive structure that is partially over and contacts the doped gallium nitride structure 124. In one example, the doped gallium nitride structure 124 is or includes gallium nitride of any suitable stoichiometry that is implanted with p-type impurities (p-GaN, including magnesium or other p-type impurities). In one example, the doped gallium nitride structure 124 extends directly on and contacts an upper or top side of the aluminum gallium nitride layer 121. In another example, other materials, such as impurities or artifacts or remnant materials from the fabrication processing may be present between the doped gallium nitride structure 124 and the aluminum gallium nitride layer 121. In one example, the p-doped gallium nitride layer 124 includes magnesium dopants and has a thickness of 50-200 nm, such as about 70 nm in one implementation.

The conductive structure in this case is a conductive first drain contact that is or includes tungsten, copper, aluminum or other conductive metal. The electronic device 100 further includes an isolation structure 128, such as silicon dioxide of any suitable stoichiometry that extends downward between the transistors 101 and 102 through the aluminum gallium nitride layer 121, aluminum nitride layer 120, the gallium nitride layer 118, and the back barrier layer 116, and partially into the gallium nitride layer 114. In this or another example, the isolation between the transistors 101 and 102 is done by implantation (not shown).

The electronic device 100 also includes a metallization structure with a first pre-metal dielectric (e.g., PMD) layer 130, for example, including silicon nitride or silicon dioxide, with various conductive metal structures formed therein, including a first drain contact or electrode 131 of the first transistor 101 that at least partially overlies the doped gallium nitride structure 124. In one example, the conductive structure 131 extends directly on and contacts at least a portion of an upper or top side of the doped gallium nitride structure 124. In another example, other materials, such as impurities or artifacts or remnant materials from the fabrication processing may be present between the conductive structure 131 and the doped gallium nitride structure 124.

The PMD layer or level also includes a first source contact or electrode 132 of the first transistor 101 and a first gate contact or electrode 134 of the first transistor 101. The PMD layer or level also includes a second drain contact or electrode 135 of the second transistor 102, a second source contact or electrode 136 of the second transistor 102, a second gate contact or electrode 138 of the second transistor 102, and one or more conductive contacts or vias 139 that extend through the PMD layer 130 and provide electrical interconnection of various transistor terminals for routing in a second metallization structure level. The conductive drain and source contacts 131, 135, 132, 136 of the respective first and second transistors 101 and 102 extend partially in the hetero-epitaxy structure 120, 121, and the conductive gate contacts 134 and 138 of the respective first and second transistors 101 and 102 extend on and contact the hetero-epitaxy structure 120, 121.

Figure 21:
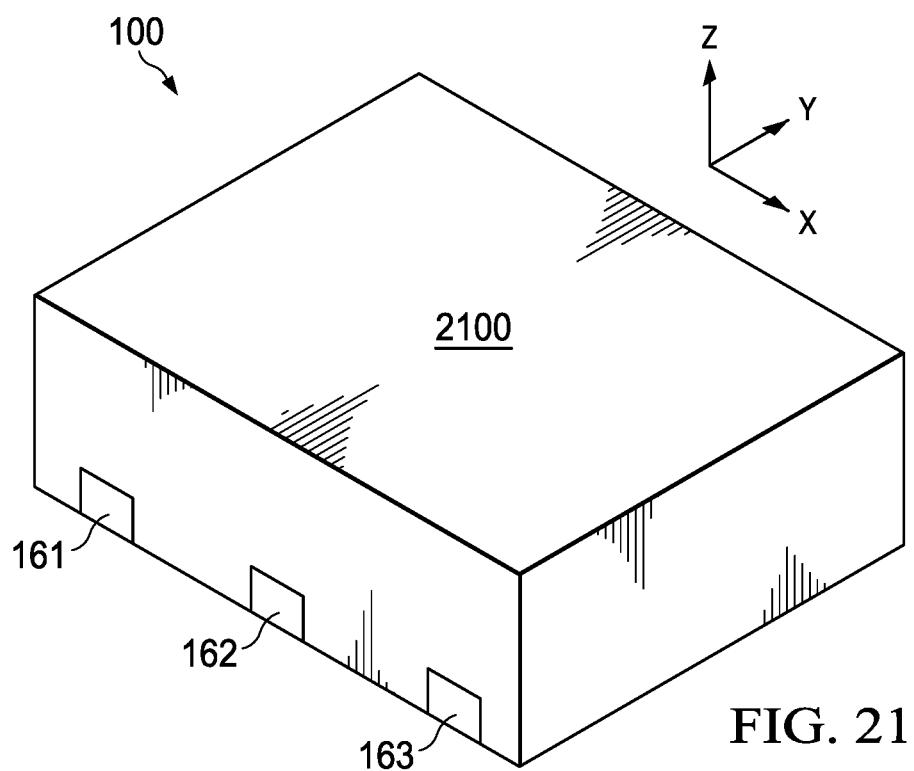
FIG. 21 is a perspective view of a packaged electronic device.

The electronic device 100 in FIG. 1 further includes a second metallization structure level with a dielectric layer 150 (e.g., silicon nitride or silicon dioxide) having one or more conductive routing features 151 (e.g., aluminum, copper, etc.), for example, to provide routing of drain, source and gate connections and associated signals to one another and/or to conductive bond pads, or other externally exposed conductive features by which the transistors 101 and 102 can be electrically interconnected with other circuitry, for example, using bond wires or lead frame electrical connections to integrated circuit leads, such as pins or pads in a packaged electronic device, as illustrated below in the example packaged electronic device of FIG. 21.

The first transistor 101 in this example has a first drain terminal or lead 161 (D1), a first gate terminal or lead 162 (G1), and a first source terminal or lead 163 (S1). The second transistor 102 has a second drain terminal or lead 164 (D2), a second gate terminal or lead 165 (G2), and a second source terminal or lead 166 (S2), where the terminals in one example are electrically coupled to conductive leads of the finished electronic device 100 after packaging as shown in FIG. 21. The transistor terminals are sometimes referred to herein as a drain, a gate, a source, etc., in reference to the associated conductive contact, vias, conductive routing features and/or conductive leads thereof.

In the illustrated example, the first drain 161, D1 extends partially in the hetero-epitaxy structure 120, 121, the first gate 162, G1 extends over the hetero-epitaxy structure 120, 121 and is laterally spaced apart from the first drain 161, D1 along a first direction (e.g., the "X" direction in the figures).

The first source 163, S1 extends partially in the hetero-epitaxy structure 120, 121 and is laterally spaced apart from the first gate 162, G1 along the first direction X. The second drain 164, D2 extends partially in the hetero-epitaxy structure 120, 121 and is coupled to the first source 163, S1 by a conductive routing feature 151 in FIG. 1 to form the switching node SW. The second gate 165, G2 extends over the hetero-epitaxy structure 120, 121 and is laterally spaced apart from the second drain 164, D2 along the first direction X. The second source 166, S2 extends partially in the hetero-epitaxy structure 120, 121 and is laterally spaced apart from the second gate 165, G2 along the first direction X.

In the electronic device 100 of FIG. 1, the first and second transistors 101 and 102 are depletion mode transistors, and the first and second gates 162 and 165 (G1 and G2) include respective gate contact structures 134 and 138 that extend on and contact the AlGaN layer 121 of the hetero-epitaxy structure 120, 121. In this example, moreover, the conductive structure 131 of the hole injector structure 126 is coupled to the first drain 161 (D1). In this example, the hole injector structure 126 is adjacent to and contacts the first drain 161 (D1), and the metallization structure includes a conductive routing feature 151 that electrically couples the first source 163 (S1) to the second drain 164 (D2). In operation, when the first drain 161, D1 is at a high voltage relative to the substrate 104 and the first gate 162, G1 is at a voltage above the threshold voltage of the first transistor 101, electrons form in a channel region at and near the top surface of the gallium nitride layer 118, indicated at 170 in FIG. 1. The high drain voltage at the conductive structure 131 of the hole injector structure 126 causes injection of holes from the p-doped gallium nitride structure 124. The injected holes form a hole layer in the buffer at or near the bottom side of the gallium nitride layer 118 proximate the interface 115 of the back barrier layer 116, indicated at 172 in FIG. 1 to mitigate vertical electric field back gating effects for the first transistor 101.

Figure 2:
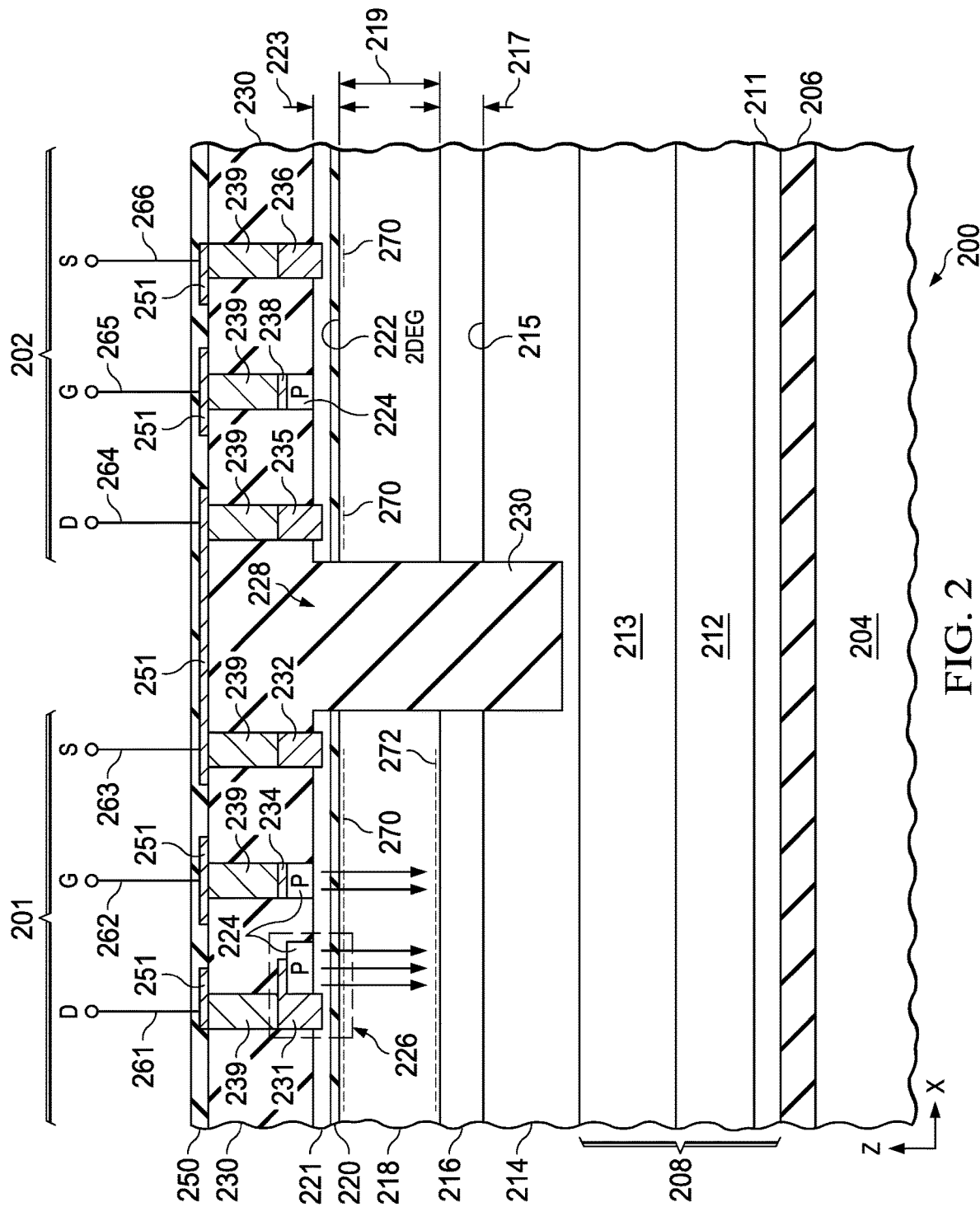
FIG. 2 is a partial sectional side elevation view of another electronic device with first and second enhancement mode gallium nitride transistors with an aluminum gallium nitride back barrier layer between a buffer structure and a gallium nitride layer, and a hole injector structure over a hetero-epitaxy structure and engaging a drain contact of the first transistor.

FIG. 2 shows a partial sectional side elevation view of another electronic device 200 with first and second enhancement mode gallium nitride transistors 201 and 202 with an aluminum gallium nitride back barrier layer between a buffer structure and a gallium nitride layer, and a hole injector structure over a hetero-epitaxy structure and engaging a drain contact of the first transistor. The electronic device 200 includes a semiconductor substrate 204, such as silicon. The electronic device 200 includes a hole injector structure and a back barrier to inject holes to form a hole layer proximate an interface of the back barrier and a buffer structure to mitigate vertical electric field back gating effects for the first transistor 201. The electronic device 200 includes an epitaxially grown stack of layers including a buffer stack formed above the semiconductor substrate 204. The individual layers of the stack structure are described herein as aluminum nitride, aluminum gallium nitride, gallium nitride, etc., and the individual layers can be of any suitable stoichiometric composition that is or includes the named constituent materials alone or in the further presence of small amounts of impurities, artifacts, or other materials, such as materials that may remain after individual processing steps associated with the manufacturer of semiconductor products. The example stack includes an aluminum nitride layer 206 over the substrate 204. In one example, the aluminum nitride layer 206 extends directly on and contacts an upper or top side of the substrate 204. In another example, other materials, such as impurities or artifacts or remnant materials from the fabrication processing may be present between the aluminum nitride layer 206 and the substrate 204. In one example, the aluminum nitride layer 206 has a thickness of 300-600 nm.

A multilayer composition graded aluminum gallium nitride buffer stack 208 extends over the aluminum nitride layer 206. The buffer stack 208 in this example includes three layers that are or include aluminum gallium nitride. In other examples, a different number of two or more composition graded aluminum gallium nitride buffer stack layers can be used. In a different example, a different buffer stack arrangement can be used, such as single or dual superlattice buffer structures (not shown). In the example of FIG. 2, the buffer stack 208 includes a first aluminum gallium nitride layer 211 over the aluminum nitride layer 206. In one example, the first aluminum gallium nitride layer 211 extends directly on and contacts an upper or top side of the aluminum nitride layer 206. In another example, other materials, such as impurities or artifacts or remnant materials from the fabrication processing may be present between the first aluminum gallium nitride layer 211 and the aluminum nitride layer 206. The composition graded AlGaN buffer stack 208 also includes a second aluminum gallium nitride layer 212 over the first aluminum gallium nitride layer 211. In one example, the second aluminum gallium nitride layer 212 extends directly on and contacts an upper or top side of the first aluminum gallium nitride layer 211. In another example, other materials, such as impurities or artifacts or remnant materials from the fabrication processing may be present between the second aluminum gallium nitride layer 212 and the first aluminum gallium nitride layer 211. A third aluminum gallium nitride layer 213 extends over the second aluminum gallium nitride layer 212. In one example, the third aluminum gallium nitride layer 213 extends directly on and contacts an upper or top side of the second aluminum gallium nitride layer 212. In another example, other materials, such as impurities or artifacts or remnant materials from the fabrication processing may be present between the third aluminum gallium nitride layer 213 and the second aluminum gallium nitride layer 212.

In one example, the multilayer composition graded aluminum gallium nitride stack 208 includes the first aluminum gallium nitride sublayer 211 having a first aluminum concentration over the aluminum nitride layer 206, the second aluminum gallium nitride sublayer 212 having a second aluminum concentration that is less than the first aluminum concentration over the first aluminum gallium nitride sublayer 211, and the third aluminum gallium nitride sublayer 213 having a third aluminum concentration that is less than the second aluminum concentration over the second aluminum gallium nitride sublayer 212. In one example, the first aluminum concentration is 60-70%, the second aluminum concentration is 40-50%, and the third aluminum concentration is 20-30%. In one example, the first aluminum gallium nitride layer 211 has a thickness of 300-600 nm, the second aluminum gallium nitride layer 212 has a thickness of 1.4-1.8 μm, and the third aluminum gallium nitride layer 211 has a thickness of 1.4-2.0 μm.

The electronic device 200 further includes a gallium nitride layer 214 over the multilayer composition graded aluminum gallium nitride stack 208. In one example, the gallium nitride layer 214 has a thickness of 0.5-2.0 μm. In this or another example, the gallium nitride layer 214 has a thickness of 0.1-1.0 μm. In one implementation, the gallium nitride layer 214 includes carbon. In one example, the gallium nitride layer 214 extends directly on and contacts an upper or top side of the third aluminum gallium nitride layer 213. In another example, other materials, such as impurities or artifacts or remnant materials from the fabrication processing may be present between the gallium nitride layer 214 and the third aluminum gallium nitride layer 213.

The electronic device 200 also includes a back barrier layer 216 over the buffer structure. The back barrier layer 216 in one example is or includes aluminum gallium nitride of any suitable stoichiometry. In one example, the back barrier layer 216 extends directly on and contacts an upper or top side of the gallium nitride layer 214 at an interface 215 between the top side of the gallium nitride layer 214 and the bottom side of the back barrier layer 216. In another example, other materials, such as impurities or artifacts or remnant materials from the fabrication processing may be present between the back barrier layer 216 and the gallium nitride layer 214. The back barrier layer 216 has a thickness 217, for example, from a few tens of nm to a few μm, such as 20 nm to 5 μm. In another example, the back barrier layer 216 is or includes aluminum nitride, indium aluminum nitride, or indium aluminum gallium nitride of any suitable stoichiometry.

An upper gallium nitride layer 218 extends over the back barrier layer 216. The layer 218 is or includes gallium nitride of any suitable stoichiometry. In one example, the gallium nitride layer 218 has a thickness 219 of 0.1-1.0 μm. In one implementation, the gallium nitride layer 218 includes carbon. In one example, the gallium nitride layer 218 extends directly on and contacts an upper or top side of the back barrier layer 216. In another example, other materials, such as impurities or artifacts or remnant materials from the fabrication processing may be present between the gallium nitride layer 218 and the back barrier layer 216.

The electronic device 200 also includes a hetero-epitaxy structure having an aluminum nitride layer 220 over the gallium nitride layer 218, and an aluminum gallium nitride layer 221 over the aluminum nitride layer 220. In one example, the layer 220 is or includes aluminum nitride of any suitable stoichiometry. In one example, the aluminum nitride layer 220 extends directly on and contacts an upper or top side of the gallium nitride layer 218. In another example, other materials, such as impurities or artifacts or remnant materials from the fabrication processing may be present between the aluminum nitride layer 220 and the gallium nitride layer 218. In this or another example, the layer 221 is or includes aluminum gallium nitride of any suitable stoichiometry. In one example, the aluminum gallium nitride layer 221 extends directly on and contacts an upper or top side of the aluminum nitride layer 220. In another example, other materials, such as impurities or artifacts or remnant materials from the fabrication processing may be present between the aluminum gallium nitride layer 221 and the aluminum nitride layer 220. The hetero junction at the interface between the aluminum gallium nitride layer 221 and the aluminum nitride layer 220 forms a two-dimensional electron gas region 222. In one example, the hetero-epitaxy structure, including the layers 220 and 221 has a total thickness 223 of 10-30 nm. The electronic device 200 also includes one or more transistors, including the enhancement mode high side first transistor 201, and the enhancement mode low side second transistor 202 in the illustrated implementation.

The various buffer layers and layers of the hetero-epitaxy structure are fabricated in one example using epitaxial growth deposition processing, for example, a continuous epitaxial deposition process with variables and materials changed throughout form the constituent layers and/or two or more sequential epitaxial deposition processes, with a total thickness of approximately 5.1 μm in one example. In the enhancement mode transistor 201, the hetero-epitaxy structure including the layers 220 and 221 has a total thickness of approximately 10-30 nm, and the hetero-epitaxy structure in the enhancement mode transistor 202 has a total thickness of approximately 10-20 nm. The aluminum nitride layer 220 in one example has a thickness of approximately 10 Å (1 nm), and the aluminum gallium nitride layer 221 has a thickness of approximately 20 nm. In the illustrated example, the gallium nitride layer 218 has a thickness of approximately 0.1-1.0 μm. In one example, the aluminum gallium nitride layer 221 has an aluminum concentration of about 26%.

The electronic device 200 includes a hole injector structure 226 having a doped gallium nitride structure 224 over the aluminum gallium nitride layer 221. The hole injector structure 226 also includes a conductive structure that is partially over and contacts the doped gallium nitride structure 224. In one example, the doped gallium nitride structure 224 is or includes gallium nitride of any suitable stoichiometry that is implanted with p-type impurities (p-GaN, including magnesium or other p-type impurities). In one example, the doped gallium nitride structure 224 extends directly on and contacts an upper or top side of the aluminum gallium nitride layer 221. In another example, other materials, such as impurities or artifacts or remnant materials from the fabrication processing may be present between the doped gallium nitride structure 224 and the aluminum gallium nitride layer 221. In one example, the p-doped gallium nitride layer 224 includes magnesium dopants and has a thickness of 50-200 nm, such as about 70 nm in one implementation.

The conductive structure in this case is a conductive first drain contact that is or includes tungsten, copper, aluminum or other conductive metal. The electronic device 200 further includes an isolation structure 228, such as silicon dioxide of any suitable stoichiometry that extends downward between the transistors 201 and 202 through the aluminum gallium nitride layer 221, aluminum nitride layer 220, the gallium nitride layer 218, and the back barrier layer 216, and partially into the gallium nitride layer 214. In this or another example, the isolation between the transistors 201 and 202 is done by implantation (not shown).

The electronic device 200 also includes a metallization structure with a first pre-metal dielectric (e.g., PMD) layer 230, for example, including silicon nitride or silicon dioxide, with various conductive metal structures formed therein, including a first drain contact or electrode 231 of the first transistor 201 that at least partially overlies the doped gallium nitride structure 224. In one example, the conductive structure 231 extends directly on and contacts at least a portion of an upper or top side of the doped gallium nitride structure 224. In another example, other materials, such as impurities or artifacts or remnant materials from the fabrication processing may be present between the conductive structure 231 and the doped gallium nitride structure 224.

The PMD layer or level also includes a first source contact or electrode 232 of the first transistor 201 and a first gate contact or electrode 234 of the first transistor 201. The PMD layer or level also includes a second drain contact or electrode 235 of the second transistor 202, a second source contact or electrode 236 of the second transistor 202, a second gate contact or electrode 238 of the second transistor 202, and one or more conductive contacts or vias 239 that extend through the PMD layer 230 and provide electrical interconnection of various transistor terminals for routing in a second metallization structure level. The conductive drain and source contacts 231, 235, 232, 236 of the respective first and second transistors 201 and 202 extend partially in the hetero-epitaxy structure 220, 221, and the conductive gate contacts 234 and 238 of the respective first and second transistors 201 and 202 extend on and contact the hetero-epitaxy structure 220, 221.

In the electronic device 200 of FIG. 2, the first and second transistors 201, 202 are enhancement mode transistors. The first gate 262, G1 includes a first doped gallium nitride gate structure 224 (e.g., p-doped GaN) that extends over and contacts the aluminum gallium nitride layer 221 of the hetero-epitaxy structure 220, 221, and the first conductive gate contact structure 234 extends over the first doped gallium nitride gate structure 224. The second gate 265, G2 includes a second doped gallium nitride gate structure 224 (e.g., p-doped GaN) that extends over and contacts the aluminum gallium nitride layer 221 of the hetero-epitaxy structure 220, 221, and a second conductive gate contact structure 284 that extends over the second doped gallium nitride gate structure 224.

The electronic device 200 in FIG. 2 further includes a second metallization structure level with a dielectric layer 250 (e.g., silicon nitride or silicon dioxide) having one or more conductive routing features 251 (e.g., aluminum, copper, etc.), for example, to provide routing of drain, source and gate connections and associated signals to one another and/or to conductive bond pads, or other externally exposed conductive features by which the transistors 201 and 202 can be electrically interconnected with other circuitry, for example, using bond wires or lead frame electrical connections to integrated circuit leads, such as pins or pads in a packaged electronic device.

The first transistor 201 in this example has a first drain terminal or lead 261 (D1), a first gate terminal or lead 262 (G1), and a first source terminal or lead 263 (S1). The second transistor 202 has a second drain terminal or lead 264 (D2), a second gate terminal or lead 265 (G2), and a second source terminal or lead 266 (S2), where the terminals in one example are electrically coupled to conductive leads of the finished electronic device 200 after packaging. The transistor terminals are sometimes referred to herein as a drain, a gate, a source, etc., in reference to the associated conductive contact, vias, conductive routing features and/or conductive leads thereof.

In the illustrated example, the first drain 261, D1 extends partially in the hetero-epitaxy structure 220, 221, the first gate 262, G1 extends over the hetero-epitaxy structure 220, 221 and is laterally spaced apart from the first drain 261, D1 along a first direction (e.g., the "X" direction in the figures). The first source 263, S1 extends partially in the hetero-epitaxy structure 220, 221 and is laterally spaced apart from the first gate 262, G1 along the first direction X. The second drain 264, D2 extends partially in the hetero-epitaxy structure 220, 221 and is coupled to the first source 263, S1 by a conductive routing feature 251 in FIG. 2 to form the switching node SW. The second gate 265, G2 extends over the hetero-epitaxy structure 220, 221 and is laterally spaced apart from the second drain 264, D2 along the first direction X. The second source 266, S2 extends partially in the hetero-epitaxy structure 220, 221 and is laterally spaced apart from the second gate 265, G2 along the first direction X.

In the electronic device 200 of FIG. 2, the first and second transistors 201 and 202 are enhancement mode transistors, and the first and second gates 262 and 265 (G1 and G2) include respective gate contact structures 234 and 238 that extend on and contact the respective p-doped GaN structure 224 above the AlGaN layer 221 of the hetero-epitaxy structure 220, 221. In this example, moreover, the conductive structure 231 of the hole injector structure 226 is coupled to the first drain 261 (D1). In this example, the hole injector structure 226 is adjacent to and contacts the first drain 261 (D1), and the metallization structure includes a conductive routing feature 251 that electrically couples the first source 263 (S1) to the second drain 264 (D2). In operation, when the first drain 261, D1 is at a high voltage relative to the substrate 204 and the first gate 262, G1 is at a voltage above the threshold voltage of the first transistor 201, electrons form in a channel region at and near the top surface of the gallium nitride layer 218, indicated at 270 in FIG. 2. The high drain voltage at the conductive structure 231 of the hole injector structure 226 causes injection of holes from the p-doped gallium nitride structure 224. The injected holes form a hole layer in the buffer at or near the bottom side of the gallium nitride layer 218 proximate the interface 215 of the back barrier layer 216, indicated at 272 in FIG. 2 to mitigate vertical electric field back gating effects for the first transistor 201.

Figure 3:
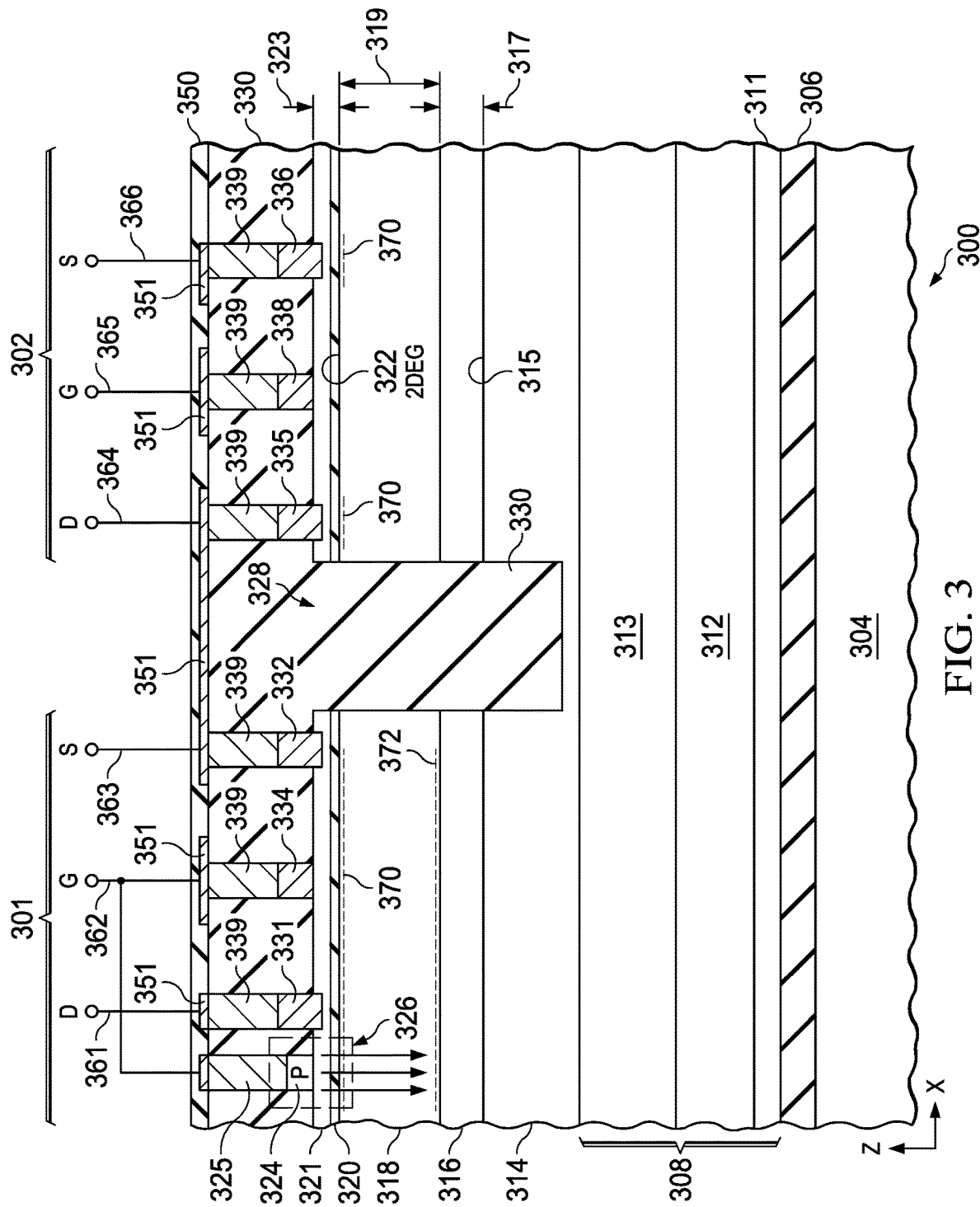
FIG. 3 is a partial sectional side elevation view of an electronic device with first and second depletion mode gallium nitride transistors with an aluminum gallium nitride back barrier layer between a buffer structure and a gallium nitride layer, and a hole injector structure laterally spaced outward from a drain contact of the first transistor and over a hetero-epitaxy structure.

FIG. 3 shows a partial sectional side elevation view of another example electronic device 300 with first and second (e.g., high and low side) depletion mode gallium nitride field effect transistors 301 and 302 with an aluminum gallium nitride back barrier layer between a buffer structure and a gallium nitride layer, and a hole injector structure laterally spaced outward from a drain contact of the first transistor and over a hetero-epitaxy structure. The electronic device 300 includes a semiconductor substrate 304, such as silicon. The hole injector structure injects holes to form a hole layer proximate an interface of the back barrier and a buffer structure to mitigate vertical electric field back gating effects for the first transistor 301. This structure helps avoid or mitigate back gate effects associated with this high electric field and helps avoid or mitigate reduced RDSON of the first transistor 301 during operation of the electronic device 300.

The electronic device 300 includes an epitaxially grown stack of layers including a buffer stack formed above the semiconductor substrate 304. The individual layers of the stack structure are described herein as aluminum nitride, aluminum gallium nitride, gallium nitride, etc., and the individual layers can be of any suitable stoichiometric composition that is or includes the named constituent materials alone or in the further presence of small amounts of impurities, artifacts, or other materials, such as materials that may remain after individual processing steps associated with the manufacturer of semiconductor products. The example stack includes an aluminum nitride layer 306 over the substrate 304. In one example, the aluminum nitride layer 306 extends directly on and contacts an upper or top side of the substrate 304. In another example, other materials, such as impurities or artifacts or remnant materials from the fabrication processing may be present between the aluminum nitride layer 306 and the substrate 304. In one example, the aluminum nitride layer 306 has a thickness of 300-600 nm.

A multilayer composition graded aluminum gallium nitride buffer stack 308 extends over the aluminum nitride layer 306. The buffer stack 308 in this example includes three layers that are or include aluminum gallium nitride. In other examples, a different number of two or more composition graded aluminum gallium nitride buffer stack layers can be used. In a different example, a different buffer stack arrangement can be used, such as single or dual superlattice buffer structures (not shown). In the example of FIG. 3, the buffer stack 308 includes a first aluminum gallium nitride layer 311 over the aluminum nitride layer 306. In one example, the first aluminum gallium nitride layer 311 extends directly on and contacts an upper or top side of the aluminum nitride layer 306. In another example, other materials, such as impurities or artifacts or remnant materials from the fabrication processing may be present between the first aluminum gallium nitride layer 311 and the aluminum nitride layer 306. The composition graded AlGaN buffer stack 308 also includes a second aluminum gallium nitride layer 312 over the first aluminum gallium nitride layer 311. In one example, the second aluminum gallium nitride layer 312 extends directly on and contacts an upper or top side of the first aluminum gallium nitride layer 311. In another example, other materials, such as impurities or artifacts or remnant materials from the fabrication processing may be present between the second aluminum gallium nitride layer 312 and the first aluminum gallium nitride layer 311. A third aluminum gallium nitride layer 313 extends over the second aluminum gallium nitride layer 312. In one example, the third aluminum gallium nitride layer 313 extends directly on and contacts an upper or top side of the second aluminum gallium nitride layer 312. In another example, other materials, such as impurities or artifacts or remnant materials from the fabrication processing may be present between the third aluminum gallium nitride layer 313 and the second aluminum gallium nitride layer 312.

In one example, the multilayer composition graded aluminum gallium nitride stack 308 includes the first aluminum gallium nitride sublayer 311 having a first aluminum concentration over the aluminum nitride layer 306, the second aluminum gallium nitride sublayer 312 having a second aluminum concentration that is less than the first aluminum concentration over the first aluminum gallium nitride sublayer 311, and the third aluminum gallium nitride sublayer 313 having a third aluminum concentration that is less than the second aluminum concentration over the second aluminum gallium nitride sublayer 312. In one example, the first aluminum concentration is 60-70%, the second aluminum concentration is 40-50%, and the third aluminum concentration is 20-30%. In one example, the first aluminum gallium nitride layer 311 has a thickness of 300-600 nm, the second aluminum gallium nitride layer 312 has a thickness of 1.4-1.8 µm, and the third aluminum gallium nitride layer 311 has a thickness of 1.4-2.0 µm.

The electronic device 300 further includes a gallium nitride layer 314 over the multilayer composition graded aluminum gallium nitride stack 308. In one example, the gallium nitride layer 314 has a thickness of 0.5-2.0 µm. In this or another example, the gallium nitride layer 314 has a thickness of 0.1-1.0 µm. In one implementation, the gallium nitride layer 314 includes carbon. In one example, the gallium nitride layer 314 extends directly on and contacts an upper or top side of the third aluminum gallium nitride layer 313. In another example, other materials, such as impurities or artifacts or remnant materials from the fabrication processing may be present between the gallium nitride layer 314 and the third aluminum gallium nitride layer 313.

The electronic device 300 also includes a back barrier layer 316 over the buffer structure. The back barrier layer 316 in one example is or includes aluminum gallium nitride of any suitable stoichiometry. In one example, the back barrier layer 316 extends directly on and contacts an upper or top side of the gallium nitride layer 314 at an interface 315 between the top side of the gallium nitride layer 314 and the bottom side of the back barrier layer 316. In another example, other materials, such as impurities or artifacts or remnant materials from the fabrication processing may be present between the back barrier layer 316 and the gallium nitride layer 314. The back barrier layer 316 has a thickness 317, for example, from a few tens of nm to a few μm, such as 20 nm to 5 μm. In another example, the back barrier layer 316 is or includes aluminum nitride (AlN), indium aluminum nitride (InAlN), or indium aluminum gallium nitride (InAlGaN) of any suitable stoichiometry.

An upper gallium nitride layer 318 extends over the back barrier layer 316. The layer 318 is or includes gallium nitride of any suitable stoichiometry. In one example, the gallium nitride layer 318 has a thickness 319 of 0.1-1.0 μm. In one implementation, the gallium nitride layer 318 includes carbon. In one example, the gallium nitride layer 318 extends directly on and contacts an upper or top side of the back barrier layer 316. In another example, other materials, such as impurities or artifacts or remnant materials from the fabrication processing may be present between the gallium nitride layer 318 and the back barrier layer 316.

The electronic device 300 also includes a hetero-epitaxy structure having an aluminum nitride layer 320 over the gallium nitride layer 318, and an aluminum gallium nitride layer 321 over the aluminum nitride layer 320. In one example, the layer 320 is or includes aluminum nitride of any suitable stoichiometry. In one example, the aluminum nitride layer 320 extends directly on and contacts an upper or top side of the gallium nitride layer 318. In another example, other materials, such as impurities or artifacts or remnant materials from the fabrication processing may be present between the aluminum nitride layer 320 and the gallium nitride layer 318. In this or another example, the layer 321 is or includes aluminum gallium nitride of any suitable stoichiometry. In one example, the aluminum gallium nitride layer 321 extends directly on and contacts an upper or top side of the aluminum nitride layer 320. In another example, other materials, such as impurities or artifacts or remnant materials from the fabrication processing may be present between the aluminum gallium nitride layer 321 and the aluminum nitride layer 320. The hetero junction at the interface between the aluminum gallium nitride layer 321 and the aluminum nitride layer 320 forms a two-dimensional electron gas region 322. In one example, the hetero-epitaxy structure, including the layers 320 and 321 has a total thickness 323 of 10-30 nm. The electronic device 300 also includes one or more transistors, including the depletion mode high side first transistor 301, and the depletion mode low side second transistor 302 in the illustrated implementation.

The various buffer layers and layers of the hetero-epitaxy structure are fabricated in one example using epitaxial growth deposition processing, for example, a continuous epitaxial deposition process with variables and materials changed throughout form the constituent layers and/or two or more sequential epitaxial deposition processes, with a total thickness of approximately 5.1 μm in one example. In the depletion mode transistor 301, the hetero-epitaxy structure including the layers 320 and 321 has a total thickness of approximately 10-30 nm, and the hetero-epitaxy structure in the enhancement mode transistor 302 has a total thickness of approximately 10-20 nm. The aluminum nitride layer 320 in one example has a thickness of approximately 10 Å (1 nm), and the aluminum gallium nitride layer 321 has a thickness of approximately 20 nm. In the illustrated example, the gallium nitride layer 318 has a thickness of approximately 0.1-1.0 μm. In one example, the aluminum gallium nitride layer 321 has an aluminum concentration of about 26%.

The electronic device 300 includes a hole injector structure 326 having a doped gallium nitride structure 324 over the aluminum gallium nitride layer 321. The hole injector structure 326 also includes a conductive structure 325 formed as a contact or via that is partially over and contacts the doped gallium nitride structure 324. In one example, the doped gallium nitride structure 324 is or includes gallium nitride of any suitable stoichiometry that is implanted with p-type impurities (p-GaN, including magnesium or other p-type impurities). In one example, the doped gallium nitride structure 324 extends directly on and contacts an upper or top side of the aluminum gallium nitride layer 321. In another example, other materials, such as impurities or artifacts or remnant materials from the fabrication processing may be present between the doped gallium nitride structure 324 and the aluminum gallium nitride layer 321. In one example, the p-doped gallium nitride layer 324 includes magnesium dopants and has a thickness of 50-200 nm, such as about 70 nm in one implementation. The conductive structure 325 is or includes tungsten, copper, aluminum or other conductive metal. The electronic device 300 further includes an isolation structure 328, such as silicon dioxide of any suitable stoichiometry that extends downward between the transistors 301 and 302 through the aluminum gallium nitride layer 321, aluminum nitride layer 320, the gallium nitride layer 318, and the back barrier layer 316, and partially into the gallium nitride layer 314. In this or another example, the isolation between the transistors 301 and 302 is done by implantation (not shown).

The electronic device 300 also includes a metallization structure with a first pre-metal dielectric (e.g., PMD) layer 330, for example, including silicon nitride or silicon dioxide, with various conductive metal structures formed therein, including the conductive structure 325. In one example, the conductive structure 325 extends directly on and contacts at least a portion of an upper or top side of the doped gallium nitride structure 324. In another example, other materials, such as impurities or artifacts or remnant materials from the fabrication processing may be present between the conductive structure 325 and the doped gallium nitride structure 324.

The PMD layer or level also includes a first drain contact or electrode 331 of the first transistor 301, a first source contact or electrode 332 of the first transistor 301, and a first gate contact or electrode 334 of the first transistor 301. The PMD layer or level further includes a second drain contact or electrode 335 of the second transistor 302, a second source contact or electrode 336 of the second transistor 302, a second gate contact or electrode 338 of the second transistor 302, and one or more conductive contacts or vias 339 that extend through the PMD layer 330 and provide electrical interconnection of various transistor terminals for routing in a second metallization structure level. The conductive drain and source contacts 331, 335, 332, 336 of the respective first and second transistors 301 and 302 extend partially in the hetero-epitaxy structure 320, 321, and the conductive gate contacts 334 and 338 of the respective first and second transistors 301 and 302 extend on and contact the hetero-epitaxy structure 320, 321.

The electronic device 300 in FIG. 3 further includes a second metallization structure level with a dielectric layer 350 (e.g., silicon nitride or silicon dioxide) having one or more conductive routing features 351 (e.g., aluminum, copper, etc.), for example, to provide routing of drain, source and gate connections and associated signals to one another and/or to conductive bond pads, or other externally exposed conductive features by which the transistors 301 and 302 can be electrically interconnected with other circuitry, for example, using bond wires or lead frame electrical connections to integrated circuit leads, such as pins or pads in a packaged electronic device.

The first transistor 301 in this example has a first drain terminal or lead 361 (D1), a first gate terminal or lead 362 (G1), and a first source terminal or lead 363 (S1). The second transistor 302 has a second drain terminal or lead 364 (D2), a second gate terminal or lead 365 (G2), and a second source terminal or lead 366 (S2), where the terminals in one example are electrically coupled to conductive leads of the finished electronic device 300 after packaging. In the illustrated example, the first drain 361, D1 extends partially in the hetero-epitaxy structure 320, 321, the first gate 362, G1 extends over the hetero-epitaxy structure 320, 321 and is laterally spaced apart from the first drain 361, D1 along a first direction (e.g., the "X" direction in the figures). The first source 363, S1 extends partially in the hetero-epitaxy structure 320, 321 and is laterally spaced apart from the first gate 362, G1 along the first direction X. The second drain 364, D2 extends partially in the hetero-epitaxy structure 320, 321 and is coupled to the first source 363, S1 by a conductive routing feature 351 in FIG. 3 to form the switching node SW. The second gate 365, G2 extends over the hetero-epitaxy structure 320, 321 and is laterally spaced apart from the second drain 364, D2 along the first direction X. The second source 366, S2 extends partially in the hetero-epitaxy structure 320, 321 and is laterally spaced apart from the second gate 365, G2 along the first direction X.

In this example, moreover, the hole injector structure 326 is laterally spaced apart from the first drain 361 (D1) and the first drain 361 (D1) is laterally spaced apart from and between the hole injector structure 326 and the first gate 362 (G1) along the first direction X. In addition, the metallization structure in this example electrically couples the hole injector structure 326 to the first gate 362 (G1). In operation, when the first transistor 301 is turned on, the hole injector structure 326 operates to inject holes downward into the GaN layer 318. In another implementation, the conductive structure 325 of the hole injector structure 326 is coupled to a controlled voltage node (not shown) to selectively provide a positive voltage signal to the hole injector structure 326, for example, when the first gate 362 (G1) is powered to turn the first transistor 301 on.

In the electronic device 300 of FIG. 3, the first and second transistors 301 and 302 are depletion mode transistors, and the first and second gates 362 and 365 (G1 and G2) include respective gate contact structures 334 and 338 that extend on and contact the AlGaN layer 321 of the hetero-epitaxy structure 320, 321. In this example, moreover, the conductive structure 325 of the hole injector structure 326 is coupled to the first gate 362 (G1). In this example the metallization structure includes a conductive routing feature 351 that electrically couples the first source 363 (S1) to the second drain 364 (D2). In operation, when the first transistor 301 is turned on and the first drain D1 is at a high voltage relative to the substrate 304 and the first gate 362, G1 is at a voltage above the threshold voltage of the first transistor 301, electrons form in a channel region at and near the top surface of the gallium nitride layer 318, indicated at 370 in FIG. 3. The voltage at the conductive structure 325 of the hole injector structure 326 causes injection of holes from the p-doped gallium nitride structure 324. The injected holes form a hole layer in the buffer at or near the bottom side of the gallium nitride layer 318 proximate the interface 315 of the back barrier layer 316, indicated at 372 in FIG. 3 to mitigate vertical electric field back gating effects for the first transistor 301.

Figure 4:
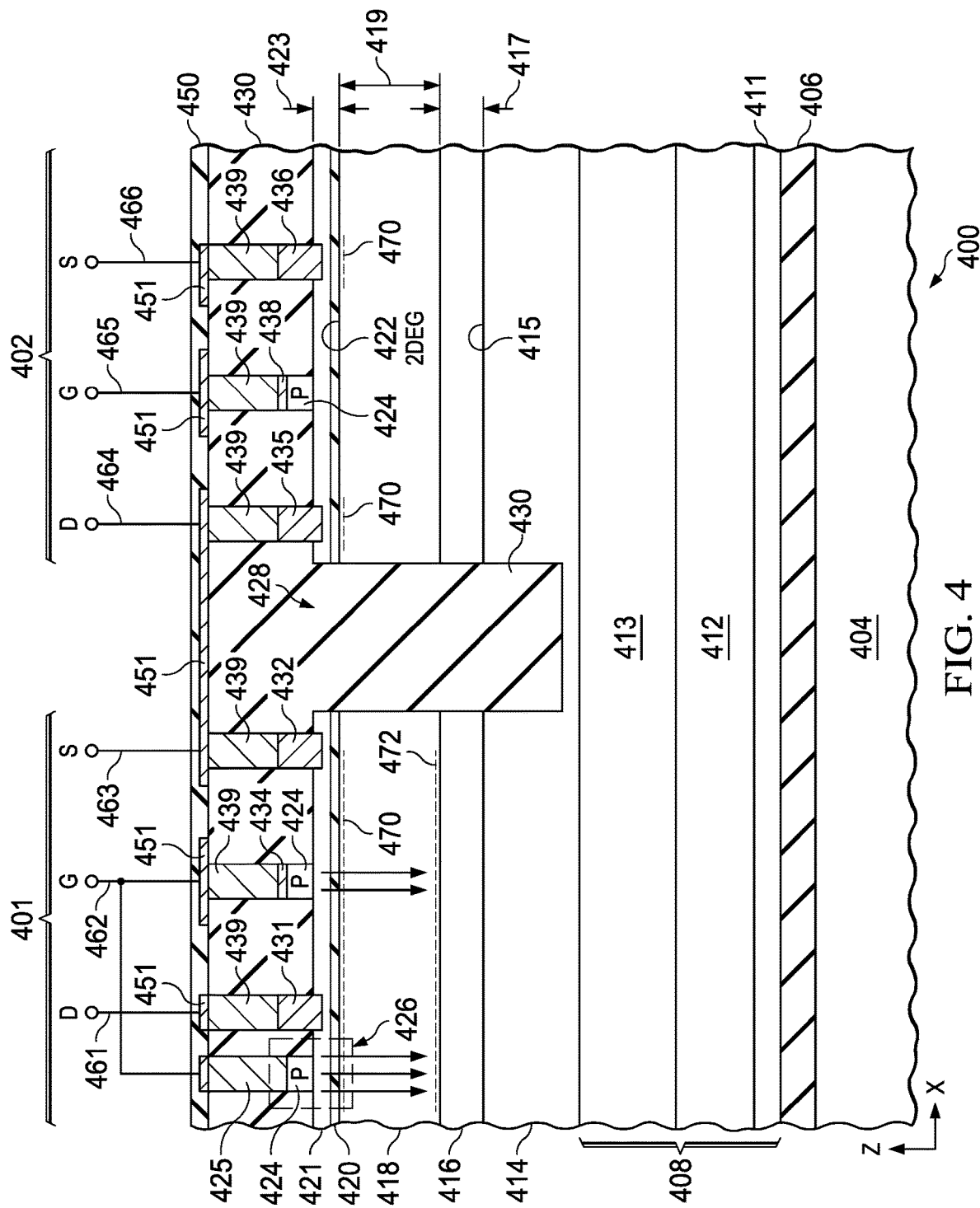
FIG. 4 is a partial sectional side elevation view of an electronic device with first and second enhancement mode gallium nitride transistors with an aluminum gallium nitride back barrier layer between a buffer structure and a gallium nitride layer, and a hole injector structure laterally spaced outward from a drain contact of the first transistor and over a hetero-epitaxy structure.

FIG. 4 shows a partial sectional side elevation view of another electronic device 400 with first and second enhancement mode gallium nitride transistors 401 and 402 along with an aluminum gallium nitride back barrier layer between a buffer structure and a gallium nitride layer, and a hole injector structure laterally spaced outward from a drain contact of the first transistor and over a hetero-epitaxy structure. The electronic device 400 includes an epitaxially grown stack of layers including a buffer stack formed above the semiconductor substrate 404. The individual layers of the stack structure are described herein as aluminum nitride, aluminum gallium nitride, gallium nitride, etc., and the individual layers can be of any suitable stoichiometric composition that is or includes the named constituent materials alone or in the further presence of small amounts of impurities, artifacts, or other materials, such as materials that may remain after individual processing steps associated with the manufacturer of semiconductor products. The example stack includes an aluminum nitride layer 406 over the substrate 404. In one example, the aluminum nitride layer 406 extends directly on and contacts an upper or top side of the substrate 404. In another example, other materials, such as impurities or artifacts or remnant materials from the fabrication processing may be present between the aluminum nitride layer 406 and the substrate 404. In one example, the aluminum nitride layer 406 has a thickness of 300-600 nm.

A multilayer composition graded aluminum gallium nitride buffer stack 408 extends over the aluminum nitride layer 406. The buffer stack 408 in this example includes three layers that are or include aluminum gallium nitride. In other examples, a different number of two or more composition graded aluminum gallium nitride buffer stack layers can be used. In a different example, a different buffer stack arrangement can be used, such as single or dual superlattice buffer structures (not shown). In the example of FIG. 4, the buffer stack 408 includes a first aluminum gallium nitride layer 411 over the aluminum nitride layer 406. In one example, the first aluminum gallium nitride layer 411 extends directly on and contacts an upper or top side of the aluminum nitride layer 406. In another example, other materials, such as impurities or artifacts or remnant materials from the fabrication processing may be present between the first aluminum gallium nitride layer 411 and the aluminum nitride layer 406. The composition graded AlGaN buffer stack 408 also includes a second aluminum gallium nitride layer 412 over the first aluminum gallium nitride layer 411. In one example, the second aluminum gallium nitride layer 412 extends directly on and contacts an upper or top side of the first aluminum gallium nitride layer 411. In another example, other materials, such as impurities or artifacts or remnant materials from the fabrication processing may be present between the second aluminum gallium nitride layer 412 and the first aluminum gallium nitride layer 411. A third aluminum gallium nitride layer 413 extends over the second aluminum gallium nitride layer 412. In one example, the third aluminum gallium nitride layer 413 extends directly on and contacts an upper or top side of the second aluminum gallium nitride layer 412. In another example, other materials, such as impurities or artifacts or remnant materials from the fabrication processing may be present between the third aluminum gallium nitride layer 413 and the second aluminum gallium nitride layer 412.

In one example, the multilayer composition graded aluminum gallium nitride stack 408 includes the first aluminum gallium nitride sublayer 411 having a first aluminum concentration over the aluminum nitride layer 406, the second aluminum gallium nitride sublayer 412 having a second aluminum concentration that is less than the first aluminum concentration over the first aluminum gallium nitride sublayer 411, and the third aluminum gallium nitride sublayer 413 having a third aluminum concentration that is less than the second aluminum concentration over the second aluminum gallium nitride sublayer 412. In one example, the first aluminum concentration is 60-70%, the second aluminum concentration is 40-50%, and the third aluminum concentration is 20-30%. In one example, the first aluminum gallium nitride layer 411 has a thickness of 300-600 nm, the second aluminum gallium nitride layer 412 has a thickness of 1.4-1.8 µm, and the third aluminum gallium nitride layer 411 has a thickness of 1.4-2.0 µm.

The electronic device 400 further includes a gallium nitride layer 414 over the multilayer composition graded aluminum gallium nitride stack 408. In one example, the gallium nitride layer 414 has a thickness of 0.5-2.0 µm. In this or another example, the gallium nitride layer 414 has a thickness of 0.1-1.0 µm. In one implementation, the gallium nitride layer 414 includes carbon. In one example, the gallium nitride layer 414 extends directly on and contacts an upper or top side of the third aluminum gallium nitride layer 413. In another example, other materials, such as impurities or artifacts or remnant materials from the fabrication processing may be present between the gallium nitride layer 414 and the third aluminum gallium nitride layer 413.

The electronic device 400 also includes a back barrier layer 416 over the buffer structure. The back barrier layer 416 in one example is or includes aluminum gallium nitride of any suitable stoichiometry. In one example, the back barrier layer 416 extends directly on and contacts an upper or top side of the gallium nitride layer 414 at an interface 415 between the top side of the gallium nitride layer 414 and the bottom side of the back barrier layer 416. In another example, other materials, such as impurities or artifacts or remnant materials from the fabrication processing may be present between the back barrier layer 416 and the gallium nitride layer 414. The back barrier layer 416 has a thickness 417, for example, from a few tens of nm to a few µm, such as 20 nm to 5 µm. In another example, the back barrier layer 416 is or includes aluminum nitride, indium aluminum nitride, or indium aluminum gallium nitride of any suitable stoichiometry.

An upper gallium nitride layer 418 extends over the back barrier layer 416. The layer 418 is or includes gallium nitride of any suitable stoichiometry. In one example, the gallium nitride layer 418 has a thickness 419 of 0.1-1.0 µm. In one implementation, the gallium nitride layer 418 includes carbon. In one example, the gallium nitride layer 418 extends directly on and contacts an upper or top side of the back barrier layer 416. In another example, other materials, such as impurities or artifacts or remnant materials from the fabrication processing may be present between the gallium nitride layer 418 and the back barrier layer 416.

The electronic device 400 also includes a hetero-epitaxy structure having an aluminum nitride layer 420 over the gallium nitride layer 418, and an aluminum gallium nitride layer 421 over the aluminum nitride layer 420. In one example, the layer 420 is or includes aluminum nitride of any suitable stoichiometry. In one example, the aluminum nitride layer 420 extends directly on and contacts an upper or top side of the gallium nitride layer 418. In another example, other materials, such as impurities or artifacts or remnant materials from the fabrication processing may be present between the aluminum nitride layer 420 and the gallium nitride layer 418. In this or another example, the layer 421 is or includes aluminum gallium nitride of any suitable stoichiometry. In one example, the aluminum gallium nitride layer 421 extends directly on and contacts an upper or top side of the aluminum nitride layer 420. In another example, other materials, such as impurities or artifacts or remnant materials from the fabrication processing may be present between the aluminum gallium nitride layer 421 and the aluminum nitride layer 420. The hetero junction at the interface between the aluminum gallium nitride layer 421 and the aluminum nitride layer 420 forms a two-dimensional electron gas region 422. In one example, the hetero-epitaxy structure, including the layers 420 and 421 has a total thickness 423 of 10-30 nm. The electronic device 400 also includes one or more transistors, including the depletion mode high side first transistor 401, and the depletion mode low side second transistor 402 in the illustrated implementation.

The various buffer layers and layers of the hetero-epitaxy structure are fabricated in one example using epitaxial growth deposition processing, for example, a continuous epitaxial deposition process with variables and materials changed throughout form the constituent layers and/or two or more sequential epitaxial deposition processes, with a total thickness of approximately 5.1 µm in one example. In the depletion mode transistor 401, the hetero-epitaxy structure including the layers 420 and 421 has a total thickness of approximately 10-30 nm, and the hetero-epitaxy structure in the enhancement mode transistor 402 has a total thickness of approximately 10-20 nm. The aluminum nitride layer 420 in one example has a thickness of approximately 10 Å (1 nm), and the aluminum gallium nitride layer 421 has a thickness of approximately 20 nm. In the illustrated example, the gallium nitride layer 418 has a thickness of approximately 0.1-1.0 µm. In one example, the aluminum gallium nitride layer 421 has an aluminum concentration of about 26%.

The electronic device 400 includes a hole injector structure 426 having a doped gallium nitride structure 424 over the aluminum gallium nitride layer 421. The hole injector structure 426 also includes a conductive structure 425 formed as a contact or via that is partially over and contacts the doped gallium nitride structure 424. In one example, the doped gallium nitride structure 424 is or includes gallium nitride of any suitable stoichiometry that is implanted with p-type impurities (p-GaN, including magnesium or other p-type impurities). In one example, the doped gallium nitride structure 424 extends directly on and contacts an upper or top side of the aluminum gallium nitride layer 421. In another example, other materials, such as impurities or artifacts or remnant materials from the fabrication processing may be present between the doped gallium nitride structure 424 and the aluminum gallium nitride layer 421. In one example, the p-doped gallium nitride layer 424 includes magnesium dopants and has a thickness of 50-200 nm, such as about 70 nm in one implementation. The conductive structure 425 is or includes tungsten, copper, aluminum or other conductive metal. The electronic device 400 further includes an isolation structure 428, such as silicon dioxide of any suitable stoichiometry that extends downward between the transistors 401 and 402 through the aluminum gallium nitride layer 421, aluminum nitride layer 420, the gallium nitride layer 418, and the back barrier layer 416, and partially into the gallium nitride layer 414. In this or another example, the isolation between the transistors 401 and 402 is done by implantation (not shown).

The electronic device 400 also includes a metallization structure with a first pre-metal dielectric (e.g., PMD) layer 430, for example, including silicon nitride or silicon dioxide, with various conductive metal structures formed therein, including the conductive structure 425. In one example, the conductive structure 425 extends directly on and contacts at least a portion of an upper or top side of the doped gallium nitride structure 424. In another example, other materials, such as impurities or artifacts or remnant materials from the fabrication processing may be present between the conductive structure 425 and the doped gallium nitride structure 424.

The PMD layer or level also includes a first drain contact or electrode 431 of the first transistor 401, a first source contact or electrode 432 of the first transistor 401, and a first gate contact or electrode 434 of the first transistor 401. The PMD layer or level further includes a second drain contact or electrode 435 of the second transistor 402, a second source contact or electrode 436 of the second transistor 402, a second gate contact or electrode 438 of the second transistor 402, and one or more conductive contacts or vias 439 that extend through the PMD layer 430 and provide electrical interconnection of various transistor terminals for routing in a second metallization structure level. The conductive drain and source contacts 431, 435, 432, 436 of the respective first and second transistors 401 and 402 extend partially in the hetero-epitaxy structure 420, 421, and the conductive gate contacts 434 and 438 of the respective first and second transistors 401 and 402 extend on and contact the hetero-epitaxy structure 420, 421.

The electronic device 400 in FIG. 4 further includes a second metallization structure level with a dielectric layer 450 (e.g., silicon nitride or silicon dioxide) having one or more conductive routing features 451 (e.g., aluminum, copper, etc.), for example, to provide routing of drain, source and gate connections and associated signals to one another and/or to conductive bond pads, or other externally exposed conductive features by which the transistors 401 and 402 can be electrically interconnected with other circuitry, for example, using bond wires or lead frame electrical connections to integrated circuit leads, such as pins or pads in a packaged electronic device.

The first transistor 401 in this example has a first drain terminal or lead 461 (D1), a first gate terminal or lead 462 (G1), and a first source terminal or lead 463 (S1). The second transistor 402 has a second drain terminal or lead 464 (D2), a second gate terminal or lead 465 (G2), and a second source terminal or lead 466 (S2), where the terminals in one example are electrically coupled to conductive leads of the finished electronic device 400 after packaging. In the electronic device 400 of FIG. 4, the first and second transistors 401 and 402 are enhancement mode transistors, and the first and second gates 462 and 465 (G1 and G2) include respective gate contact structures 434 and 438 that extend on and contact a respective p-doped GaN structure 424 above the AlGaN layer 421 of the hetero-epitaxy structure 420, 421.

In the illustrated example, the first drain 461, D1 extends partially in the hetero-epitaxy structure 420, 421, the first gate 462, G1 extends over and contacts the respective p-doped GaN structure 424 over the hetero-epitaxy structure 420, 421 and is laterally spaced apart from the first drain 461, D1 along a first direction (e.g., the "X" direction in the figures). The first source 463, S1 extends partially in the hetero-epitaxy structure 420, 421 and is laterally spaced apart from the first gate 462, G1 along the first direction X. The second drain 464, D2 extends partially in the hetero-epitaxy structure 420, 421 and is coupled to the first source 463, S1 by a conductive routing feature 451 in FIG. 4 to form the switching node SW. The second gate 465, G2 extends overn and contacts the respective p-doped GaN structure 424 over the hetero-epitaxy structure 420, 421 and is laterally spaced apart from the second drain 464, D2 along the first direction X. The second source 466, S2 extends partially in the hetero-epitaxy structure 420, 421 and is laterally spaced apart from the second gate 465, G2 along the first direction X.

In this example, moreover, the hole injector structure 426 is laterally spaced apart from and laterally outward from the first drain 461 (D1) and the first drain 461 (D1) is laterally spaced apart from and between the hole injector structure 426 and the first gate 462 (G1) along the first direction X. In addition, the metallization structure in this example electrically couples the hole injector structure 426 to the first gate 462 (G1). In operation, when the first transistor 401 is turned on, the hole injector structure 426 operates to inject holes downward into the GaN layer 418. In another implementation, the conductive structure 425 of the hole injector structure 426 is coupled to a controlled voltage node (not shown) to selectively provide a positive voltage signal to the hole injector structure 426, for example, when the first gate 462 (G1) is powered to turn the first transistor 401 on.

In the electronic device 400 of FIG. 4, the conductive structure 425 of the hole injector structure 426 is coupled to the first gate 462 (G1). In this example the metallization structure includes a conductive routing feature 451 that electrically couples the first source 463 (S1) to the second drain 464 (D2). In operation, when the first transistor 401 is turned on and the first drain D1 is at a high voltage relative to the substrate 404 and the first gate 462, G1 is at a voltage above the threshold voltage of the first transistor 401, electrons form in a channel region at and near the top surface of the gallium nitride layer 418, indicated at 470 in FIG. 4. The voltage at the conductive structure 425 of the hole injector structure 426 causes injection of holes from the p-doped gallium nitride structure 424. The injected holes form a hole layer in the buffer at or near the bottom side of the gallium nitride layer 418 proximate the interface 415 of the back barrier layer 416, indicated at 472 in FIG. 4 to mitigate vertical electric field back gating effects for the first transistor 401.

Figure 5:
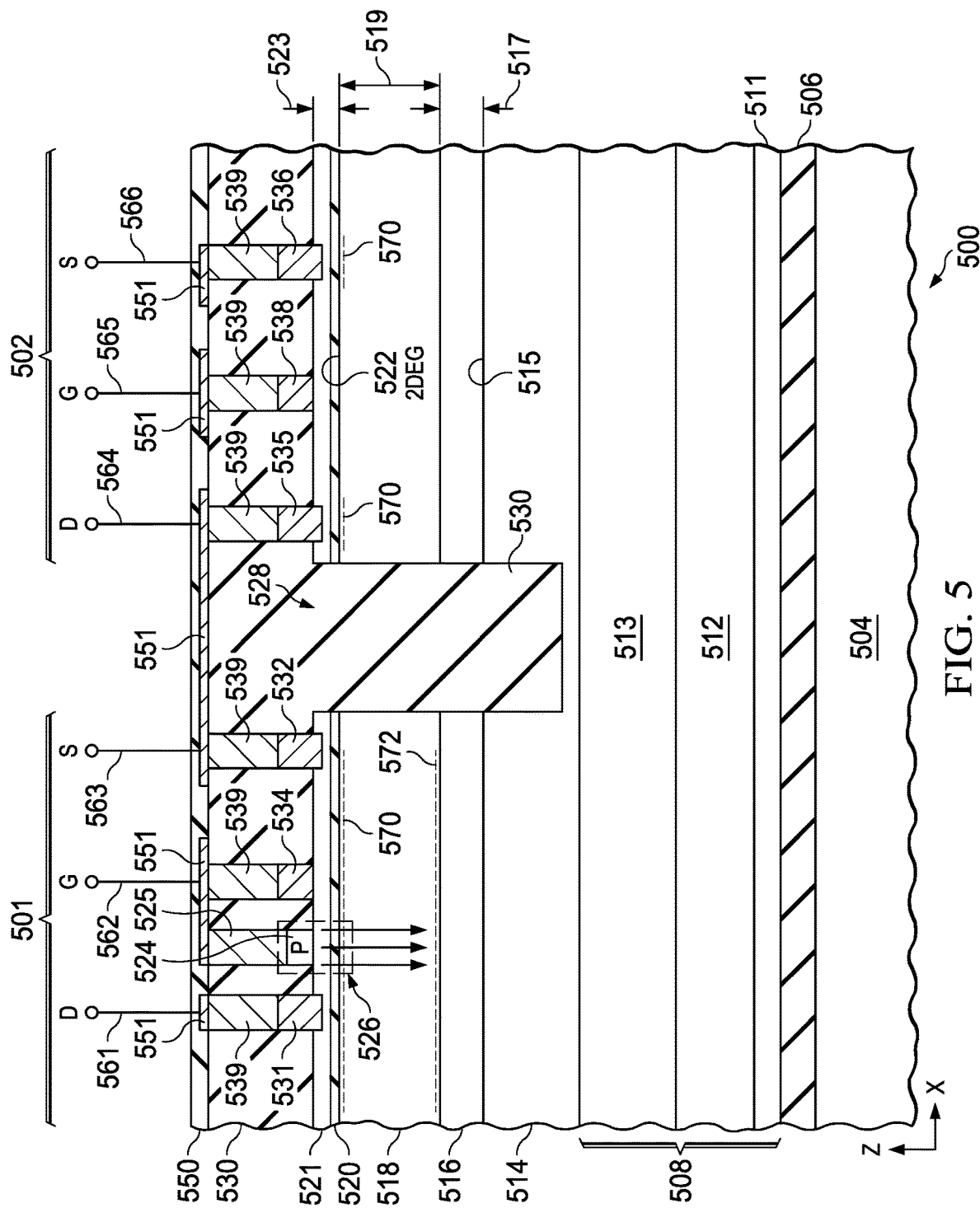
FIG. 5 is a partial sectional side elevation view of an electronic device with first and second depletion mode gallium nitride transistors with an aluminum gallium nitride back barrier layer between a buffer structure and a gallium nitride layer, and a hole injector structure laterally spaced from and between a drain contact and gate of the first transistor and over a hetero-epitaxy structure.

FIG. 5 shows a partial sectional side elevation view of another electronic device 500 with first and second depletion mode gallium nitride transistors 501 and 502 with an aluminum gallium nitride back barrier layer between a buffer structure and a gallium nitride layer, and a hole injector structure laterally spaced from and between a drain contact and gate of the first transistor and over a hetero-epitaxy structure. The electronic device 500 includes a semiconductor substrate 504, such as silicon. The hole injector structure injects holes to form a hole layer proximate an interface of the back barrier and a buffer structure to mitigate vertical electric field back gating effects for the first transistor 501. This structure helps avoid or mitigate back gate effects associated with this high electric field and helps avoid or mitigate reduced RDSON of the first transistor 501 during operation of the electronic device 500.

The electronic device 500 includes an epitaxially grown stack of layers including a buffer stack formed above the semiconductor substrate 504. The individual layers of the stack structure are described herein as aluminum nitride, aluminum gallium nitride, gallium nitride, etc., and the individual layers can be of any suitable stoichiometric composition that is or includes the named constituent materials alone or in the further presence of small amounts of impurities, artifacts, or other materials, such as materials that may remain after individual processing steps associated with the manufacturer of semiconductor products. The example stack includes an aluminum nitride layer 506 over the substrate 504. In one example, the aluminum nitride layer 506 extends directly on and contacts an upper or top side of the substrate 504. In another example, other materials, such as impurities or artifacts or remnant materials from the fabrication processing may be present between the aluminum nitride layer 506 and the substrate 504. In one example, the aluminum nitride layer 506 has a thickness of 300-600 nm.

A multilayer composition graded aluminum gallium nitride buffer stack 508 extends over the aluminum nitride layer 506. The buffer stack 508 in this example includes three layers that are or include aluminum gallium nitride. In other examples, a different number of two or more composition graded aluminum gallium nitride buffer stack layers can be used. In a different example, a different buffer stack arrangement can be used, such as single or dual superlattice buffer structures (not shown). In the example of FIG. 5, the buffer stack 508 includes a first aluminum gallium nitride layer 511 over the aluminum nitride layer 506. In one example, the first aluminum gallium nitride layer 511 extends directly on and contacts an upper or top side of the aluminum nitride layer 506. In another example, other materials, such as impurities or artifacts or remnant materials from the fabrication processing may be present between the first aluminum gallium nitride layer 511 and the aluminum nitride layer 506. The composition graded AlGaN buffer stack 508 also includes a second aluminum gallium nitride layer 512 over the first aluminum gallium nitride layer 511. In one example, the second aluminum gallium nitride layer 512 extends directly on and contacts an upper or top side of the first aluminum gallium nitride layer 511. In another example, other materials, such as impurities or artifacts or remnant materials from the fabrication processing may be present between the second aluminum gallium nitride layer 512 and the first aluminum gallium nitride layer 511. A third aluminum gallium nitride layer 513 extends over the second aluminum gallium nitride layer 512. In one example, the third aluminum gallium nitride layer 513 extends directly on and contacts an upper or top side of the second aluminum gallium nitride layer 512. In another example, other materials, such as impurities or artifacts or remnant materials from the fabrication processing may be present between the third aluminum gallium nitride layer 513 and the second aluminum gallium nitride layer 512.

In one example, the multilayer composition graded aluminum gallium nitride stack 508 includes the first aluminum gallium nitride sublayer 511 having a first aluminum concentration over the aluminum nitride layer 506, the second aluminum gallium nitride sublayer 512 having a second aluminum concentration that is less than the first aluminum concentration over the first aluminum gallium nitride sublayer 511, and the third aluminum gallium nitride sublayer 513 having a third aluminum concentration that is less than the second aluminum concentration over the second aluminum gallium nitride sublayer 512. In one example, the first aluminum concentration is 60-70%, the second aluminum concentration is 40-50%, and the third aluminum concentration is 20-30%. In one example, the first aluminum gallium nitride layer 511 has a thickness of 300-600 nm, the second aluminum gallium nitride layer 512 has a thickness of 1.4-1.8 μm, and the third aluminum gallium nitride layer 511 has a thickness of 1.4-2.0 μm.

The electronic device 500 further includes a gallium nitride layer 514 over the multilayer composition graded aluminum gallium nitride stack 508. In one example, the gallium nitride layer 514 has a thickness of 0.5-2.0 μm. In this or another example, the gallium nitride layer 514 has a thickness of 0.1-1.0 μm. In one implementation, the gallium nitride layer 514 includes carbon. In one example, the gallium nitride layer 514 extends directly on and contacts an upper or top side of the third aluminum gallium nitride layer 513. In another example, other materials, such as impurities or artifacts or remnant materials from the fabrication processing may be present between the gallium nitride layer 514 and the third aluminum gallium nitride layer 513.

The electronic device 500 also includes a back barrier layer 516 over the buffer structure. The back barrier layer 516 in one example is or includes aluminum gallium nitride of any suitable stoichiometry. In one example, the back barrier layer 516 extends directly on and contacts an upper or top side of the gallium nitride layer 514 at an interface 515 between the top side of the gallium nitride layer 514 and the bottom side of the back barrier layer 516. In another example, other materials, such as impurities or artifacts or remnant materials from the fabrication processing may be present between the back barrier layer 516 and the gallium nitride layer 514. The back barrier layer 516 has a thickness 517, for example, from a few tens of nm to a few μm, such as 20 nm to 5 μm. In another example, the back barrier layer 516 is or includes aluminum nitride, indium aluminum nitride, or indium aluminum gallium nitride of any suitable stoichiometry.

An upper gallium nitride layer 518 extends over the back barrier layer 516. The layer 518 is or includes gallium nitride of any suitable stoichiometry. In one example, the gallium nitride layer 518 has a thickness 519 of 0.1-1.0 μm. In one implementation, the gallium nitride layer 518 includes carbon. In one example, the gallium nitride layer 518 extends directly on and contacts an upper or top side of the back barrier layer 516. In another example, other materials, such as impurities or artifacts or remnant materials from the fabrication processing may be present between the gallium nitride layer 518 and the back barrier layer 516.

The electronic device 500 also includes a hetero-epitaxy structure having an aluminum nitride layer 520 over the gallium nitride layer 518, and an aluminum gallium nitride layer 521 over the aluminum nitride layer 520. In one example, the layer 520 is or includes aluminum nitride of any suitable stoichiometry. In one example, the aluminum nitride layer 520 extends directly on and contacts an upper or top side of the gallium nitride layer 518. In another example, other materials, such as impurities or artifacts or remnant materials from the fabrication processing may be present between the aluminum nitride layer 520 and the gallium nitride layer 518. In this or another example, the layer 521 is or includes aluminum gallium nitride of any suitable stoichiometry. In one example, the aluminum gallium nitride layer 521 extends directly on and contacts an upper or top side of the aluminum nitride layer 520. In another example, other materials, such as impurities or artifacts or remnant materials from the fabrication processing may be present between the aluminum gallium nitride layer 521 and the aluminum nitride layer 520. The hetero junction at the interface between the aluminum gallium nitride layer 521 and the aluminum nitride layer 520 forms a two-dimensional electron gas region 522. In one example, the hetero-epitaxy structure, including the layers 520 and 521 has a total thickness 523 of 10-30 nm. The electronic device 500 also includes one or more transistors, including the depletion mode high side first transistor 501, and the depletion mode low side second transistor 502 in the illustrated implementation.

The various buffer layers and layers of the hetero-epitaxy structure are fabricated in one example using epitaxial growth deposition processing, for example, a continuous epitaxial deposition process with variables and materials changed throughout form the constituent layers and/or two or more sequential epitaxial deposition processes, with a total thickness of approximately 5.1 µm in one example. In the depletion mode transistor 501, the hetero-epitaxy structure including the layers 520 and 521 has a total thickness of approximately 10-30 nm, and the hetero-epitaxy structure in the enhancement mode transistor 502 has a total thickness of approximately 10-20 nm. The aluminum nitride layer 520 in one example has a thickness of approximately 10 Å (1 nm), and the aluminum gallium nitride layer 521 has a thickness of approximately 20 nm. In the illustrated example, the gallium nitride layer 518 has a thickness of approximately 0.1-1.0 µm. In one example, the aluminum gallium nitride layer 521 has an aluminum concentration of about 26%.

The electronic device 500 includes a hole injector structure 526 having a doped gallium nitride structure 524 over the aluminum gallium nitride layer 521. The hole injector structure 526 also includes a conductive structure 525 formed as a contact or via that is partially over and contacts the doped gallium nitride structure 524. In one example, the doped gallium nitride structure 524 is or includes gallium nitride of any suitable stoichiometry that is implanted with p-type impurities (p-GaN, including magnesium or other p-type impurities). In one example, the doped gallium nitride structure 524 extends directly on and contacts an upper or top side of the aluminum gallium nitride layer 521. In another example, other materials, such as impurities or artifacts or remnant materials from the fabrication processing may be present between the doped gallium nitride structure 524 and the aluminum gallium nitride layer 521. In one example, the p-doped gallium nitride layer 524 includes magnesium dopants and has a thickness of 50-200 nm, such as about 70 nm in one implementation. The conductive structure 525 is or includes tungsten, copper, aluminum or other conductive metal. The electronic device 500 further includes an isolation structure 528, such as silicon dioxide of any suitable stoichiometry that extends downward between the transistors 501 and 502 through the aluminum gallium nitride layer 521, aluminum nitride layer 520, the gallium nitride layer 518, and the back barrier layer 516, and partially into the gallium nitride layer 514. In this or another example, the isolation between the transistors 501 and 502 is done by implantation (not shown).

The electronic device 500 also includes a metallization structure with a first pre-metal dielectric (e.g., PMD) layer 530, for example, including silicon nitride or silicon dioxide, with various conductive metal structures formed therein, including the conductive structure 525. In one example, the conductive structure 525 extends directly on and contacts at least a portion of an upper or top side of the doped gallium nitride structure 524. In another example, other materials, such as impurities or artifacts or remnant materials from the fabrication processing may be present between the conductive structure 525 and the doped gallium nitride structure 524.

The PMD layer or level also includes a first drain contact or electrode 531 of the first transistor 501, a first source contact or electrode 532 of the first transistor 501, and a first gate contact or electrode 534 of the first transistor 501. The PMD layer or level further includes a second drain contact or electrode 535 of the second transistor 502, a second source contact or electrode 536 of the second transistor 502, a second gate contact or electrode 538 of the second transistor 502, and one or more conductive contacts or vias 539 that extend through the PMD layer 530 and provide electrical interconnection of various transistor terminals for routing in a second metallization structure level. The conductive drain and source contacts 531, 535, 532, 536 of the respective first and second transistors 501 and 502 extend partially in the hetero-epitaxy structure 520, 521, and the conductive gate contacts 534 and 538 of the respective first and second transistors 501 and 502 extend on and contact the hetero-epitaxy structure 520, 521.

The electronic device 500 in FIG. 5 further includes a second metallization structure level with a dielectric layer 550 (e.g., silicon nitride or silicon dioxide) having one or more conductive routing features 551 (e.g., aluminum, copper, etc.), for example, to provide routing of drain, source and gate connections and associated signals to one another and/or to conductive bond pads, or other externally exposed conductive features by which the transistors 501 and 502 can be electrically interconnected with other circuitry, for example, using bond wires or lead frame electrical connections to integrated circuit leads, such as pins or pads in a packaged electronic device.

The first transistor 501 in this example has a first drain terminal or lead 561 (D1), a first gate terminal or lead 562 (G1), and a first source terminal or lead 563 (S1). The second transistor 502 has a second drain terminal or lead 564 (D2), a second gate terminal or lead 565 (G2), and a second source terminal or lead 566 (S2), where the terminals in one example are electrically coupled to conductive leads of the finished electronic device 500 after packaging. In the illustrated example, the first drain 561, D1 extends partially in the hetero-epitaxy structure 520, 521, the first gate 562, G1 extends over the hetero-epitaxy structure 520, 521 and is laterally spaced apart from the first drain 561, D1 along the first direction X. The first source 563, S1 extends partially in the hetero-epitaxy structure 520, 521 and is laterally spaced apart from the first gate 562, G1 along the first direction X. The second drain 564, D2 extends partially in the hetero-epitaxy structure 520, 521 and is coupled to the first source 563, S1 by a conductive routing feature 551 in FIG. 5 to form the switching node SW. The second gate 565, G2 extends over the hetero-epitaxy structure 520, 521 and is laterally spaced apart from the second drain 564, D2 along the first direction X. The second source 566, S2 extends partially in the hetero-epitaxy structure 520, 521 and is laterally spaced apart from the second gate 565, G2 along the first direction X.

In this example, the hole injector structure 526 is laterally spaced apart from and between the first drain 561 (D1) and the first gate 562 (G1) along a first direction X. In addition, the metallization structure in this example electrically couples the hole injector structure 526 to the first gate 562 (G1). In operation, when the first transistor 501 is turned on, the hole injector structure 526 operates to inject holes downward into the GaN layer 518. In another implementation, the conductive structure 525 of the hole injector structure 526 is coupled to a controlled voltage node (not shown) to selectively provide a positive voltage signal to the hole injector structure 526, for example, when the first gate 562 (G1) is powered to turn the first transistor 501 on. The first and second transistors 501 and 502 in this example are depletion mode transistors, and the first and second gates 562 and 565 (G1 and G2) include respective gate contact structures 534 and 538 that extend on and contact the AlGaN layer 521 of the hetero-epitaxy structure 520, 521. In this example, the conductive structure 525 of the hole injector structure 526 is coupled to the first gate 562 (G1). The metallization structure includes a conductive routing feature 551 that electrically couples the first source 563 (S1) to the second drain 564 (D2). In operation, when the first transistor 501 is turned on and the first drain D1 is at a high voltage relative to the substrate 504 and the first gate 562, G1 is at a voltage above the threshold voltage of the first transistor 501, electrons form in a channel region at and near the top surface of the gallium nitride layer 518, indicated at 570 in FIG. 5. The voltage at the conductive structure 525 of the hole injector structure 526 causes injection of holes from the p-doped gallium nitride structure 524. The injected holes form a hole layer in the buffer at or near the bottom side of the gallium nitride layer 518 proximate the interface 515 of the back barrier layer 516, indicated at 572 in FIG. 5 to mitigate vertical electric field back gating effects for the first transistor 501.

Figure 6:
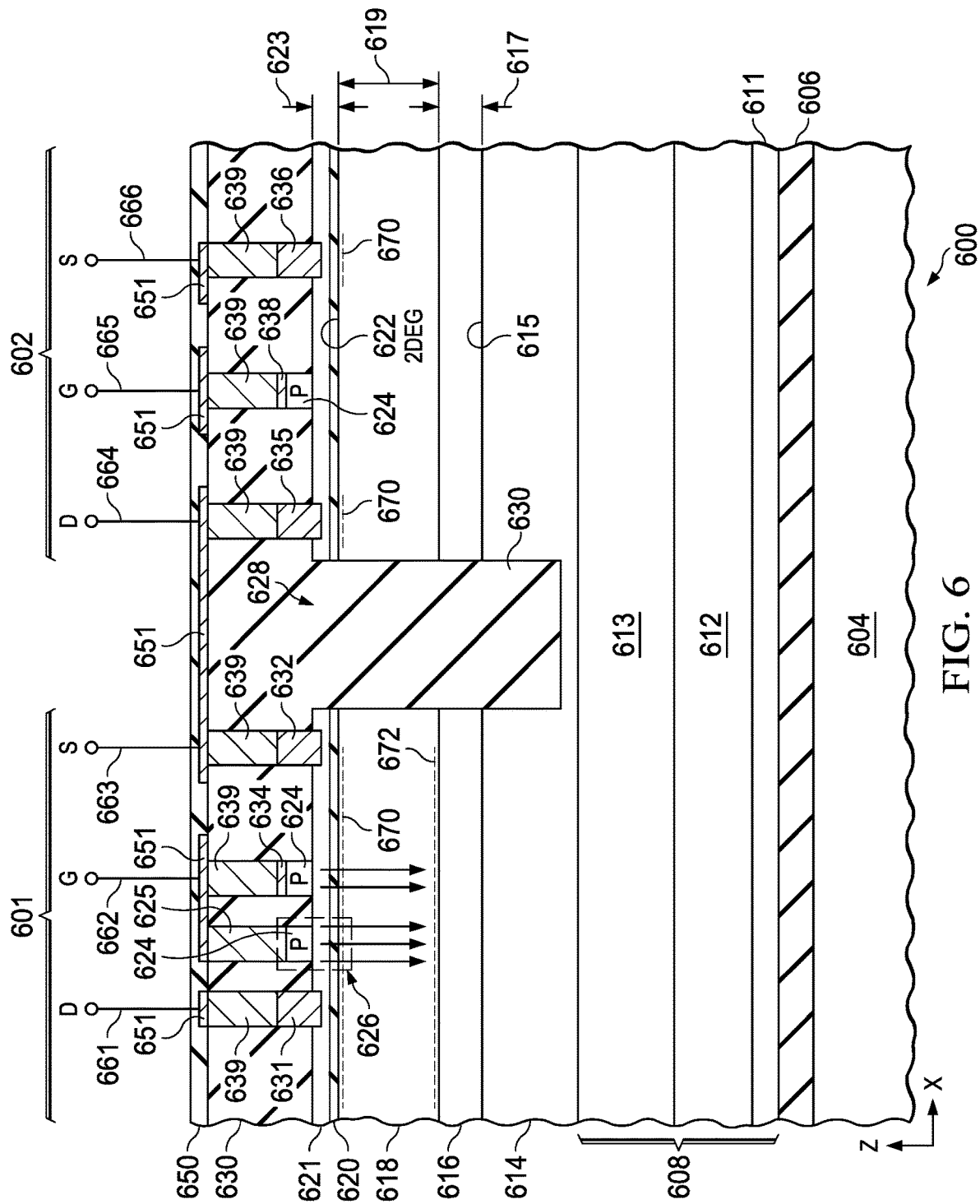
FIG. 6 is a partial sectional side elevation view of an electronic device with first and second enhancement mode gallium nitride transistors with an aluminum gallium nitride back barrier layer between a buffer structure and a gallium nitride layer, and a hole injector structure laterally spaced from and between a drain contact and gate of the first transistor and over a hetero-epitaxy structure.

FIG. 6 shows a partial sectional side elevation view of another electronic device 600 with first and second enhancement mode gallium nitride transistors 602 and 602 with an aluminum gallium nitride back barrier layer between a buffer structure and a gallium nitride layer, and a hole injector structure laterally spaced from and between a drain contact and gate of the first transistor and over a heteroepitaxy structure. The electronic device 600 includes a semiconductor substrate 604, such as silicon. The hole injector structure injects holes to form a hole layer proximate an interface of the back barrier and a buffer structure to mitigate vertical electric field back gating effects for the first transistor 601. This structure helps avoid or mitigate back gate effects associated with this high electric field and helps avoid or mitigate reduced RDSON of the first transistor 601 during operation of the electronic device 600.

The electronic device 600 includes an epitaxially grown stack of layers including a buffer stack formed above the semiconductor substrate 604. The individual layers of the stack structure are described herein as aluminum nitride, aluminum gallium nitride, gallium nitride, etc., and the individual layers can be of any suitable stoichiometric composition that is or includes the named constituent materials alone or in the further presence of small amounts of impurities, artifacts, or other materials, such as materials that may remain after individual processing steps associated with the manufacturer of semiconductor products. The example stack includes an aluminum nitride layer 606 over the substrate 604. In one example, the aluminum nitride layer 606 extends directly on and contacts an upper or top side of the substrate 604. In another example, other materials, such as impurities or artifacts or remnant materials from the fabrication processing may be present between the aluminum nitride layer 606 and the substrate 604. In one example, the aluminum nitride layer 606 has a thickness of 300-600 nm.

A multilayer composition graded aluminum gallium nitride buffer stack 608 extends over the aluminum nitride layer 606. The buffer stack 608 in this example includes three layers that are or include aluminum gallium nitride. In other examples, a different number of two or more composition graded aluminum gallium nitride buffer stack layers can be used. In a different example, a different buffer stack arrangement can be used, such as single or dual superlattice buffer structures (not shown). In the example of FIG. 6, the buffer stack 608 includes a first aluminum gallium nitride layer 611 over the aluminum nitride layer 606. In one example, the first aluminum gallium nitride layer 611 extends directly on and contacts an upper or top side of the aluminum nitride layer 606. In another example, other materials, such as impurities or artifacts or remnant materials from the fabrication processing may be present between the first aluminum gallium nitride layer 611 and the aluminum nitride layer 606. The composition graded AlGaN buffer stack 608 also includes a second aluminum gallium nitride layer 612 over the first aluminum gallium nitride layer 611. In one example, the second aluminum gallium nitride layer 612 extends directly on and contacts an upper or top side of the first aluminum gallium nitride layer 611. In another example, other materials, such as impurities or artifacts or remnant materials from the fabrication processing may be present between the second aluminum gallium nitride layer 612 and the first aluminum gallium nitride layer 611. A third aluminum gallium nitride layer 613 extends over the second aluminum gallium nitride layer 612. In one example, the third aluminum gallium nitride layer 613 extends directly on and contacts an upper or top side of the second aluminum gallium nitride layer 612. In another example, other materials, such as impurities or artifacts or remnant materials from the fabrication processing may be present between the third aluminum gallium nitride layer 613 and the second aluminum gallium nitride layer 612.

In one example, the multilayer composition graded aluminum gallium nitride stack 608 includes the first aluminum gallium nitride sublayer 611 having a first aluminum concentration over the aluminum nitride layer 606, the second aluminum gallium nitride sublayer 612 having a second aluminum concentration that is less than the first aluminum concentration over the first aluminum gallium nitride sublayer 611, and the third aluminum gallium nitride sublayer 613 having a third aluminum concentration that is less than the second aluminum concentration over the second aluminum gallium nitride sublayer 612. In one example, the first aluminum concentration is 60-70%, the second aluminum concentration is 40-50%, and the third aluminum concentration is 20-30%. In one example, the first aluminum gallium nitride layer 611 has a thickness of 300-600 nm, the second aluminum gallium nitride layer 612 has a thickness of 1.4-1.8 µm, and the third aluminum gallium nitride layer 611 has a thickness of 1.4-2.0 µm.

The electronic device 600 further includes a gallium nitride layer 614 over the multilayer composition graded aluminum gallium nitride stack 608. In one example, the gallium nitride layer 614 has a thickness of 0.5-2.0 µm. In this or another example, the gallium nitride layer 614 has a thickness of 0.1-1.0 µm. In one implementation, the gallium nitride layer 614 includes carbon. In one example, the gallium nitride layer 614 extends directly on and contacts an upper or top side of the third aluminum gallium nitride layer 613. In another example, other materials, such as impurities or artifacts or remnant materials from the fabrication processing may be present between the gallium nitride layer 614 and the third aluminum gallium nitride layer 613.

The electronic device 600 also includes a back barrier layer 616 over the buffer structure. The back barrier layer 616 in one example is or includes aluminum gallium nitride of any suitable stoichiometry. In one example, the back barrier layer 616 extends directly on and contacts an upper or top side of the gallium nitride layer 614 at an interface 615 between the top side of the gallium nitride layer 614 and the bottom side of the back barrier layer 616. In another example, other materials, such as impurities or artifacts or remnant materials from the fabrication processing may be present between the back barrier layer 616 and the gallium nitride layer 614. The back barrier layer 616 has a thickness 617, for example, from a few tens of nm to a few µm, such as 20 nm to 5 µm. In another example, the back barrier layer 616 is or includes aluminum nitride, indium aluminum nitride, or indium aluminum gallium nitride of any suitable stoichiometry.

An upper gallium nitride layer 618 extends over the back barrier layer 616. The layer 618 is or includes gallium nitride of any suitable stoichiometry. In one example, the gallium nitride layer 618 has a thickness 619 of 0.1-1.0 µm. In one implementation, the gallium nitride layer 618 includes carbon. In one example, the gallium nitride layer 618 extends directly on and contacts an upper or top side of the back barrier layer 616. In another example, other materials, such as impurities or artifacts or remnant materials from the fabrication processing may be present between the gallium nitride layer 618 and the back barrier layer 616.

The electronic device 600 also includes a hetero-epitaxy structure having an aluminum nitride layer 620 over the gallium nitride layer 618, and an aluminum gallium nitride layer 621 over the aluminum nitride layer 620. In one example, the layer 620 is or includes aluminum nitride of any suitable stoichiometry. In one example, the aluminum nitride layer 620 extends directly on and contacts an upper or top side of the gallium nitride layer 618. In another example, other materials, such as impurities or artifacts or remnant materials from the fabrication processing may be present between the aluminum nitride layer 620 and the gallium nitride layer 618. In this or another example, the layer 621 is or includes aluminum gallium nitride of any suitable stoichiometry. In one example, the aluminum gallium nitride layer 621 extends directly on and contacts an upper or top side of the aluminum nitride layer 620. In another example, other materials, such as impurities or artifacts or remnant materials from the fabrication processing may be present between the aluminum gallium nitride layer 621 and the aluminum nitride layer 620. The hetero junction at the interface between the aluminum gallium nitride layer 621 and the aluminum nitride layer 620 forms a two-dimensional electron gas region 622. In one example, the hetero-epitaxy structure, including the layers 620 and 621 has a total thickness 623 of 10-30 nm. The electronic device 600 also includes one or more transistors, including the enhancement mode high side first transistor 601, and the enhancement mode low side second transistor 602 in the illustrated implementation.

The various buffer layers and layers of the hetero-epitaxy structure are fabricated in one example using epitaxial growth deposition processing, for example, a continuous epitaxial deposition process with variables and materials changed throughout form the constituent layers and/or two or more sequential epitaxial deposition processes, with a total thickness of approximately 5.1 µm in one example. In the enhancement mode transistor 601, the hetero-epitaxy structure including the layers 620 and 621 has a total thickness of approximately 10-30 nm, and the hetero-epitaxy structure in the enhancement mode transistor 602 has a total thickness of approximately 10-20 nm. The aluminum nitride layer 620 in one example has a thickness of approximately 10 Å (1 nm), and the aluminum gallium nitride layer 621 has a thickness of approximately 20 nm. In the illustrated example, the gallium nitride layer 618 has a thickness of approximately 0.1-1.0 µm. In one example, the aluminum gallium nitride layer 621 has an aluminum concentration of about 26%.

The electronic device 600 includes a hole injector structure 626 having a doped gallium nitride structure 624 over the aluminum gallium nitride layer 621. The hole injector structure 626 also includes a conductive structure 625 formed as a contact or via that is partially over and contacts the doped gallium nitride structure 624. In one example, the doped gallium nitride structure 624 is or includes gallium nitride of any suitable stoichiometry that is implanted with p-type impurities (p-GaN, including magnesium or other p-type impurities). In one example, the doped gallium nitride structure 624 extends directly on and contacts an upper or top side of the aluminum gallium nitride layer 621. In another example, other materials, such as impurities or artifacts or remnant materials from the fabrication processing may be present between the doped gallium nitride structure 624 and the aluminum gallium nitride layer 621. In one example, the p-doped gallium nitride layer 624 includes magnesium dopants and has a thickness of 50-200 nm, such as about 70 nm in one implementation. The conductive structure 625 is or includes tungsten, copper, aluminum or other conductive metal. The electronic device 600 further includes an isolation structure 628, such as silicon dioxide of any suitable stoichiometry that extends downward between the transistors 601 and 602 through the aluminum gallium nitride layer 621, aluminum nitride layer 620, the gallium nitride layer 618, and the back barrier layer 616, and partially into the gallium nitride layer 614. In this or another example, the isolation between the transistors 601 and 602 is done by implantation (not shown).

The electronic device 600 also includes a metallization structure with a first pre-metal dielectric (e.g., PMD) layer 630, for example, including silicon nitride or silicon dioxide, with various conductive metal structures formed therein, including the conductive structure 625. In one example, the conductive structure 625 extends directly on and contacts at least a portion of an upper or top side of the doped gallium nitride structure 624. In another example, other materials, such as impurities or artifacts or remnant materials from the fabrication processing may be present between the conductive structure 625 and the doped gallium nitride structure 624.

The PMD layer or level also includes a first drain contact or electrode 631 of the first transistor 601, a first source contact or electrode 632 of the first transistor 601, and a first gate contact or electrode 634 of the first transistor 601. The PMD layer or level further includes a second drain contact or electrode 635 of the second transistor 602, a second source contact or electrode 636 of the second transistor 602, a second gate contact or electrode 638 of the second transistor 602, and one or more conductive contacts or vias 639 that extend through the PMD layer 630 and provide electrical interconnection of various transistor terminals for routing in a second metallization structure level. The conductive drain and source contacts 631, 635, 632, 636 of the respective first and second transistors 601 and 602 extend partially in the hetero-epitaxy structure 620, 621, and the conductive gate contacts 634 and 638 of the respective first and second transistors 601 and 602 extend on and contact the hetero-epitaxy structure 620, 621.

The electronic device 600 in FIG. 6 further includes a second metallization structure level with a dielectric layer 650 (e.g., silicon nitride or silicon dioxide) having one or more conductive routing features 651 (e.g., aluminum, copper, etc.), for example, to provide routing of drain, source and gate connections and associated signals to one another and/or to conductive bond pads, or other externally exposed conductive features by which the transistors 601 and 602 can be electrically interconnected with other circuitry, for example, using bond wires or lead frame electrical connections to integrated circuit leads, such as pins or pads in a packaged electronic device.

The first transistor 601 in this example has a first drain terminal or lead 661 (D1), a first gate terminal or lead 662 (G1), and a first source terminal or lead 663 (S1). The second transistor 602 has a second drain terminal or lead 664 (D2), a second gate terminal or lead 665 (G2), and a second source terminal or lead 666 (S2), where the terminals in one example are electrically coupled to conductive leads of the finished electronic device 600 after packaging. In the electronic device 600 of FIG. 6, the first and second transistors 601 and 602 are enhancement mode transistors, and the first and second gates 662 and 665 (G1 and G2) include respective gate contact structures 634 and 638 that extend on and contact a respective p-doped GaN structure 624 above the AlGaN layer 621 of the hetero-epitaxy structure 620, 621.

In the illustrated example, the first drain 661, D1 extends partially in the hetero-epitaxy structure 620, 621, the first gate 662, G1 extends over and contacts the respective p-doped GaN structure 624 over the hetero-epitaxy structure 620, 621 and is laterally spaced apart from the first drain 661, D1 along a first direction (e.g., the "X" direction in the figures). The first source 663, S1 extends partially in the hetero-epitaxy structure 620, 621 and is laterally spaced apart from the first gate 662, G1 along the first direction X. The second drain 664, D2 extends partially in the hetero-epitaxy structure 620, 621 and is coupled to the first source 663, S1 by a conductive routing feature 651 in FIG. 6 to form the switching node SW. The second gate 665, G2 extends over and contacts the respective p-doped GaN structure 624 over the hetero-epitaxy structure 620, 621 and is laterally spaced apart from the second drain 664, D2 along the first direction X. The second source 666, S2 extends partially in the hetero-epitaxy structure 620, 621 and is laterally spaced apart from the second gate 665, G2 along the first direction X.

In this example, the hole injector structure 626 is laterally spaced apart from and between the first drain 661 (D1) and the first gate 662 (G1) along a first direction X. In addition, the metallization structure in this example electrically couples the hole injector structure 626 to the first gate 662 (G1). In operation, when the first transistor 601 is turned on, the hole injector structure 626 operates to inject holes downward into the GaN layer 618. In another implementation, the conductive structure 625 of the hole injector structure 626 is coupled to a controlled voltage node (not shown) to selectively provide a positive voltage signal to the hole injector structure 626, for example, when the first gate 662 (G1) is powered to turn the first transistor 601 on. The first and second transistors 601 and 602 in this example are enhancement mode transistors, and the first and second gates 662 and 665 (G1 and G2) include respective gate contact structures 634 and 638 that extend on and contact the AlGaN layer 621 of the hetero-epitaxy structure 620, 621. In this example, the conductive structure 625 of the hole injector structure 626 is coupled to the first gate 662 (G1). The metallization structure includes a conductive routing feature 651 that electrically couples the first source 663 (S1) to the second drain 664 (D2). In operation, when the first transistor 601 is turned on and the first drain D1 is at a high voltage relative to the substrate 604 and the first gate 662, G1 is at a voltage above the threshold voltage of the first transistor 601, electrons form in a channel region at and near the top surface of the gallium nitride layer 618, indicated at 670 in FIG. 6. The voltage at the conductive structure 625 of the hole injector structure 626 causes injection of holes from the p-doped gallium nitride structure 624. The injected holes form a hole layer in the buffer at or near the bottom side of the gallium nitride layer 618 proximate the interface 615 of the back barrier layer 616, indicated at 672 in FIG. 6 to mitigate vertical electric field back gating effects for the first transistor 601.

Figure 7:
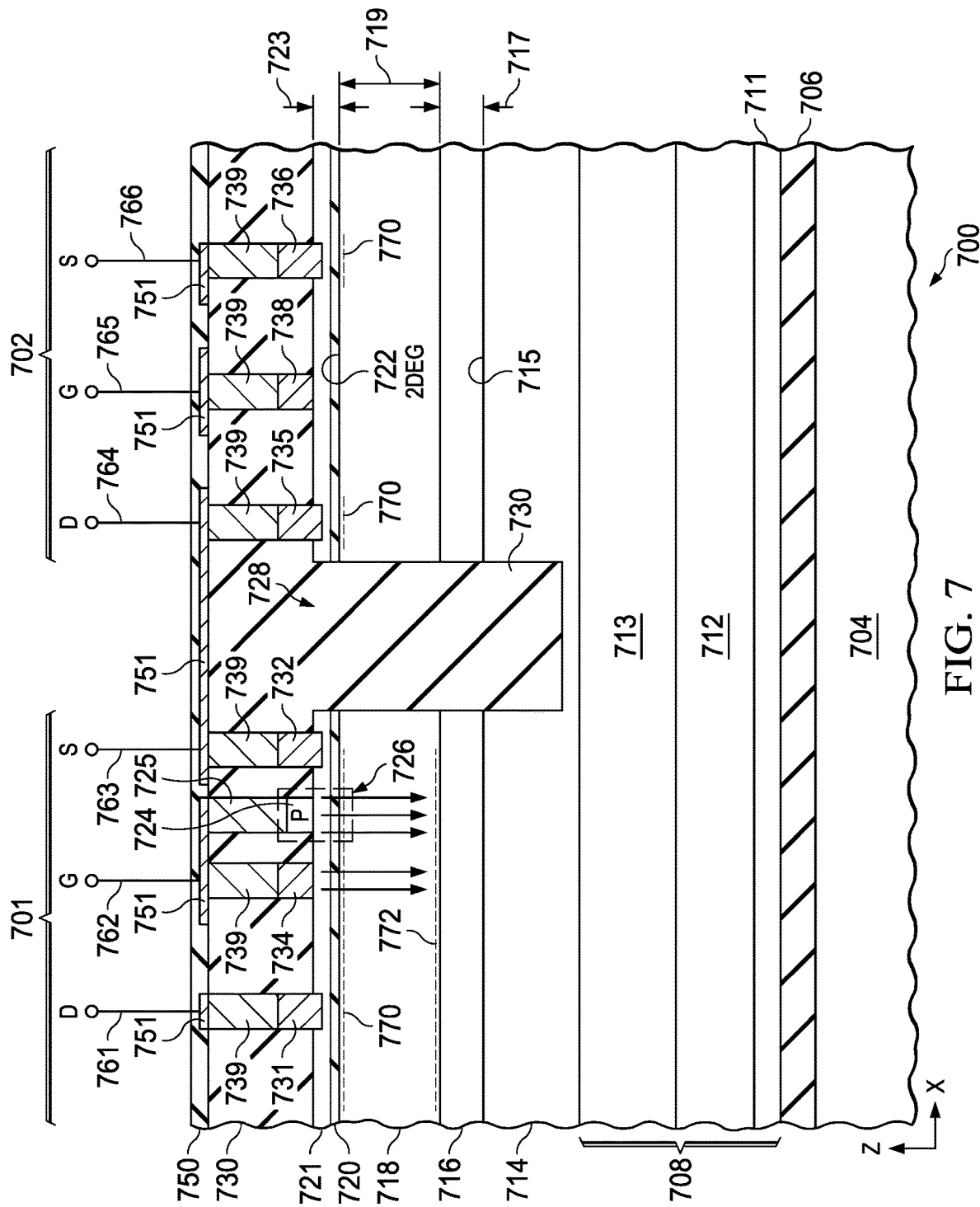
FIG. 7 is a partial sectional side elevation view of an electronic device with first and second depletion mode gallium nitride transistors with an aluminum gallium nitride back barrier layer between a buffer structure and a gallium nitride layer, and a hole injector structure laterally spaced from and between a gate and a source contact of the first transistor and over a hetero-epitaxy structure.

FIG. 7 shows a partial sectional side elevation view of another electronic device 700 with first and second depletion mode gallium nitride transistors 701 and 702 with an aluminum gallium nitride back barrier layer between a buffer structure and a gallium nitride layer, and a hole injector structure laterally spaced from and between a gate and a source contact of the first transistor and over a hetero-epitaxy structure. The electronic device 700 includes a semiconductor substrate 704, such as silicon. The hole injector structure injects holes to form a hole layer proximate an interface of the back barrier and a buffer structure to mitigate vertical electric field back gating effects for the first transistor 701. This structure helps avoid or mitigate back gate effects associated with this high electric field and helps avoid or mitigate reduced RDSON of the first transistor 701 during operation of the electronic device 700.

The electronic device 700 includes an epitaxially grown stack of layers including a buffer stack formed above the semiconductor substrate 704. The individual layers of the stack structure are described herein as aluminum nitride, aluminum gallium nitride, gallium nitride, etc., and the individual layers can be of any suitable stoichiometric composition that is or includes the named constituent materials alone or in the further presence of small amounts of impurities, artifacts, or other materials, such as materials that may remain after individual processing steps associated with the manufacturer of semiconductor products. The example stack includes an aluminum nitride layer 706 over the substrate 704. In one example, the aluminum nitride layer 706 extends directly on and contacts an upper or top side of the substrate 704. In another example, other materials, such as impurities or artifacts or remnant materials from the fabrication processing may be present between the aluminum nitride layer 706 and the substrate 704. In one example, the aluminum nitride layer 706 has a thickness of 300-600 nm.

A multilayer composition graded aluminum gallium nitride buffer stack 708 extends over the aluminum nitride layer 706. The buffer stack 708 in this example includes three layers that are or include aluminum gallium nitride. In other examples, a different number of two or more composition graded aluminum gallium nitride buffer stack layers can be used. In a different example, a different buffer stack arrangement can be used, such as single or dual superlattice buffer structures (not shown). In the example of FIG. 7, the buffer stack 708 includes a first aluminum gallium nitride layer 711 over the aluminum nitride layer 706. In one example, the first aluminum gallium nitride layer 711 extends directly on and contacts an upper or top side of the aluminum nitride layer 706. In another example, other materials, such as impurities or artifacts or remnant materials from the fabrication processing may be present between the first aluminum gallium nitride layer 711 and the aluminum nitride layer 706. The composition graded AlGaN buffer stack 708 also includes a second aluminum gallium nitride layer 712 over the first aluminum gallium nitride layer 711. In one example, the second aluminum gallium nitride layer 712 extends directly on and contacts an upper or top side of the first aluminum gallium nitride layer 711. In another example, other materials, such as impurities or artifacts or remnant materials from the fabrication processing may be present between the second aluminum gallium nitride layer 712 and the first aluminum gallium nitride layer 711. A third aluminum gallium nitride layer 713 extends over the second aluminum gallium nitride layer 712. In one example, the third aluminum gallium nitride layer 713 extends directly on and contacts an upper or top side of the second aluminum gallium nitride layer 712. In another example, other materials, such as impurities or artifacts or remnant materials from the fabrication processing may be present between the third aluminum gallium nitride layer 713 and the second aluminum gallium nitride layer 712.

In one example, the multilayer composition graded aluminum gallium nitride stack 708 includes the first aluminum gallium nitride sublayer 711 having a first aluminum concentration over the aluminum nitride layer 706, the second aluminum gallium nitride sublayer 712 having a second aluminum concentration that is less than the first aluminum concentration over the first aluminum gallium nitride sublayer 711, and the third aluminum gallium nitride sublayer 713 having a third aluminum concentration that is less than the second aluminum concentration over the second aluminum gallium nitride sublayer 712. In one example, the first aluminum concentration is 60-70%, the second aluminum concentration is 40-50%, and the third aluminum concentration is 20-30%. In one example, the first aluminum gallium nitride layer 711 has a thickness of 300-600 nm, the second aluminum gallium nitride layer 712 has a thickness of 1.4-1.8 µm, and the third aluminum gallium nitride layer 711 has a thickness of 1.4-2.0 µm.

The electronic device 700 further includes a gallium nitride layer 714 over the multilayer composition graded aluminum gallium nitride stack 708. In one example, the gallium nitride layer 714 has a thickness of 0.5-2.0 µm. In this or another example, the gallium nitride layer 714 has a thickness of 0.1-1.0 µm. In one implementation, the gallium nitride layer 714 includes carbon. In one example, the gallium nitride layer 714 extends directly on and contacts an upper or top side of the third aluminum gallium nitride layer 713. In another example, other materials, such as impurities or artifacts or remnant materials from the fabrication processing may be present between the gallium nitride layer 714 and the third aluminum gallium nitride layer 713.

The electronic device 700 also includes a back barrier layer 716 over the buffer structure. The back barrier layer 716 in one example is or includes aluminum gallium nitride of any suitable stoichiometry. In one example, the back barrier layer 716 extends directly on and contacts an upper or top side of the gallium nitride layer 714 at an interface 715 between the top side of the gallium nitride layer 714 and the bottom side of the back barrier layer 716. In another example, other materials, such as impurities or artifacts or remnant materials from the fabrication processing may be present between the back barrier layer 716 and the gallium nitride layer 714. The back barrier layer 716 has a thickness 717, for example, from a few tens of nm to a few µm, such as 20 nm to 5 µm. In another example, the back barrier layer 716 is or includes aluminum nitride, indium aluminum nitride, or indium aluminum gallium nitride of any suitable stoichiometry.

An upper gallium nitride layer 718 extends over the back barrier layer 716. The layer 718 is or includes gallium nitride of any suitable stoichiometry. In one example, the gallium nitride layer 718 has a thickness 719 of 0.1-1.0 µm. In one implementation, the gallium nitride layer 718 includes carbon. In one example, the gallium nitride layer 718 extends directly on and contacts an upper or top side of the back barrier layer 716. In another example, other materials, such as impurities or artifacts or remnant materials from the fabrication processing may be present between the gallium nitride layer 718 and the back barrier layer 716.

The electronic device 700 also includes a hetero-epitaxy structure having an aluminum nitride layer 720 over the gallium nitride layer 718, and an aluminum gallium nitride layer 721 over the aluminum nitride layer 720. In one example, the layer 720 is or includes aluminum nitride of any suitable stoichiometry. In one example, the aluminum nitride layer 720 extends directly on and contacts an upper or top side of the gallium nitride layer 718. In another example, other materials, such as impurities or artifacts or remnant materials from the fabrication processing may be present between the aluminum nitride layer 720 and the gallium nitride layer 718. In this or another example, the layer 721 is or includes aluminum gallium nitride of any suitable stoichiometry. In one example, the aluminum gallium nitride layer 721 extends directly on and contacts an upper or top side of the aluminum nitride layer 720. In another example, other materials, such as impurities or artifacts or remnant materials from the fabrication processing may be present between the aluminum gallium nitride layer 721 and the aluminum nitride layer 720. The hetero junction at the interface between the aluminum gallium nitride layer 721 and the aluminum nitride layer 720 forms a two-dimensional electron gas region 722. In one example, the hetero-epitaxy structure, including the layers 720 and 721 has a total thickness 723 of 10-30 nm. The electronic device 700 also includes one or more transistors, including the depletion mode high side first transistor 701, and the depletion mode low side second transistor 702 in the illustrated implementation.

The various buffer layers and layers of the hetero-epitaxy structure are fabricated in one example using epitaxial growth deposition processing, for example, a continuous epitaxial deposition process with variables and materials changed throughout form the constituent layers and/or two or more sequential epitaxial deposition processes, with a total thickness of approximately 5.1 µm in one example. In the depletion mode transistor 701, the hetero-epitaxy structure including the layers 720 and 721 has a total thickness of approximately 10-30 nm, and the hetero-epitaxy structure in the enhancement mode transistor 702 has a total thickness of approximately 10-20 nm. The aluminum nitride layer 720 in one example has a thickness of approximately 10 Å (1 nm), and the aluminum gallium nitride layer 721 has a thickness of approximately 20 nm. In the illustrated example, the gallium nitride layer 718 has a thickness of approximately 0.1-1.0 µm. In one example, the aluminum gallium nitride layer 721 has an aluminum concentration of about 26%.

The electronic device 700 includes a hole injector structure 726 having a doped gallium nitride structure 724 over the aluminum gallium nitride layer 721. The hole injector structure 726 also includes a conductive structure 725 formed as a contact or via that is partially over and contacts the doped gallium nitride structure 724. In one example, the doped gallium nitride structure 724 is or includes gallium nitride of any suitable stoichiometry that is implanted with p-type impurities (p-GaN, including magnesium or other p-type impurities). In one example, the doped gallium nitride structure 724 extends directly on and contacts an upper or top side of the aluminum gallium nitride layer 721. In another example, other materials, such as impurities or artifacts or remnant materials from the fabrication processing may be present between the doped gallium nitride structure 724 and the aluminum gallium nitride layer 721. In one example, the p-doped gallium nitride layer 724 includes magnesium dopants and has a thickness of 50-200 nm, such as about 70 nm in one implementation. The conductive structure 725 is or includes tungsten, copper, aluminum or other conductive metal. The electronic device 700 further includes an isolation structure 728, such as silicon dioxide of any suitable stoichiometry that extends downward between the transistors 701 and 702 through the aluminum gallium nitride layer 721, aluminum nitride layer 720, the gallium nitride layer 718, and the back barrier layer 716, and partially into the gallium nitride layer 714. In this or another example, the isolation between the transistors 701 and 702 is done by implantation (not shown).

The electronic device 700 also includes a metallization structure with a first pre-metal dielectric (e.g., PMD) layer 730, for example, including silicon nitride or silicon dioxide, with various conductive metal structures formed therein, including the conductive structure 725. In one example, the conductive structure 725 extends directly on and contacts at least a portion of an upper or top side of the doped gallium nitride structure 724. In another example, other materials, such as impurities or artifacts or remnant materials from the fabrication processing may be present between the conductive structure 725 and the doped gallium nitride structure 724.

The PMD layer or level also includes a first drain contact or electrode 731 of the first transistor 701, a first source contact or electrode 732 of the first transistor 701, and a first gate contact or electrode 734 of the first transistor 701. The PMD layer or level further includes a second drain contact or electrode 735 of the second transistor 702, a second source contact or electrode 736 of the second transistor 702, a second gate contact or electrode 738 of the second transistor 702, and one or more conductive contacts or vias 739 that extend through the PMD layer 730 and provide electrical interconnection of various transistor terminals for routing in a second metallization structure level. The conductive drain and source contacts 731, 735, 732, 736 of the respective first and second transistors 701 and 702 extend partially in the hetero-epitaxy structure 720, 721, and the conductive gate contacts 734 and 738 of the respective first and second transistors 701 and 702 extend on and contact the hetero-epitaxy structure 720, 721.

The electronic device 700 in FIG. 7 further includes a second metallization structure level with a dielectric layer 750 (e.g., silicon nitride or silicon dioxide) having one or more conductive routing features 751 (e.g., aluminum, copper, etc.), for example, to provide routing of drain, source and gate connections and associated signals to one another and/or to conductive bond pads, or other externally exposed conductive features by which the transistors 701 and 702 can be electrically interconnected with other circuitry, for example, using bond wires or lead frame electrical connections to integrated circuit leads, such as pins or pads in a packaged electronic device.

The first transistor 701 in this example has a first drain terminal or lead 761 (D1), a first gate terminal or lead 762 (G1), and a first source terminal or lead 763 (S1). The second transistor 702 has a second drain terminal or lead 764 (D2), a second gate terminal or lead 765 (G2), and a second source terminal or lead 766 (S2), where the terminals in one example are electrically coupled to conductive leads of the finished electronic device 700 after packaging. In the illustrated example, the first drain 761, D1 extends partially in the hetero-epitaxy structure 720, 721, the first gate 762, G1 extends over the hetero-epitaxy structure 720, 721 and is laterally spaced apart from the first drain 761, D1 along the first direction X. The first source 763, S1 extends partially in the hetero-epitaxy structure 720, 721 and is laterally spaced apart from the first gate 762, G1 along the first direction X. The second drain 764, D2 extends partially in the hetero-epitaxy structure 720, 721 and is coupled to the first source 763, S1 by a conductive routing feature 751 in FIG. 7 to form the switching node SW. The second gate 765, G2 extends over the hetero-epitaxy structure 720, 721 and is laterally spaced apart from the second drain 764, D2 along the first direction X. The second source 766, S2 extends partially in the hetero-epitaxy structure 720, 721 and is laterally spaced apart from the second gate 765 (G2) along the first direction X.

The hole injector structure 726 in this example is laterally spaced apart from and between the first gate 762 (G1) and the first source 763 (S1) along the first direction X. In addition, the metallization structure in this example electrically couples the hole injector structure 726 to the first gate 762 (G1). In operation, when the first transistor 701 is turned on, the hole injector structure 726 operates to inject holes downward into the GaN layer 718. In another implementation, the conductive structure 725 of the hole injector structure 726 is coupled to a controlled voltage node (not shown) to selectively provide a positive voltage signal to the hole injector structure 726, for example, when the first gate 762 (G1) is powered to turn the first transistor 701 on. The first and second transistors 701 and 702 in this example are depletion mode transistors, and the first and second gates 762 and 765 (G1 and G2) include respective gate contact structures 734 and 738 that extend on and contact the AlGaN layer 721 of the hetero-epitaxy structure 720, 721. In this example, the conductive structure 725 of the hole injector structure 726 is coupled to the first gate 762 (G1). The metallization structure includes a conductive routing feature 751 that electrically couples the first source 763 (S1) to the second drain 764 (D2). In operation, when the first transistor 701 is turned on and the first drain D1 is at a high voltage relative to the substrate 704 and the first gate 762, G1 is at a voltage above the threshold voltage of the first transistor 701, electrons form in a channel region at and near the top surface of the gallium nitride layer 718, indicated at 770 in FIG. 7. The voltage at the conductive structure 725 of the hole injector structure 726 causes injection of holes from the p-doped gallium nitride structure 724. The injected holes form a hole layer in the buffer at or near the bottom side of the gallium nitride layer 718 proximate the interface 715 of the back barrier layer 716, indicated at 772 in FIG. 7 to mitigate vertical electric field back gating effects for the first transistor 701.

Figure 8:
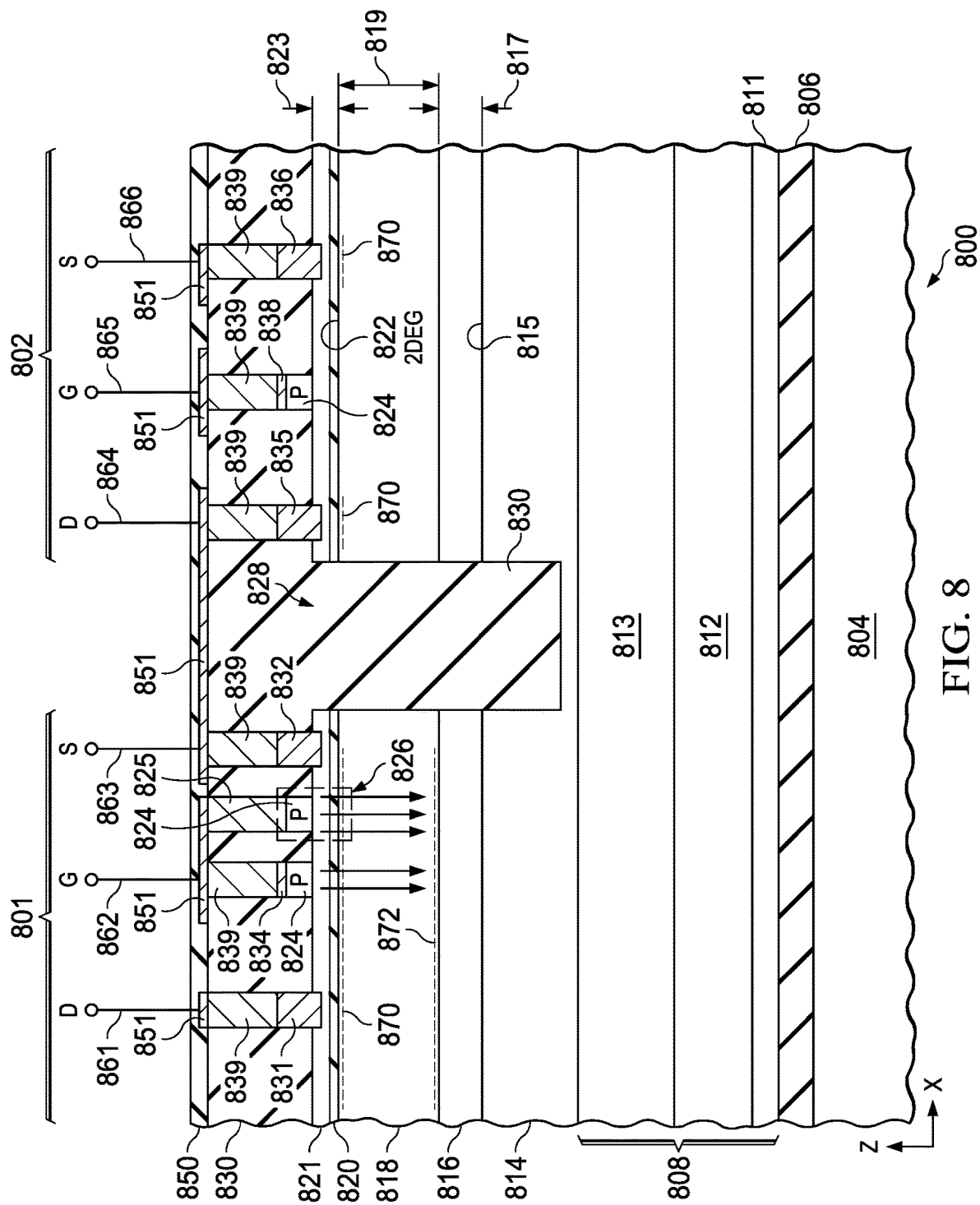
FIG. 8 is a partial sectional side elevation view of an electronic device with first and second enhancement mode gallium nitride transistors with an aluminum gallium nitride back barrier layer between a buffer structure and a gallium nitride layer, and a hole injector structure laterally spaced from and between a gate and a source contact of the first transistor and over a hetero-epitaxy structure.

FIG. 8 shows a partial sectional side elevation view of an electronic device 800 with first and second enhancement mode gallium nitride transistors 801 and 802, along with an aluminum gallium nitride back barrier layer between a buffer structure and a gallium nitride layer, and a hole injector structure laterally spaced from and between a gate and a source contact of the first transistor and over a hetero-epitaxy structure. The electronic device 800 includes an epitaxially grown stack of layers including a buffer stack formed above the semiconductor substrate 804. The individual layers of the stack structure are described herein as aluminum nitride, aluminum gallium nitride, gallium nitride, etc., and the individual layers can be of any suitable stoichiometric composition that is or includes the named constituent materials alone or in the further presence of small amounts of impurities, artifacts, or other materials, such as materials that may remain after individual processing steps associated with the manufacturer of semiconductor products. The example stack includes an aluminum nitride layer 806 over the substrate 804. In one example, the aluminum nitride layer 806 extends directly on and contacts an upper or top side of the substrate 804. In another example, other materials, such as impurities or artifacts or remnant materials from the fabrication processing may be present between the aluminum nitride layer 806 and the substrate 804. In one example, the aluminum nitride layer 806 has a thickness of 300-600 nm.

A multilayer composition graded aluminum gallium nitride buffer stack 808 extends over the aluminum nitride layer 806. The buffer stack 808 in this example includes three layers that are or include aluminum gallium nitride. In other examples, a different number of two or more composition graded aluminum gallium nitride buffer stack layers can be used. In a different example, a different buffer stack arrangement can be used, such as single or dual superlattice buffer structures (not shown). In the example of FIG. 8, the buffer stack 808 includes a first aluminum gallium nitride layer 811 over the aluminum nitride layer 806. In one example, the first aluminum gallium nitride layer 811 extends directly on and contacts an upper or top side of the aluminum nitride layer 806. In another example, other materials, such as impurities or artifacts or remnant materials from the fabrication processing may be present between the first aluminum gallium nitride layer 811 and the aluminum nitride layer 806. The composition graded AlGaN buffer stack 808 also includes a second aluminum gallium nitride layer 812 over the first aluminum gallium nitride layer 811. In one example, the second aluminum gallium nitride layer 812 extends directly on and contacts an upper or top side of the first aluminum gallium nitride layer 811. In another example, other materials, such as impurities or artifacts or remnant materials from the fabrication processing may be present between the second aluminum gallium nitride layer 812 and the first aluminum gallium nitride layer 811. A third aluminum gallium nitride layer 813 extends over the second aluminum gallium nitride layer 812. In one example, the third aluminum gallium nitride layer 813 extends directly on and contacts an upper or top side of the second aluminum gallium nitride layer 812. In another example, other materials, such as impurities or artifacts or remnant materials from the fabrication processing may be present between the third aluminum gallium nitride layer 813 and the second aluminum gallium nitride layer 812.

In one example, the multilayer composition graded aluminum gallium nitride stack 808 includes the first aluminum gallium nitride sublayer 811 having a first aluminum concentration over the aluminum nitride layer 806, the second aluminum gallium nitride sublayer 812 having a second aluminum concentration that is less than the first aluminum concentration over the first aluminum gallium nitride sublayer 811, and the third aluminum gallium nitride sublayer 813 having a third aluminum concentration that is less than the second aluminum concentration over the second aluminum gallium nitride sublayer 812. In one example, the first aluminum concentration is 60-70%, the second aluminum concentration is 40-50%, and the third aluminum concentration is 20-30%. In one example, the first aluminum gallium nitride layer 811 has a thickness of 300-600 nm, the second aluminum gallium nitride layer 812 has a thickness of 1.4-1.8 µm, and the third aluminum gallium nitride layer 811 has a thickness of 1.4-2.0 µm.

The electronic device 800 further includes a gallium nitride layer 814 over the multilayer composition graded aluminum gallium nitride stack 808. In one example, the gallium nitride layer 814 has a thickness of 0.5-2.0 µm. In this or another example, the gallium nitride layer 814 has a thickness of 0.1-1.0 µm. In one implementation, the gallium nitride layer 814 includes carbon. In one example, the gallium nitride layer 814 extends directly on and contacts an upper or top side of the third aluminum gallium nitride layer 813. In another example, other materials, such as impurities or artifacts or remnant materials from the fabrication processing may be present between the gallium nitride layer 814 and the third aluminum gallium nitride layer 813.

The electronic device 800 also includes a back barrier layer 816 over the buffer structure. The back barrier layer 816 in one example is or includes aluminum gallium nitride of any suitable stoichiometry. In one example, the back barrier layer 816 extends directly on and contacts an upper or top side of the gallium nitride layer 814 at an interface 815 between the top side of the gallium nitride layer 814 and the bottom side of the back barrier layer 816. In another example, other materials, such as impurities or artifacts or remnant materials from the fabrication processing may be present between the back barrier layer 816 and the gallium nitride layer 814. The back barrier layer 816 has a thickness 817, for example, from a few tens of nm to a few µm, such as 20 nm to 5 µm. In another example, the back barrier layer 816 is or includes aluminum nitride, indium aluminum nitride, or indium aluminum gallium nitride of any suitable stoichiometry.

An upper gallium nitride layer 818 extends over the back barrier layer 816. The layer 818 is or includes gallium nitride of any suitable stoichiometry. In one example, the gallium nitride layer 818 has a thickness 819 of 0.1-1.0 µm. In one implementation, the gallium nitride layer 818 includes carbon. In one example, the gallium nitride layer 818 extends directly on and contacts an upper or top side of the back barrier layer 816. In another example, other materials, such as impurities or artifacts or remnant materials from the fabrication processing may be present between the gallium nitride layer 818 and the back barrier layer 816.

The electronic device 800 also includes a hetero-epitaxy structure having an aluminum nitride layer 820 over the gallium nitride layer 818, and an aluminum gallium nitride layer 821 over the aluminum nitride layer 820. In one example, the layer 820 is or includes aluminum nitride of any suitable stoichiometry. In one example, the aluminum nitride layer 820 extends directly on and contacts an upper or top side of the gallium nitride layer 818. In another example, other materials, such as impurities or artifacts or remnant materials from the fabrication processing may be present between the aluminum nitride layer 820 and the gallium nitride layer 818. In this or another example, the layer 821 is or includes aluminum gallium nitride of any suitable stoichiometry. In one example, the aluminum gallium nitride layer 821 extends directly on and contacts an upper or top side of the aluminum nitride layer 820. In another example, other materials, such as impurities or artifacts or remnant materials from the fabrication processing may be present between the aluminum gallium nitride layer 821 and the aluminum nitride layer 820. The hetero junction at the interface between the aluminum gallium nitride layer 821 and the aluminum nitride layer 820 forms a two-dimensional electron gas region 822. In one example, the hetero-epitaxy structure, including the layers 820 and 821 has a total thickness 823 of 10-30 nm. The electronic device 800 also includes one or more transistors, including the depletion mode high side first transistor 801, and the depletion mode low side second transistor 802 in the illustrated implementation.

The various buffer layers and layers of the hetero-epitaxy structure are fabricated in one example using epitaxial growth deposition processing, for example, a continuous epitaxial deposition process with variables and materials changed throughout form the constituent layers and/or two or more sequential epitaxial deposition processes, with a total thickness of approximately 5.1 µm in one example. In the depletion mode transistor 801, the hetero-epitaxy structure including the layers 820 and 821 has a total thickness of approximately 10-30 nm, and the hetero-epitaxy structure in the enhancement mode transistor 802 has a total thickness of approximately 10-20 nm. The aluminum nitride layer 820 in one example has a thickness of approximately 10 Å (1 nm), and the aluminum gallium nitride layer 821 has a thickness of approximately 20 nm. In the illustrated example, the gallium nitride layer 818 has a thickness of approximately 0.1-1.0 µm. In one example, the aluminum gallium nitride layer 821 has an aluminum concentration of about 26%.

The electronic device 800 includes a hole injector structure 826 having a doped gallium nitride structure 824 over the aluminum gallium nitride layer 821. The hole injector structure 826 also includes a conductive structure 825 formed as a contact or via that is partially over and contacts the doped gallium nitride structure 824. In one example, the doped gallium nitride structure 824 is or includes gallium nitride of any suitable stoichiometry that is implanted with p-type impurities (p-GaN, including magnesium or other p-type impurities). In one example, the doped gallium nitride structure 824 extends directly on and contacts an upper or top side of the aluminum gallium nitride layer 821. In another example, other materials, such as impurities or artifacts or remnant materials from the fabrication processing may be present between the doped gallium nitride structure 824 and the aluminum gallium nitride layer 821. In one example, the p-doped gallium nitride layer 824 includes magnesium dopants and has a thickness of 50-200 nm, such as about 70 nm in one implementation. The conductive structure 825 is or includes tungsten, copper, aluminum or other conductive metal. The electronic device 800 further includes an isolation structure 828, such as silicon dioxide of any suitable stoichiometry that extends downward between the transistors 801 and 802 through the aluminum gallium nitride layer 821, aluminum nitride layer 820, the gallium nitride layer 818, and the back barrier layer 816, and partially into the gallium nitride layer 814. In this or another example, the isolation between the transistors 801 and 802 is done by implantation (not shown).

The electronic device 800 also includes a metallization structure with a first pre-metal dielectric (e.g., PMD) layer 830, for example, including silicon nitride or silicon dioxide, with various conductive metal structures formed therein, including the conductive structure 825. In one example, the conductive structure 825 extends directly on and contacts at least a portion of an upper or top side of the doped gallium nitride structure 824. In another example, other materials, such as impurities or artifacts or remnant materials from the fabrication processing may be present between the conductive structure 825 and the doped gallium nitride structure 824.

The PMD layer or level also includes a first drain contact or electrode 831 of the first transistor 801, a first source contact or electrode 832 of the first transistor 801, and a first gate contact or electrode 834 of the first transistor 801. The PMD layer or level further includes a second drain contact or electrode 835 of the second transistor 802, a second source contact or electrode 836 of the second transistor 802, a second gate contact or electrode 838 of the second transistor 802, and one or more conductive contacts or vias 839 that extend through the PMD layer 830 and provide electrical interconnection of various transistor terminals for routing in a second metallization structure level. The conductive drain and source contacts 831, 835, 832, 836 of the respective first and second transistors 801 and 802 extend partially in the hetero-epitaxy structure 820, 821, and the conductive gate contacts 834 and 838 of the respective first and second transistors 801 and 802 extend on and contact the hetero-epitaxy structure 820, 821.

The electronic device 800 in FIG. 8 further includes a second metallization structure level with a dielectric layer 850 (e.g., silicon nitride or silicon dioxide) having one or more conductive routing features 851 (e.g., aluminum, copper, etc.), for example, to provide routing of drain, source and gate connections and associated signals to one another and/or to conductive bond pads, or other externally exposed conductive features by which the transistors 801 and 802 can be electrically interconnected with other circuitry, for example, using bond wires or lead frame electrical connections to integrated circuit leads, such as pins or pads in a packaged electronic device.

The first transistor 801 in this example has a first drain terminal or lead 861 (D1), a first gate terminal or lead 862 (G1), and a first source terminal or lead 863 (S1). The second transistor 802 has a second drain terminal or lead 864 (D2), a second gate terminal or lead 865 (G2), and a second source terminal or lead 866 (S2), where the terminals in one example are electrically coupled to conductive leads of the finished electronic device 800 after packaging. In the electronic device 800 of FIG. 8, the first and second transistors 801 and 802 are enhancement mode transistors, and the first and second gates 862 and 865 (G1 and G2) include respective gate contact structures 834 and 838 that extend on and contact a respective p-doped GaN structure 824 above the AlGaN layer 821 of the hetero-epitaxy structure 820, 821.

In the illustrated example, the first drain 861, D1 extends partially in the hetero-epitaxy structure 820, 821, the first gate 862, G1 extends over and contacts the respective p-doped GaN structure 824 over the hetero-epitaxy structure 820, 821 and is laterally spaced apart from the first drain 861, D1 along a first direction (e.g., the "X" direction in the figures). The first source 863, S1 extends partially in the hetero-epitaxy structure 820, 821 and is laterally spaced apart from the first gate 862, G1 along the first direction X. The second drain 864, D2 extends partially in the hetero-epitaxy structure 820, 821 and is coupled to the first source 863, S1 by a conductive routing feature 851 in FIG. 8 to form the switching node SW. The second gate 865, G2 extends over and contacts the respective p-doped GaN structure 824 over the hetero-epitaxy structure 820, 821 and is laterally spaced apart from the second drain 864, D2 along the first direction X. The second source 866, S2 extends partially in the hetero-epitaxy structure 820, 821 and is laterally spaced apart from the second gate 865, G2 along the first direction X.

The hole injector structure 826 in this example is laterally spaced apart from and between the first gate 862 (G1) and the first source 863 (S1) along the first direction X. In addition, the metallization structure in this example electrically couples the hole injector structure 826 to the first gate 862 (G1). In operation, when the first transistor 801 is turned on, the hole injector structure 826 operates to inject holes downward into the GaN layer 818. In another implementation, the conductive structure 825 of the hole injector structure 826 is coupled to a controlled voltage node (not shown) to selectively provide a positive voltage signal to the hole injector structure 826, for example, when the first gate 862 (G1) is powered to turn the first transistor 801 on. The first and second transistors 801 and 802 in this example are depletion mode transistors, and the first and second gates 862 and 865 (G1 and G2) include respective gate contact structures 834 and 838 that extend on and contact the AlGaN layer 821 of the hetero-epitaxy structure 820, 821. In this example, the conductive structure 825 of the hole injector structure 826 is coupled to the first gate 862 (G1). The metallization structure includes a conductive routing feature 851 that electrically couples the first source 863 (S1) to the second drain 864 (D2). In operation, when the first transistor 801 is turned on and the first drain D1 is at a high voltage relative to the substrate 804 and the first gate 862, G1 is at a voltage above the threshold voltage of the first transistor 801, electrons form in a channel region at and near the top surface of the gallium nitride layer 818, indicated at 870 in FIG. 8. The voltage at the conductive structure 825 of the hole injector structure 826 causes injection of holes from the p-doped gallium nitride structure 824. The injected holes form a hole layer in the buffer at or near the bottom side of the gallium nitride layer 818 proximate the interface 815 of the back barrier layer 816, indicated at 872 in FIG. 8 to mitigate vertical electric field back gating effects for the first transistor 801.

Referring now to FIGS. 9-21, FIG. 9 shows an example method 900 of making an electronic device according to a further aspect, FIGS. 10-20 show partial side views of the electronic device 100 of FIG. 1 undergoing fabrication processing according to the method of 900, and FIG. 21 shows a perspective view of the finished packaged electronic device 100. The method 900 begins with a starting substrate, such as a silicon wafer, an SOI wafer, etc. Similar processing can be used to fabricate one or more of the electronic device examples 200, 300, 400, 500, 600, 700, and 800 described above.

An epitaxial deposition process is, or multiple epitaxial deposition processes are performed at 901, including forming the AlN layer 106, the buffer structure 108 and layers 114, 116, and 118 in FIG. 1. An aluminum nitride layer is formed over the substrate at 902. FIG. 10 shows one example, in which the aluminum nitride layer 106 in the above electronic device 100 is deposited over an upper surface of the silicon substrate 104 using an epitaxial deposition process 1000. In one example, the process 1000 includes depositing aluminum nitride at a temperature of 1000-1150° C. to a thickness of 300-600 nm.

The method 900 continues with buffer formation at 903, including forming the multilayer composition graded aluminum gallium nitride stack 108 over the aluminum nitride layer 106. The composition graded aluminum gallium nitride stack formation at 903 in one example includes performing a first epitaxial deposition process at 904 that forms a first aluminum gallium nitride sublayer over the aluminum nitride layer 106. FIG. 11 shows one example, in which an epitaxial deposition process 1100 is performed that deposits the first aluminum gallium nitride sublayer 111 over the aluminum nitride layer 106. In one example, the process 1100 deposits the first aluminum gallium nitride sublayer 111 with an aluminum content of 60-70% to a thickness of 300-600 nm at a process temperature of 900-1100° C. In one implementation, moreover, the process 1100 uses ethane, hexane or other extrinsic carbon source gas to form the first aluminum gallium nitride sublayer 111 with a carbon concentration of 1E17-1E18 atoms/cm³.

The method 900 continues at 906 with performing a second epitaxial deposition process that forms the second aluminum gallium nitride sublayer 112 over the first aluminum gallium nitride sublayer 111. FIG. 12 shows one example, in which a second epitaxial deposition process 1200 is performed that deposits the second aluminum gallium nitride sublayer 112 with an aluminum content of 40-50% to a thickness of 1.4-1.8 μm using a process temperature of 900-1100° C. In one implementation, the process 1200 uses ethane, hexane or other extrinsic carbon source gas to form the second aluminum gallium nitride sublayer 112 with a carbon concentration of 1E17-1E19 atoms/cm³.

The method 900 continues at 908 with performing a third epitaxial deposition process that forms the third aluminum gallium nitride sublayer 113 over the second aluminum gallium nitride sublayer 112. FIG. 13 shows one example, in which a third epitaxial deposition process 1300 is performed that deposits the third aluminum gallium nitride sublayer 113 with an aluminum content of 20-30% to a thickness of 1.4-2.0 μm using a process temperature of 1000-1100° C. In one implementation, moreover, the process 1300 uses ethane, hexane or other extrinsic carbon source gas to form the third aluminum gallium nitride sublayer 113 with a carbon concentration of 1E17-1E19 atom s/cm³.

Figure 14:
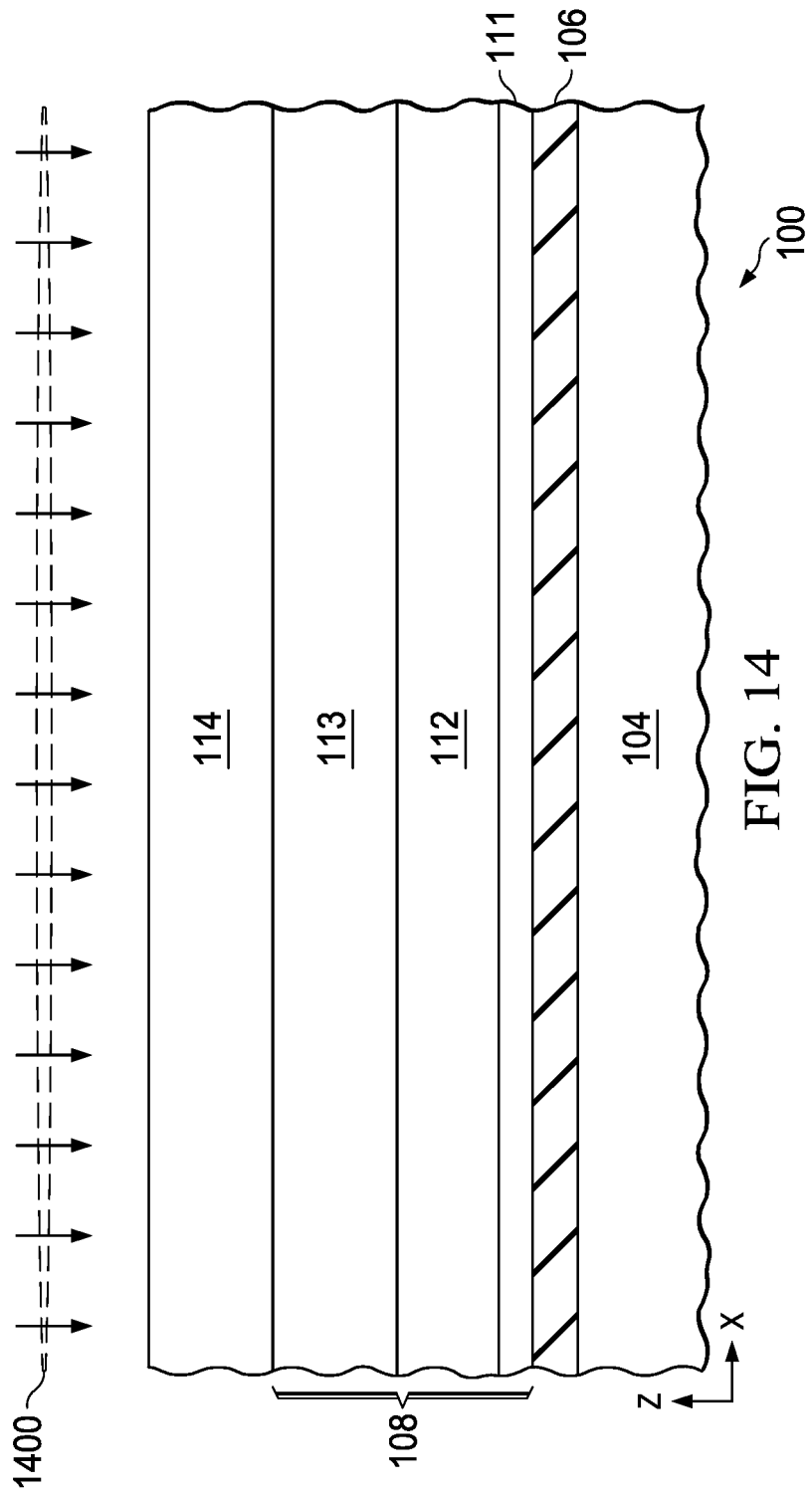

The method 900 continues at 910 with performing an epitaxial deposition process that deposits a gallium nitride layer using an extrinsic carbon source gas. FIG. 14 shows one example, in which an epitaxial deposition process 1400 is performed that deposits the gallium nitride layer 114 over the top side of the third gallium nitride sublayer 113 of the multilayer composition graded aluminum gallium nitride stack 108. In one example, the process 1400 deposits the carbon doped gallium nitride layer 114 to a thickness of 0.5-1.0 μm at a process temperature of 900-1050° C. using hexane or other extrinsic carbon gas to provide the gallium nitride layer 114 with a carbon concentration of 1E18-1E20 atoms/cm³.

Figure 15:
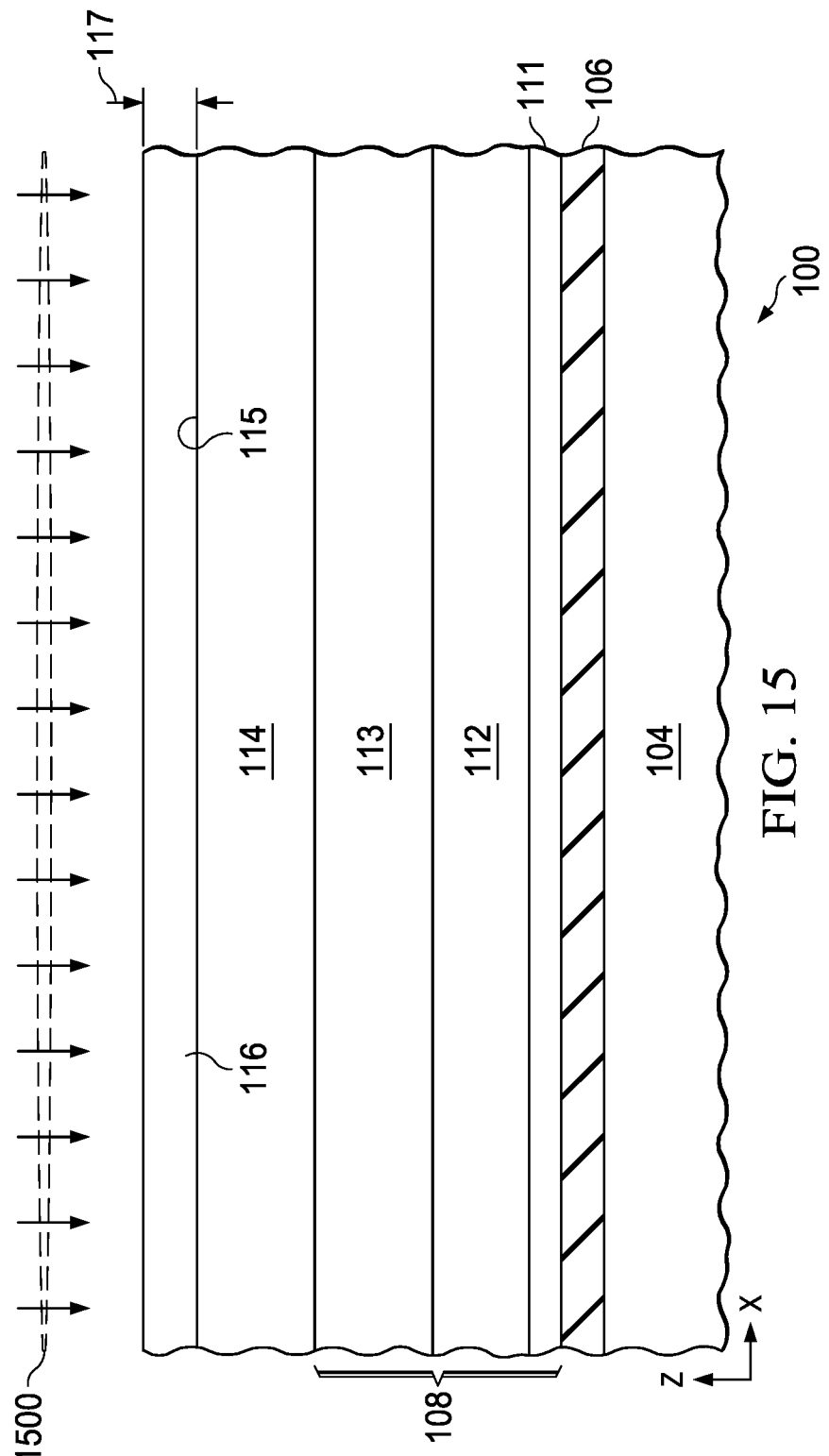

At 911, the method 900 continues with forming an aluminum gallium nitride back barrier layer 116 on the buffer structure 106, 108, 114. In another example, the processing at 911 forms an aluminum gallium nitride, aluminum nitride, indium aluminum nitride, or indium aluminum gallium nitride back barrier layer 1169 on the buffer structure. FIG. 15 shows one example, in which an epitaxial deposition process 1500 is performed that deposits the aluminum gallium nitride back barrier layer 116 on the top side of the gallium nitride layer 114 to a thickness 117 of from a few tens of nm to a few μm, such as 20 nm to 5 μm.

Figure 9:
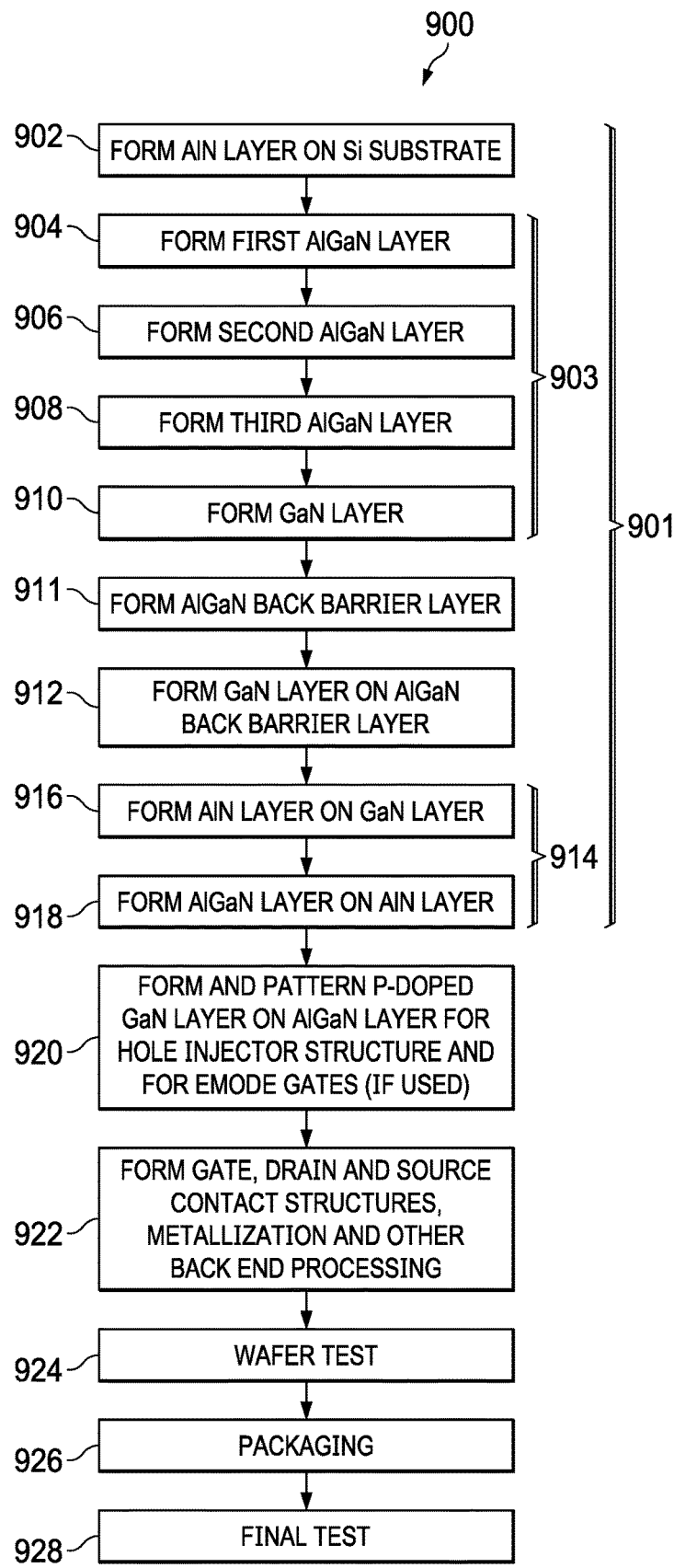
FIG. 9 is a flow diagram of a method for making an electronic device.
Figure 16:
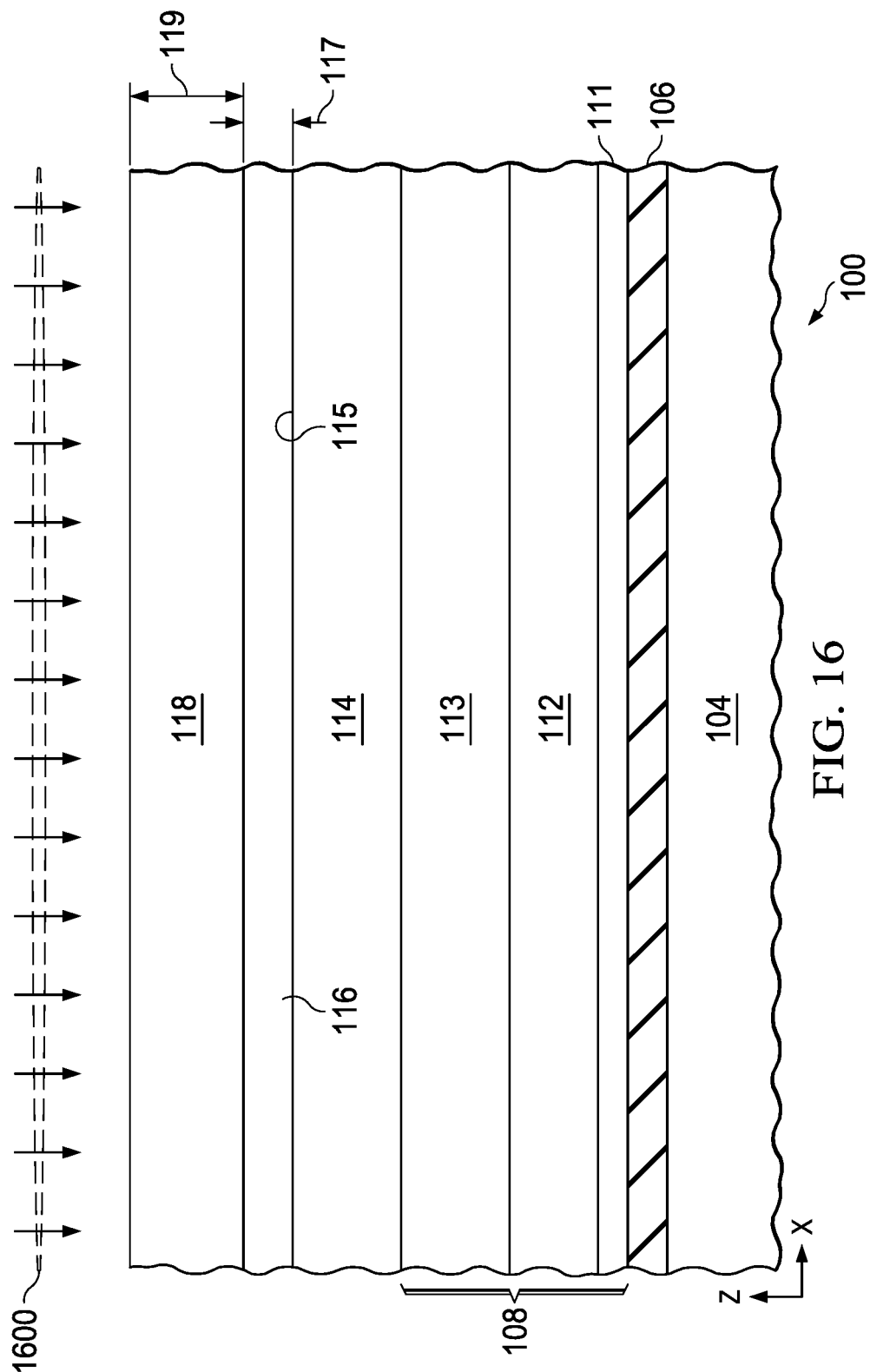

The method 900 continues at 912 in FIG. 9 with forming the gallium nitride layer 118 over (e.g., directly on) the top side of the back barrier layer 116. FIG. 16 shows one example, in which an epitaxial deposition process 1600 is performed that deposits the gallium nitride layer 118 on the back barrier layer 116 to a thickness 119 of 0.1-1.0 μm at a process temperature of 950-1050° C., with intrinsic carbon doping to a concentration of 1E15-1E17 atoms/cm³.

Figure 17:
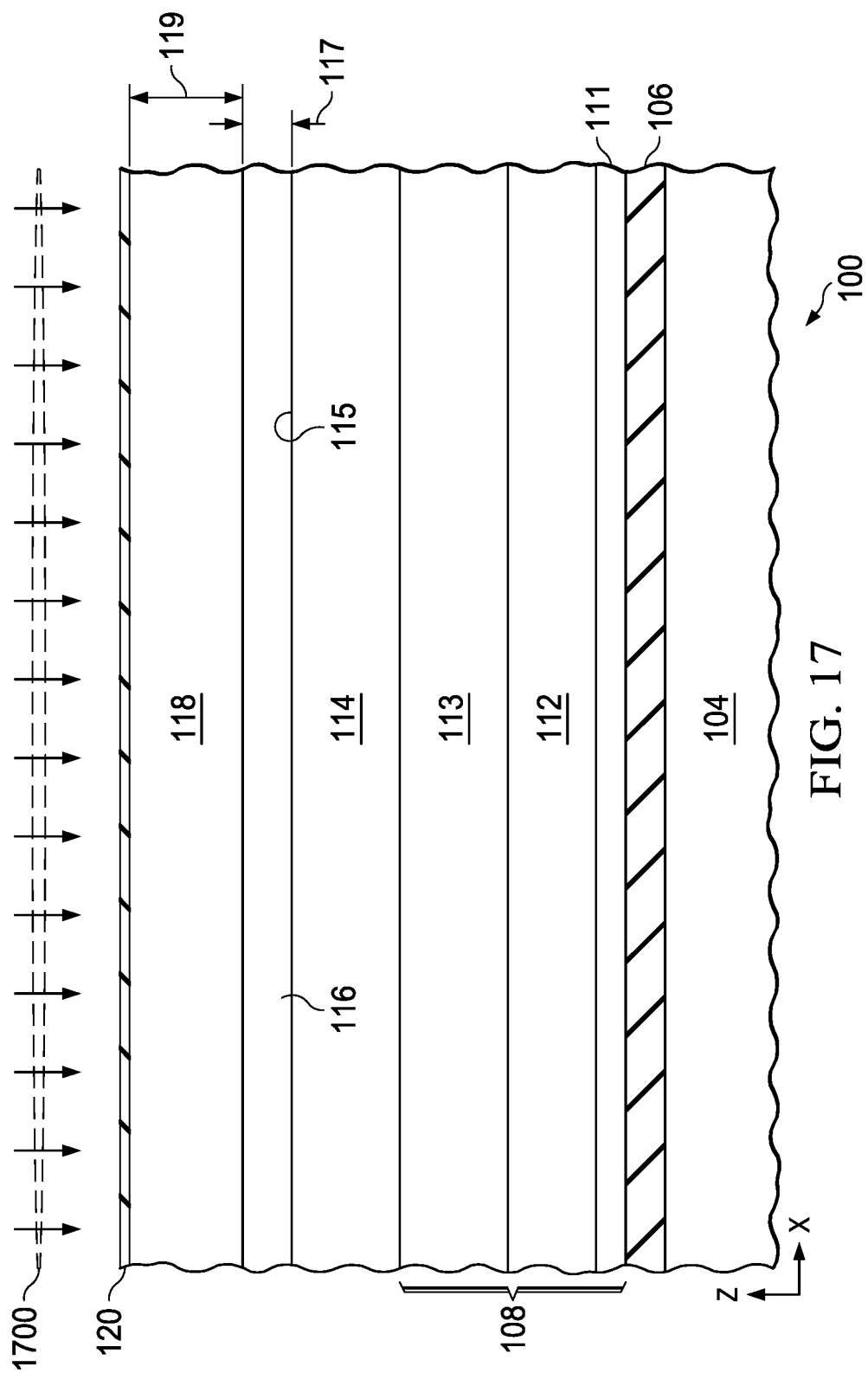
Figure 18:
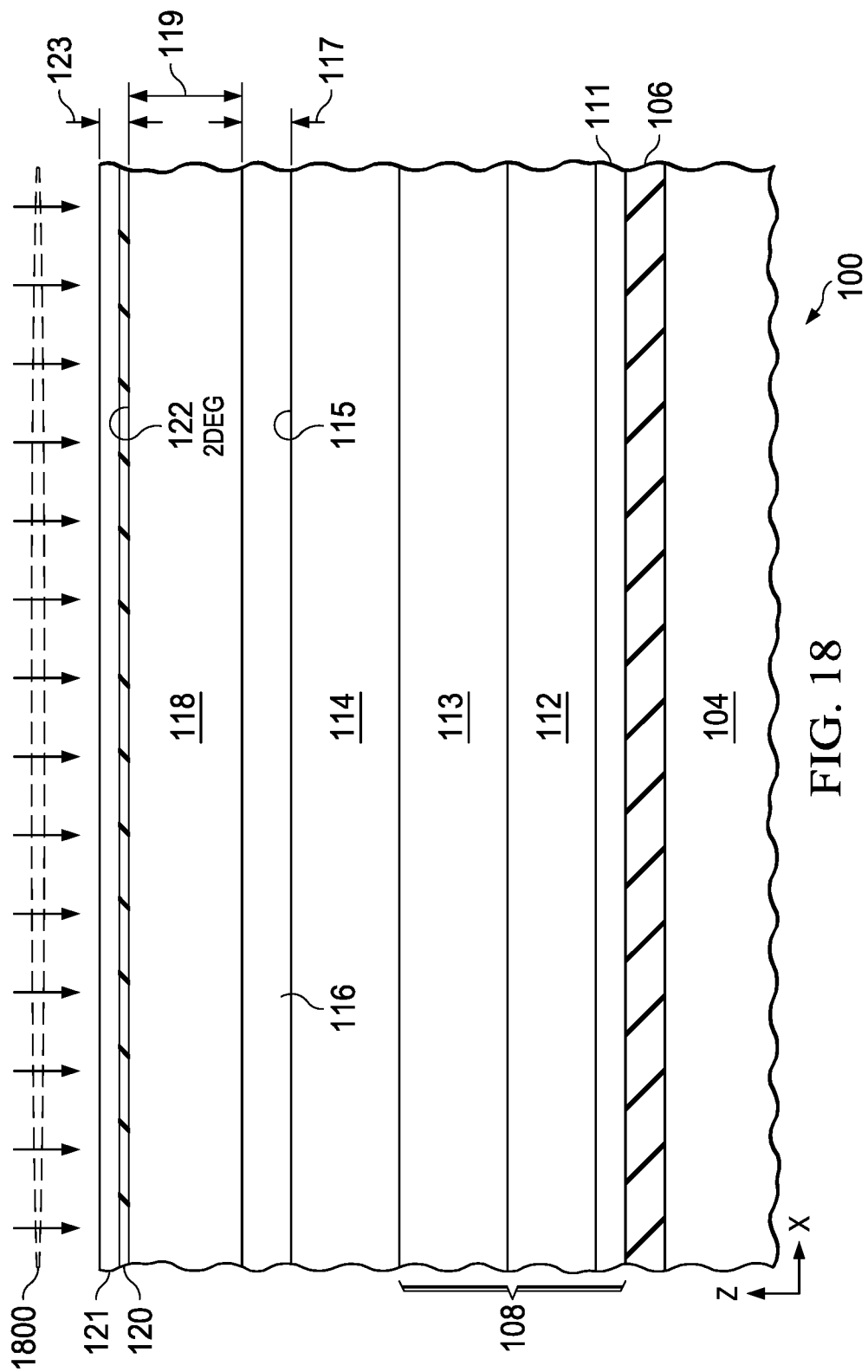

The method 900 continues at 914 with formation of the hetero-epitaxy structure 120, 121 on the gallium nitride layer 118. One example includes forming the aluminum nitride layer 120 at 916 over the top side of the gallium nitride layer 118 using a process 1700 as shown in FIG. 17. In one example, the process 1700 deposits the aluminum nitride layer 120 to a thickness of about 10 Å (1 nm) at a process temperature of 900-1100° C. At 918, the aluminum gallium nitride layer 121 is formed over the aluminum nitride layer 120 using an epitaxial deposition process 1800 shown in FIG. 18. In one example, the process 1800 forms the aluminum gallium nitride layer 121 to a thickness of 10-30 nm at a process temperature of 900-1100° C. The hetero-epitaxy structure 120, 121 in one example has a thickness 123 of 10-30 nm.

Figure 19:
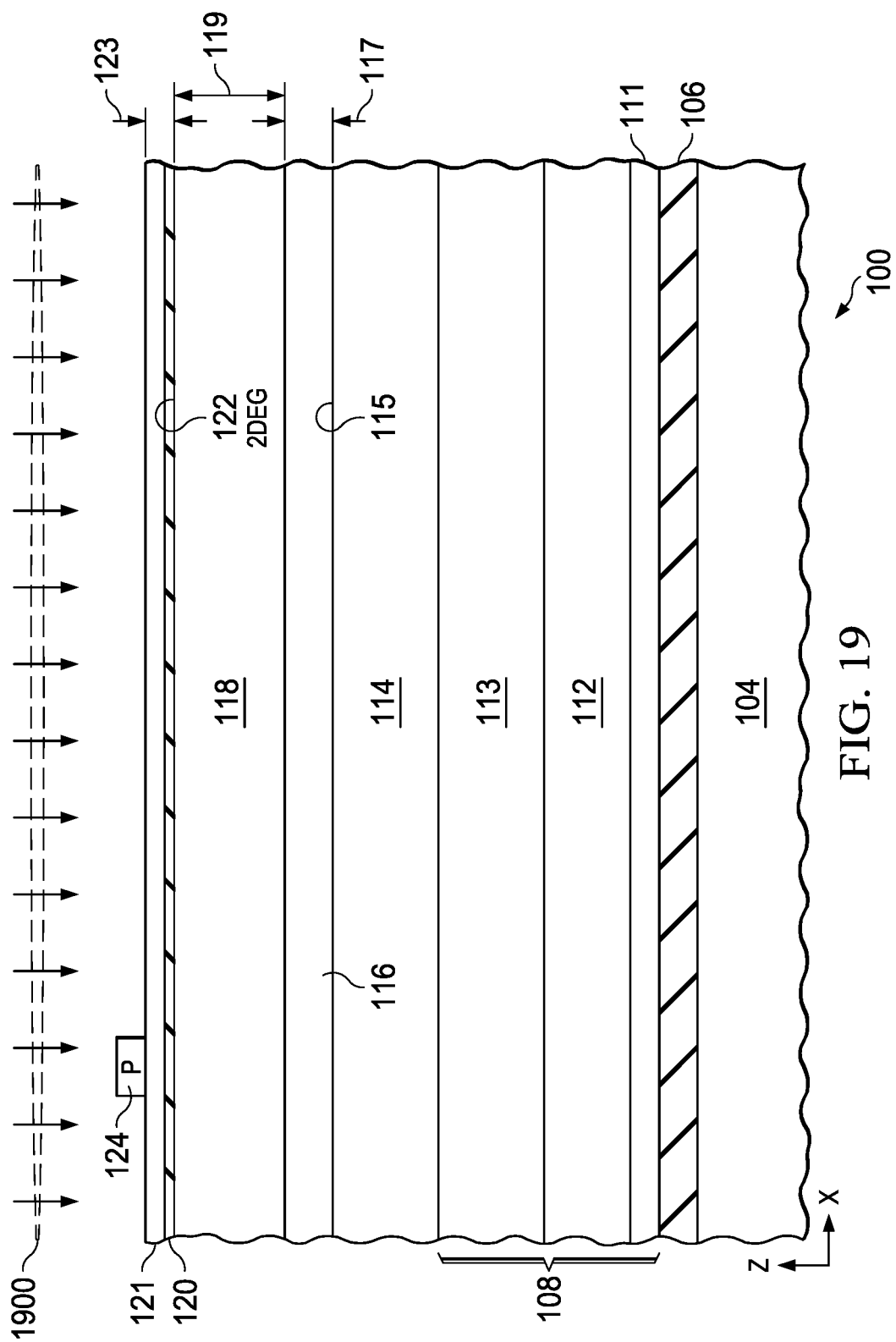

The method 900 in FIG. 9 further includes forming and patterning a p-doped gallium nitride layer 124 at 920 over the aluminum gallium nitride layer 121 of the hetero-epitaxy structure 120, 121 for the hole injector structure 126 and optionally a separate p-doped gallium nitride patterned structure for one or more gates of any included enhancement mode transistors (e.g., FIGS. 2, 4, 6 and 8 above). FIG. 19 shows one example, in which a process 1900 is performed that forms the P-doped gallium nitride layer 124 over a portion of the aluminum gallium nitride layer 121 for the gate of the enhancement mode transistor 102. The process 1900 can include deposition of a P-doped gallium nitride layer across the top of the wafer, followed by forming and patterning an etch mask that covers the prospective P-doped gallium nitride structure or structures 124 for the hole injection structure 126 and any desired enhancement mode transistor gate region(s) of the wafer, and etching the exposed gallium nitride material to leave the patterned P-doped gallium nitride structure 124 as shown in FIG. 35.

Figure 20:
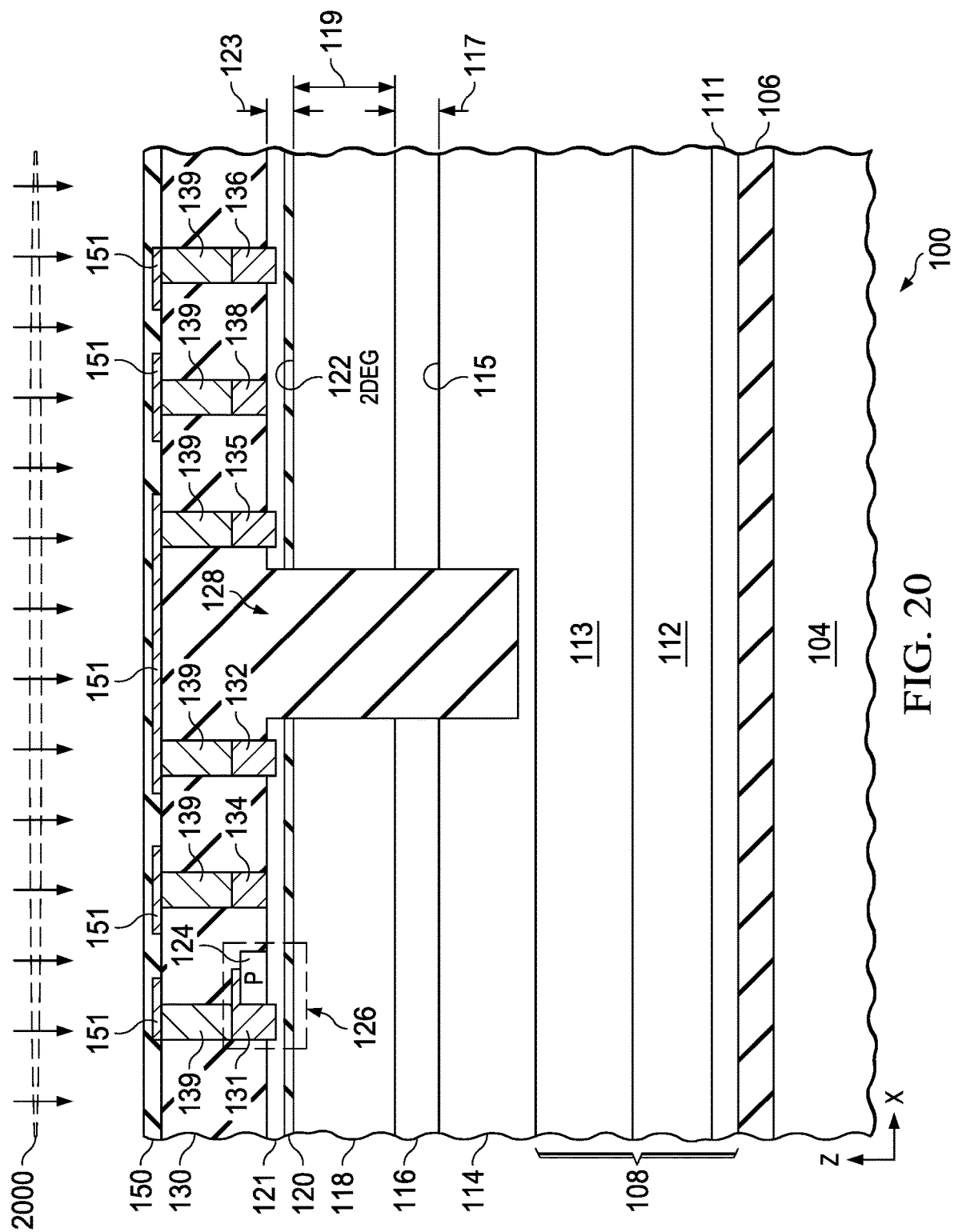

The method 900 further also includes forming the gate, drain and source and other conductive structures (e.g., 125, 131, 132, 134, 135, 136 and 138 in FIG. 1 above, as well as metallization and other backend processing at 922. FIG. 20 shows one example with metallization process 2000 that forms the metallization structure described above in connection with FIG. 1. Forming the conductive structures at 922 in one example includes forming 924 the metallization structure that electrically couples the conductive structure 125 of the hole injector structure 126 to the conductive gate contact 134 of the first transistor 101. In this or another example, the processing at 922 includes forming the metallization structure that electrically couples the conductive source contact 132 of the first transistor 101 to the conductive drain contact 135 of the second transistor 102. In these or another example, the processing at 922 includes forming the conductive structure 125 of the hole injector structure 126 connected to a conductive drain contact 131 of the first transistor 101. The process 900 further includes packaging at 928, for example, including singulating or separating individual die portions of a processed wafer, and packaging the individual dies using any suitable packaging structure, such as lead frames, molded structures, system on module packaging, chip on die packaging, substrates with conductive features, or combinations thereof to provide a finished electronic device, such as an integrated circuit that includes the transistors 101 and/or 102, alone or along with other circuits (not shown). The method 900 also includes final device testing at 930. FIG. 21 shows a perspective view of the finished packaged electronic device 100 having a molded package structure 2100 that encloses the semiconductor die and portions of the conductive leads 161-166 for electrical connection to the terminals of the example first and second transistors 101 and 102.

Described examples provide a solution for monolithic integration of high and low side FETs to facilitate the advantages of GaN FETs by increasing switching frequency with minimum parasitic inductance as well as reducing overall area, while addressing back gating effects and mitigating RDSON, particularly for the high side switch in high voltage applications. The hole injector structures and back buffer layer provide hole injection (e.g., using structures to provide a p-GaN gate or a p-GaN diode) to form a hole layer in the buffer, which screens vertical E-field effects (no back gating effect). The described structures and techniques facilitate monolithic integration of high and low side GaN FETs without substrate isolation, in which hole injection and AlGaN or other back barrier allow formation of a hole layer in the buffer, which screens back gating effects. The isolation structure (e.g., 128 in FIG. 1 above) isolates the hole layer between the high and low side FETs. In one implementation with hole injection in an AlGaN back barrier buffer epi layer, the substrate bias effect is largely or completely screened and channel conductivity (e.g., high side RDSON) is not affected to the vertical E-field up to −500V. The solution provides a cost-effective monolithic approach that avoids the increased process complexity and manufacturing cost increase associated with substrate isolation with silicon in insulator (SOI) wafers and deep trench isolation (DTI). In addition, the described examples avoid junction temperature effects of the SOI/DTI approach caused by low thermal conductivity in buried oxide. In this respect, the described examples do not require any special substrate or deep trench isolation, and back-gating effects can be controlled or eliminated with no penalty in thermal performance.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. An integrated circuit, comprising:
   a buffer structure over a substrate;
   a first III-N layer over the buffer structure including aluminum;
   a gallium nitride layer over the first III-N layer;
   a second III-N layer over the gallium nitride layer including aluminum;
   a transistor having a drain contact, a gate contact and a source contact spaced apart along the second III-N layer; and
   a gallium nitride structure over the second III-N layer, and a terminal connected to the gallium nitride structure,
   wherein the terminal is configured to provide a potential to the gallium nitride structure that causes a hole layer to form at an interface between the first III-N layer and the gallium nitride layer.

2. The integrated circuit of claim 1, wherein the transistor is a first transistor, the drain contact is a first drain contact, the gate contact is a first gate contact and the source contact is a first source contact, and further comprising:
   a second transistor having a second drain contact, a second gate contact and a second source contact spaced apart along the second III-N layer; and
   an isolation structure extending through the first III-N layer between the first and second transistors.

3. The integrated circuit of claim 2, further comprising a conductive connection from the first source contact to the second drain contact.

4. The integrated circuit of claim 1, wherein the transistor is a depletion mode transistor and the gate contact is in direct contact with the second III-N layer.

5. The integrated circuit of claim 1, wherein the transistor is an enhancement mode transistor and a doped gallium nitride layer is between the gate contact and the second III-N layer.

6. The integrated circuit of claim 1, wherein the terminal is electrically connected to the drain contact.

7. The integrated circuit of claim 1, wherein the gallium nitride structure contacts the drain contact.

8. The integrated circuit of claim 1, wherein the drain contact is spaced apart from and between the gallium nitride structure and the gate contact.

9. The integrated circuit of claim 8, wherein the gallium nitride structure is electrically connected to the gate contact.

10. The integrated circuit of claim 1, wherein the gallium nitride structure is spaced apart from and between the drain contact and the gate contact.

11. The integrated circuit of claim 10, wherein the gallium nitride structure is electrically connected to the gate contact.

12. The integrated circuit of claim 1, wherein the gallium nitride structure is spaced apart from and between the gate contact and the source contact.

13. The integrated circuit of claim 12, wherein the gallium nitride structure is electrically connected to the gate contact.

14. The integrated circuit of claim 1, wherein the gallium nitride structure is electrically connected to the gate contact.

15. An electronic device, comprising:
- a semiconductor die in a device package, the semiconductor die having a switching circuit formed thereover, the switching circuit including a heterojunction first transistor including:
  - a first semiconductor layer including one of aluminum gallium nitride, aluminum nitride, indium aluminum nitride, and indium aluminum gallium nitride;
  - a second semiconductor layer including gallium nitride on the first semiconductor layer; and
  - a third semiconductor layer including aluminum and nitrogen layer on the second semiconductor layer;
  - a first source terminal, a first drain terminal and a first gate terminal on the third semiconductor layer; and
  - a gallium nitride layer on the third semiconductor layer; and
- a second transistor having a second drain terminal, a second gate terminal and a second source terminal spaced apart along the third semiconductor layer; and
- a conductive connection between the first source terminal and the second drain terminal.

16. The electronic device of claim 15, wherein the gallium nitride layer is configured to receive a potential that causes a hole layer to form at an interface between the first and second semiconductor layers.

17. A method of fabricating an electronic device, the method comprising:
forming a first transistor over a semiconductor substrate, the first transistor including:
- a first semiconductor layer over a semiconductor substrate, the first semiconductor layer including aluminum gallium nitride, aluminum nitride, indium aluminum nitride, or indium aluminum gallium nitride;
- a second semiconductor layer including gallium nitride on the first semiconductor layer;
- a third semiconductor layer including aluminum and nitrogen over the second semiconductor layer; and
- a conductive first source terminal, a first drain terminal and a first gate terminal on the third semiconductor layer;

forming a second transistor over the semiconductor substrate, the second transistor having a second drain terminal, a second gate terminal and a second source terminal spaced apart along the third semiconductor layer; forming a gallium nitride structure on the third semiconductor layer;
connecting an electrode to the gallium nitride structure; and
electrically connecting the first source terminal to the second drain terminal.

18. An electronic device, comprising:
a semiconductor die in a device package, the semiconductor die having a switching circuit formed thereover, the switching circuit including a heterojunction transistor including:
- a first semiconductor layer including one of aluminum gallium nitride, aluminum nitride, indium aluminum nitride, and indium aluminum gallium nitride;
- a second semiconductor layer including gallium nitride on the first semiconductor layer; and
- a third semiconductor layer including aluminum and nitrogen layer on the second semiconductor layer;
- a source terminal, a drain terminal and a gate terminal on the third semiconductor layer; and
- a gallium nitride layer on the third semiconductor layer,
wherein the gallium nitride layer is configured to receive a potential that causes a hole layer to form at an interface between the first and second semiconductor layers.

19. An integrated circuit, comprising:
a buffer structure over a substrate;
a first III-N layer over the buffer structure including aluminum;
a gallium nitride layer over the first III-N layer;
a second III-N layer over the gallium nitride layer including aluminum;
a first transistor having a first drain contact, a first gate contact and a first source contact spaced apart along the second III-N layer; and
a second transistor having a second drain contact, a second gate contact and a second source contact spaced apart along the second III-N layer; and
an isolation structure extending through the first III-N layer between the first and second transistors;
a gallium nitride structure over the second III-N layer, and a terminal connected to the gallium nitride structure; and
a conductive connection from the first source contact to the second drain contact.

* * * * *